United States Patent
Kobayashi et al.

(10) Patent No.: US 6,388,709 B1
(45) Date of Patent: *May 14, 2002

(54) IMAGE SENSING APPARATUS WITH OPTICAL MODULATION ELEMENTS HAVING TRANSMISSION CHARACTERISTICS CONTROLLABLE BY PIXEL

(75) Inventors: Shuichi Kobayashi; Ken Wada, both of Yokohama (JP)

(73) Assignee: Canon Kabushiki Kaisha, Tokyo (JP)

( * ) Notice: This patent issued on a continued prosecution application filed under 37 CFR 1.53(d), and is subject to the twenty year patent term provisions of 35 U.S.C. 154(a)(2).

Subject to any disclaimer, the term of this patent is extended or adjusted under 35 U.S.C. 154(b) by 0 days.

(21) Appl. No.: 08/633,648

(22) Filed: Apr. 17, 1996

(30) Foreign Application Priority Data

Apr. 21, 1995 (JP) .............................................. 7-096966
Jul. 28, 1995 (JP) .............................................. 7-193217

(51) Int. Cl.[7] .......................... G03B 7/00; H04N 5/225
(52) U.S. Cl. ...................................... 348/362; 348/340
(58) Field of Search ................................ 348/340, 364, 348/362, 270, 271, 273, 266, 379, 280, 281; 257/440; 359/578–9; 349/16, 104, 106, 108–9

(56) References Cited

U.S. PATENT DOCUMENTS

| 4,724,354 A | * | 2/1988 | Dill .............................. 313/371 |
| 4,834,508 A | * | 5/1989 | Fergason ...................... 350/339 |
| 5,528,292 A | * | 6/1996 | Ikeda .......................... 348/222 |
| 5,534,720 A | * | 7/1996 | Song et al. .................. 257/232 |
| 5,587,820 A | * | 12/1996 | May et al. ..................... 359/72 |
| 5,642,214 A | * | 6/1997 | Ishii et al. ...................... 349/96 |
| 5,679,283 A | * | 10/1997 | Tonar et al. ................. 252/583 |
| 6,124,909 A | * | 9/2000 | Miyashita et al. ........... 349/109 |
| 6,128,057 A | * | 10/2000 | Suzuki et al. ................ 349/106 |

FOREIGN PATENT DOCUMENTS

JP 2-76481 * 3/1990 .......... H04N/5/238

* cited by examiner

Primary Examiner—Wendy R. Garber
Assistant Examiner—Jacqueline Wilson
(74) Attorney, Agent, or Firm—Morgan & Finnegan, LLP

(57) ABSTRACT

An image sensing apparatus having a solid-state image sensing device is provided with an optical modulation element, made of electrochromic element for R, G, and B layers, whose spectral transmission characteristics can be independently controlled. By controlling the spectral transmission characteristics of each layer of the optical modulation element, visible light in R, G and B wavelength ranges is controlled so as to incident on a photoelectric converter of the solid-state image sensing device at different times.

32 Claims, 48 Drawing Sheets

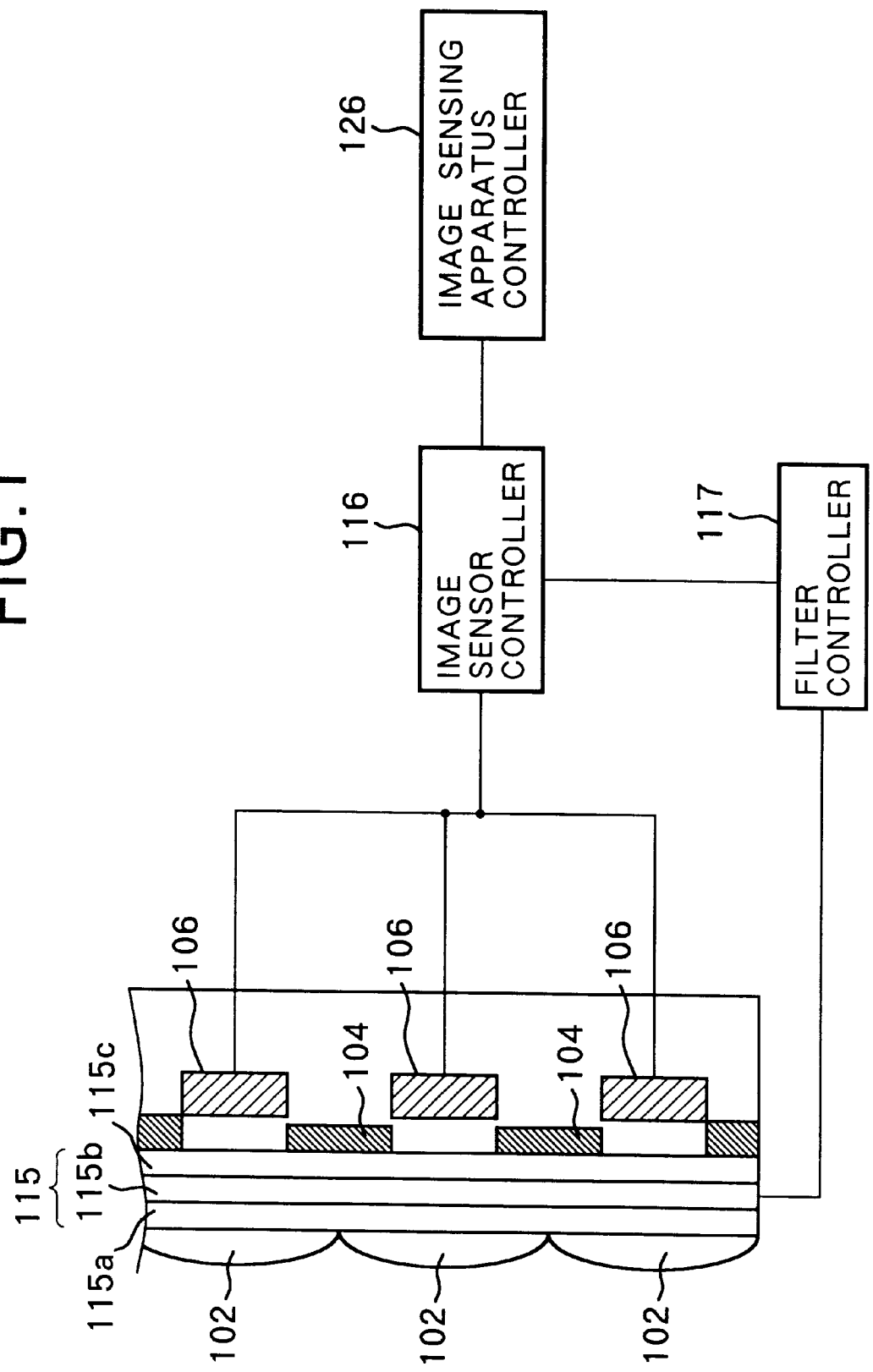

FIG.19A

| R | G | R | G |
|---|---|---|---|
| R | G | R | G |
| B | G | B | G |
| B | G | B | G |

FIG.19B

| G | R | G | R |
|---|---|---|---|
| G | R | G | R |
| G | B | G | B |
| G | B | G | B |

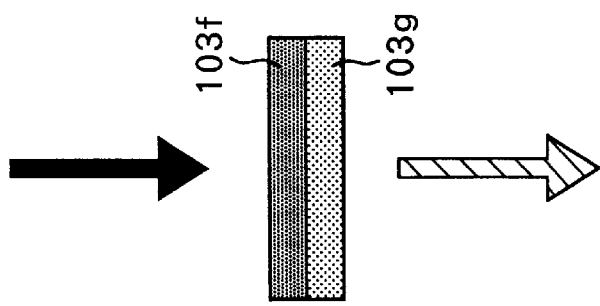
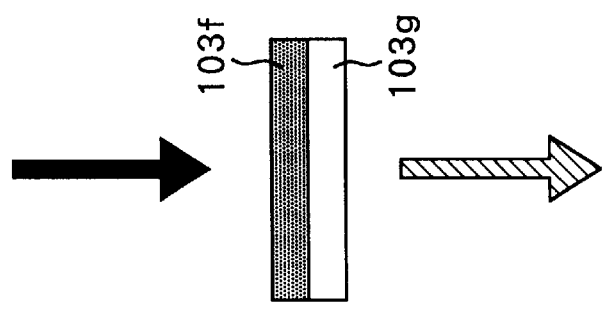
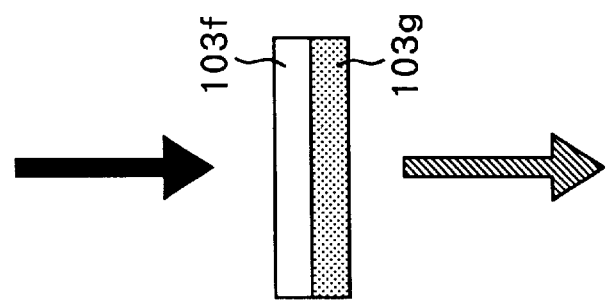
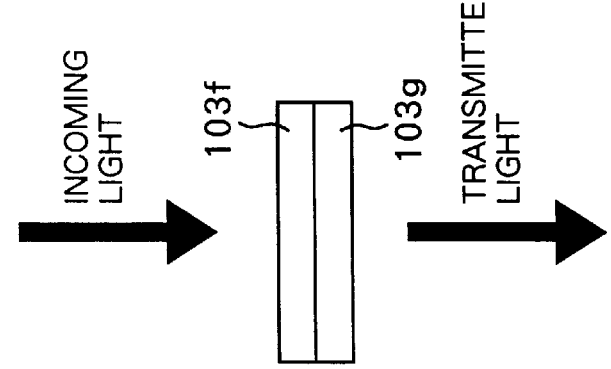

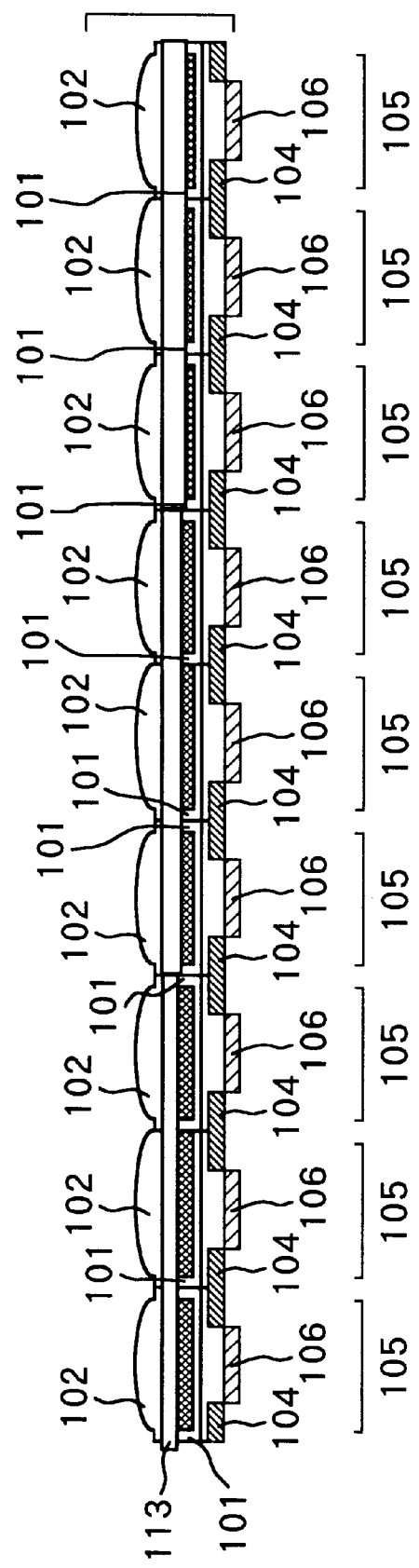

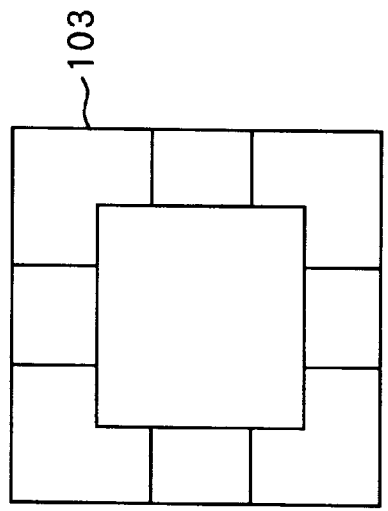
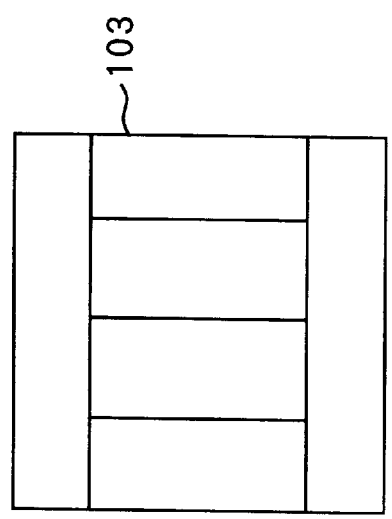
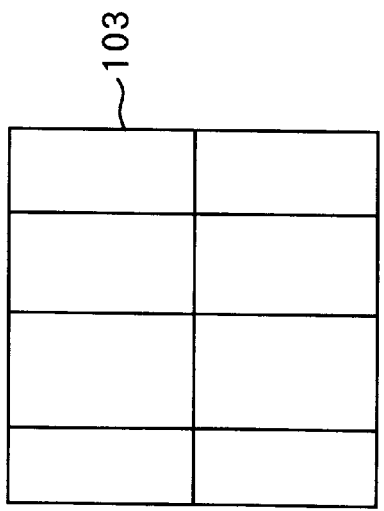
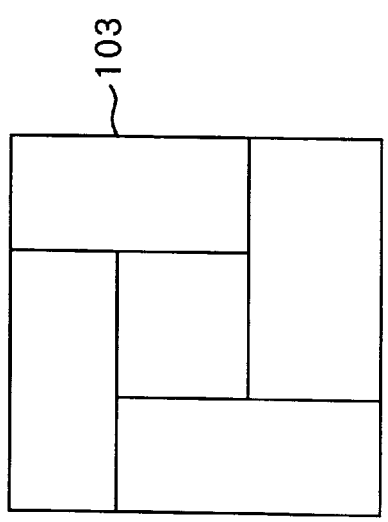

FIG.48A

| G | R | G | R |
|---|---|---|---|
| G | R | G | R |
| B | G | B | G |
| B | G | B | G | p |—————|

FIG.48B

| Mg | G  | Mg | G  |
|----|----|----|----|
| Ye | Cy | Ye | Cy |
| G  | Mg | G  | Mg |
| Ye | Cy | Ye | Cy | p |—————|

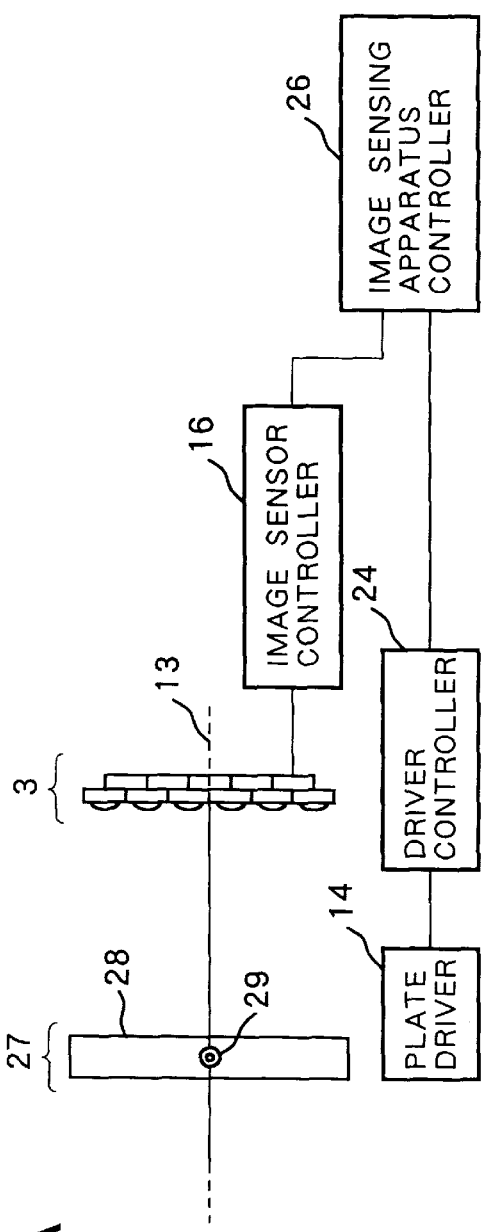
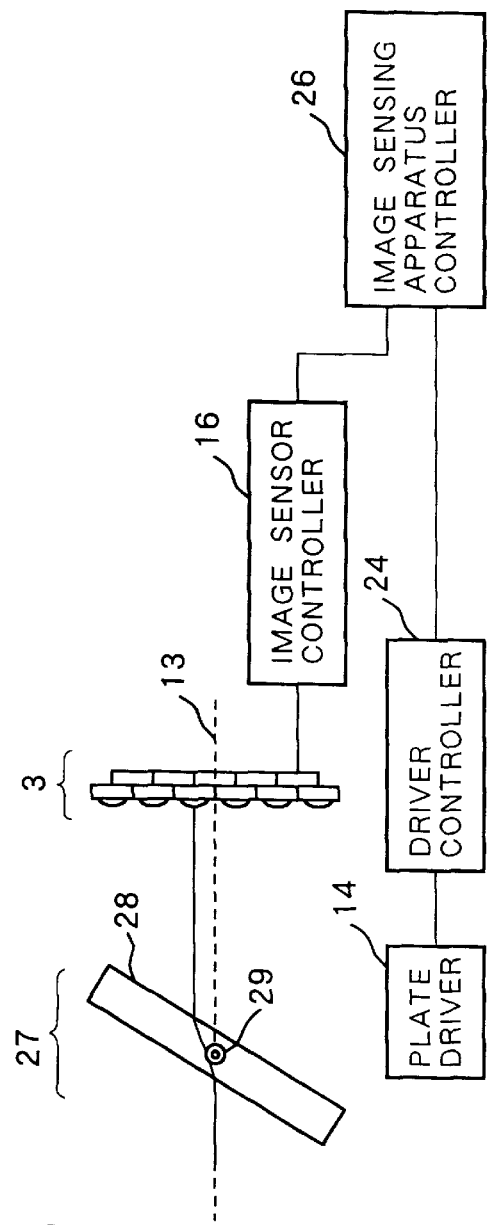
FIG.53A
FIG.53B

IMAGE SENSING APPARATUS WITH OPTICAL MODULATION ELEMENTS HAVING TRANSMISSION CHARACTERISTICS CONTROLLABLE BY PIXEL

BACKGROUND OF THE INVENTION

The present invention relates to an image sensing apparatus and, more particularly, to an image sensing apparatus capable of increasing quality of an image obtained from a solid-state image sensing device by equipping the image sensing apparatus with a solid-state image sensing device and optical modulation means which has controllable wavelength transmission selectivity characteristics and/or controllable light transmission characteristics.

Variety of image sensing system, such as an electronic still camera, a video camera and a TV conference camera, for obtaining image information by sampling an object by using a solid-state image sensing device have been developed and widely used. A conventional image sensing optical system using a solid-state image sensing device will be described below.

FIG. 44 is a cross-sectional view of an image sensing optical unit using a common solid-state image sensing device used in a video camera and the like, and an optical axis. In FIG. 44, reference numeral 1 denotes an image sensing optical system which includes lenses 1*a* and an iris diaphragm 1*b*. Reference numeral 2 denotes a filter for adjusting a quantity of incoming light to a solid-state image sensing device 3 or for cutting high spatial frequency included in the object, and reference numeral 13 denotes the optical axis of the image sensing optical system 1.

Light from the object passes through the lens 1*a* of the image sensing optical system 1 and the filter 2, then forms an image on a photo-sensing surface of the solid-state image sensing device 3.

Next, how the light from the object formed on the solid-state image sensing device 3 as the image is photoelectric-converted in the solid-state image sensing device 3 will be explained. FIG. 45 is a cross-sectional view of a part of the generally used solid-state image sensing device 3 for color image sensing. In FIG. 45, the same reference numerals as in FIG. 44 denote elements having the same functions, and explanation of these elements are omitted. In In FIG. 45, reference numeral 4 denotes a color filter formed on the solid-state image sensing device 3; 5, an on-chip lens; 6, light blocking unit; 7, a photoelectric converter; 8, parts each of which corresponds to each pixel of the solid-state image sensing device 3; and 16, an image sensor controller for controlling the solid-state image sensing device 3.

The on-chip lens 5 is attached to the solid-state image sensing device 3, for increasing aperture rate. The color filter 4 is configured so that areas corresponding to respective pixels have different spectral transmittances which transmit red, blue, and green light, for instance, per pixel, and provided in the solid-state image sensing device 3 in order to selectively extract colors of the light from the object.

The light from the object which forms the image on the solid-state image sensing device 3 consisting of a plurality of pixels passes through the on-chip lens 5 and color filter 4, then reaches each pixel of the photoelectric converter 7. Then, the light is photoelectric-converted by the photoelectric converter 7, and stored in a form of electric charge in each pixel. The electric charge stored in each pixel is periodically sent to a charge transfer unit (not shown) under the control of the image sensor controller 16. Thereafter, the image of the object is generated by image generating means (not shown) on the basis of the transferred charge.

A solid-state image sensing device for sensing a color image is shown in FIG. 45. Although it is not shown, there are a solid-state image sensing device for a black-and-white or monochromatic image which is not provided with the color filter 4, and a solid-state image sensing device to which the on-chip lens 5 for increasing aperture rate is not attached.

The solid-state image sensing device 3 as described above is manufactured in such a manner that parts, such as a transfer unit (not shown) and the photoelectric converter 7, are sequentially formed during a semiconductor manufacturing process Further, the color filter 4 used for color image sensing is formed by a photolithography method or a print method, and the on-chip lens 5 provided for increasing aperture rate is manufactured in a semiconductor manufacturing process, such as photolithography or a dry etching.

As a solid-state image sensing device used in such an image sensing system, there are a line sensor, an area sensor, and the like. These solid-state image sensing devices are used in various fields in accordance with their purposes, and the quality of the solid-state image sensing devices has improved year after year.

Next, spectral transmission characteristics of each area, corresponding to each pixel of the solid-state image sensing device 3, of the color filter 4 which is provided in the solid-state image sensing device 3 will be explained.

FIGS. 46A to 46C and FIGS. 47A to 47D are graphs showing spectral transmission characteristics of the color filter 4 formed on the solid-state image sensing device 3. In these graphs, the horizontal axes show a wavelength (nm) and the vertical axes show spectral transmittance of the color filter 4.

FIGS. 46A to 46C are the graphs showing examples of spectral transmission characteristics of a color filter of primary colors of red, green and blue. Specifically, FIG. 46A is a graph showing the spectral transmission characteristics of a red part of the color filter, FIG. 46B is a graph showing the spectral transmission characteristics of a green part of the color filter, and FIG. 46C is a graph showing the spectral transmission characteristics of a blue part of the color filter.

Referring to the red part of the color filter 4 whose spectral transmission characteristics are shown in FIG. 46A as an example, the spectral transmission characteristics of the color filter 4 will be explained. As shown in FIG. 46A, the red part of the color filter 4 has a high spectral transmittance for light in a long wavelength range areas of the visible light, whereas has a low spectral transmittance for light in other wavelength ranges, thus mainly transmits the light in the long wavelength range. Similarly, each of the green and blue parts of the color filter 4 show high and low spectral transmittances with respect to wavelength ranges, and light which passes through the green and blue color parts is in different wavelength ranges.

Further, FIGS. 47A to 47D are graphs showing examples of spectral transmission characteristics of a color filter of complementary colors of cyan, magenta, yellow and green. Similarly to the spectral transmission characteristics of each color part of the color filter of primary colors as shown in FIGS. 46A to 46C, different color parts of the color filter of complementary colors have different spectral transmission characteristics from each other.

Further, FIGS. 48A and 48B show examples of arrangement of color parts of a color filter of a common solid-state image sensing device used in a video camera and the like. As shown in FIGS. 48A and 48B, the color parts are arranged in a fixed pattern on the solid-state image sensing device.

Further, characters R, G and B in FIG. 4BA respectively show the red, green and blue parts of the color filter of primary colors each having spectral transmission characteristics shown in FIGS. 46A to 46C, and characters Cy, Mg, Ye and G in FIG. 48B respectively show the cyan, magenta, yellow and green parts of the color filter of complementary colors each having spectral transmission characteristics shown in FIGS. 47A to 47D. Each square in FIGS. 48A and 48B corresponds to a pixel of a solid-state image sensing device.

When the aforesaid color filter is used in a solid-state image sensing device, since color parts are placed in a fixed pattern on pixels of the solid state image sensing device, each color of the light from the object is sampled at interval between color parts of the same color. If the distance between neighboring pixels is denoted by p and a single color is concerned, regarding the red parts of the color filter of the primary color shown in FIG. 48A, the red component of light from the object is spatially sampled by 2*p in the horizontal direction of a frame.

Upon obtaining an image by performing spatial sampling by a solid-state image sensing device whose pixels are regularly arranged, the same problem as in the case of discretely sampling a time-continuous signal arises. More specifically, since the distance between neighboring pixels (pitch) is denoted by p, a spatial sampling frequency for an object is given as 1/p. Thus, if the object includes any pattern which causes a signal component having spatial frequency of 1/(2*p) to be generated, then a false signal (noise) is generated, which causes deterioration of image quality.

For example, regarding the red color parts of the color filter shown in FIG. 48A, they are arranged at every other pixels, therefore, a spatial sampling frequency of red light component of an object in the horizontal direction becomes 1/2p. Accordingly, if an object includes a pattern which causes a signal component having spatial frequency of 1/(4*p), a false signal (noise) is generated, which causes deterioration of image quality.

The same or similar problem as described in the previous paragraph arises for the other color parts of the color filter of primary colors or for each color of the color filter of complementary colors, and a false signal (noise) may be generated in relation with a pitch of spatial sampling. Thus, in a conventional image sensing system, such as a video camera, using a solid-state image sensing device, a filter as shown in FIG. 44 is often provided for the purpose of filtering the high spatial frequency components in an object so as to prevent the aforesaid false signal from being generated.

As described above, in a case where an image sensing operation is performed by a solid-state image sensing device attached with a color filter which is composed of color areas each of which is set on each pixel, the solid-state image sensing device has advantages of down-sizing aid simplification of structure of an image sensing apparatus because it is a single unit. However, it also has a disadvantage in that a false signal is often generated and a high quality image is hard to obtain.

In order to solve the aforesaid problem, a method for increasing resolution by using a plurality of solid-state image sensing devices, a method for increasing resolution by changing the relative spatial positions between the incoming light and pixels of a solid-state image sensing device, and so on, are proposed.

FIG. 49 is a schematic view of an image sensing optical system for increasing resolution by using a plurality of solid-state image sensing devices. In FIG. 49, reference numerals 3a, 3b, and 3c are solid-state image sensing devices, and reference numeral 9 denotes a color separation prism.

Light passing through this image sensing optical system is decomposed into different wavelength components of red, green and blue by the color separation prism, and decomposed light of each color component incidents on different solid-state image sensing devices 3a to 3c in accordance with its wavelength. More specifically, the light from an object is decomposed into light in red, green and blue wavelength ranges by the color separation prism, and the decomposed light of different color components incidents on the corresponding solid-state image sensing devices 3a to 3c. Therefore, color filters are not provided to the solid-state image sensing devices in this case.

According to the above image sensing optical system, a solid-state image sensing device 3a, 3b or 3c is provided for the color components and a sampling pitch of a color becomes the same as that between neighboring pixels of the solid-state image sensing device 3. Thus, an image can be obtained in higher resolution in the aforesaid method than an image obtained by using a single solid-state image sensing device 3 shown in FIG. 44. Further, in an image sensing means having the color separation prism 9, solid-state image sensing devices are often arranged so that pixels of the solid state image sensing devices do not align with respect to the direction of incoming light as shown in FIG. 50. This is aimed at realizing further increase in resolution and in image quality by shortening the spatial sampling pitch. An image sensing optical system using the color separation prism as above is often applied to a camera system for broadcasting.

However, according to the aforesaid method of using a plurality of solid-state image sensing devices, although a high quality image can be obtained, there is a problem in that, since a very precise prism is necessary for color separation, the configuration of an image sensing apparatus becomes complicated, and the apparatus becomes large and heavy comparing to an image sensing apparatus adopting a method using a single solid-state image sensing device.

Next, a method for shortening the spatial sampling pitch of a color by using a single solid-state image sensing device will be described with reference to FIG. 51. This method is called "one chip field sequential sensing method", and FIG. 51 illustrates the principle of the sequential sensing method. In this case, a solid-state image sensing device 15 is not provided with a color filter.

In FIG. 51, reference numeral 18 denotes a rotation filter for selecting a wavelength range of incoming light to be transmitted toward the solid-state image sensing device 15; 19, a filter driver for driving the rotation filter 18; and 20, a driver controller for controlling the filter driver 19.

The filter driver 19 consists of a driving force transmission means 19a for transmitting driving force to the rotation filter 18 and a driving force generator 19b. Further, the rotation filter 18 for selecting a wavelength range of incoming light toward the solid-state image sensing device 15 consists of a plurality of parts, 18a, 18b and 18c, each of which has different spectral transmittance. The part 18a mainly transmits red light component, the part 18b mainly transmits green light component, and the part 18c mainly transmits blue light component.

Further, the rotation filter 18 is coupled to the filter driver 19 via a pulley and rotates about the rotation axis placed at the center. The filter controller 19 is electrically connected to a driver controller 20. Further, both the driver controller 20 and an image sensor controller 16 are electrically connected to an image sensing apparatus controller 26 so that they are coupled to operate.

Next, the operation of the sequential sensing method will be described. First, the rotation filter 18 is set so that incoming light toward the solid-state image sensing device 15 passes through the part 18a which selectively transmits light in the red wavelength range, then an image is sensed by the solid-state image sensing device 15 under this condition. After sensing the image, the filter driver 19 turns the rotation filter 18 so that the incoming light toward the solid-state image sensing device 15 passes through the part 18b which selectively transmits light in the green wavelength range, then an image is sensed. Similarly, an image is sensed when the part 18c which transmits a blue light component is set. Thereafter, the three images obtained as above are combined by an image combining means (now shown) to obtain a complete image. This series of operation is performed by the image sensing apparatus controller 26, the image sensor controller 16 of the solid-state image sensing device 15, and the driver controller 20 of the rotation filter 18 which are coupled to each other.

In the sequential sensing method as described above, since image sampling is performed in a pixel pitch of the solid-state image sensing device for each color, the spatial sampling interval of color become shorter than the interval when a single solid-state image sensing device attached with a conventional color filter is used. Thus, it is possible to lessen chance of generating false signals comparing to a case where a single solid-state image sensing device attached with a conventional color filter is used. As a result, it is possible to increase resolution and quality of an image.

According to the single device sequential method as described above, only one solid-state image sensing device is used, however, a function for turning a color filter becomes necessary. Therefore, there is a problem in that the configuration of an image sensing apparatus also becomes complicated, and the apparatus becomes large and heavy.

FIGS. 52A, 52B, 53A and 53B are explanatory views for explaining methods of increasing resolution by changing relative positions between incoming light and pixels of the solid-state image sensing device 3.

Particularly, FIGS. 52A and 52B show a configuration of an apparatus which increases resolution of an image by shortening a spatial sampling interval of sensing light from an object by shifting the solid-state image sensing device in a plane which is perpendicular to its optical axis. In. FIGS. 52A and 52B, reference numeral 3 denotes a solid-state image sensing device including a color filter; 21, an image sensor driver for shifting the solid-state image sensing device 3 in the plane perpendicular to the optical axis; and 22, a driver controller for the image sensor driver 21.

The image sensor driver 21 is an actuator consisting of a layer-type piezoelectric element, for example, and electrically connected to the driver controller 22. Further, the image sensor controller 16 of the solid-state image sensing device 3 and the driver controller 22 of the image sensor driver 21 are connected to the image sensing apparatus controller 26, and coupled to operate.

Next, an operation of the aforesaid apparatus will be described. As shown in FIG. 52A, the solid-state image sensing device 3 is set at a predetermined position, and an image is sensed by the solid-state image sensing device 3 under this condition. After sensing the image, the image sensor driver shifts the solid-state image sensing device 3 in a plane which is perpendicular to its optical axis. At this time, the shifted distance is a pixel pitch or its fraction. Then another image is sensed at the shifted position. Note the shift of the solid-state image sensing device 3 is shown in reference to the axis 13 in FIGS. 52A and 52B.

The aforesaid operation is repeated to sense images by the solid-state image sensing device 3 at a plurality of positions, then the obtained plurality of images are combined by an image combining means (not shown), thereby obtaining a complete image. As described above, it is possible to increase resolution by increasing spatial sampling points from which the light from an object is sensed, and a high quality image can be eventually obtained.

Similarly to FIGS. 52A and 52B, FIGS. 53A and 53B are explanatory views for explaining a method of increasing resolution by changing relative positions between incoming light and pixels of the solid-state image sensing device 3. The difference between the method described in FIGS. 53A and 53B and the one described in FIGS. 52A to 52B is that, in the method illustrated in FIGS. 52A and 52B, the solid-state image sensing device 3 is shifted with respect to the incoming light, whereas in the method shown in FIGS. 53A and 53B, the incoming light is shifted with respect to the solid-state image sensing device 3.

In FIGS. 53A and 53B, reference numeral 27 denotes a shifting means for shifting the incoming light; 28, a plane parallel plate; 29, a rotation axis of the plane parallel plate 28; and 14, a plate driver for tilting the plane parallel plate 28 about the rotation axis 29. The plane parallel plate 28 and the plate driver 14 are connected to each other via a pulley, gear, and the like. Further, the plate driver 14 is electrically connected to the driver controller 24. The driver controller 24 and the image sensor controller 16 are electrically connected to the image sensing apparatus controller 26, and coupled to operate.

Next, the method of shifting the incoming light with respect to the solid-state image sensing device 3 will be explained. The state shown in FIG. 53A is that the surface of the plane parallel plate 28 is perpendicular to the optical axis 13. In this state, light which is parallel to the optical axis transmits without being shifted by the plane parallel plate 28.

Then, when the plane parallel plate 28 is tilted by some angle about the rotation axis 29 so as to be in a state shown in FIG. 53B, the light traveling in the direction parallel to the optical axis and passing through the plane parallel plate 28 is shifted as shown in FIG. 53B. The shifted amount is given as a function of the rotation angle, and by changing the rotation angle, corresponding positions between the incoming light and the solid-state image sensing device 3 can be changed.

Next, an operation of sensing images will be described. The incoming light from an object toward the solid-state image sensing device 3 transmits the plane parallel plate 28 which is in a state perpendicular to the optical axis of the solid-state image sensing device 3 or in a state rotated by some angle with respect to the optical axis, then incidents on the solid-state image sensing device 3, and sensed as an image. Successively, the plane parallel plate 28 is turned so that the light from the object incidents at the different positions of the solid-state image sensing device 3, then the light is sensed as an image under that condition. At this time, the plane parallel plate is controlled so that a shifted amount of the direction of the light is a pixel pitch or a fraction of the pixel pitch.

As described above, positions of the incoming light incidenting on the solid-state image sensing device 3 are changed by tilting the plane parallel plate, images are sensed, then the obtained plurality of images in the aforesaid manner is combined by the image combining means (not shown). According to the aforesaid method, the spatial sampling pitch for sensing an image of the object is shortened, thereby increasing resolution of the image.

However, according to the method of changing relative spatial positions of incoming light toward the solid-state image sensing device and the pixels of the solid-state image sensing device, a plane parallel plate and a driver for driving the plane parallel plate or a driver for moving the solid-state image sensing device become necessary, thus there is a problem in that the configuration of an image sensing apparatus adopting this method becomes complicated, and the apparatus become large and heavy.

Next, a general characteristics of a solid-state image sensing device will be described.

FIG. 54 is a graph showing output voltage from pixels of a solid-state image sensing device with respect to illuminance of incoming light. As shown in FIG. 54, the solid-state image sensing device has a characteristic where, when illuminance of incoming light is lower than a certain value, the output voltage increases as the illuminance increases, however, when illuminance exceeds a certain value, the output voltage is saturated. Thus, there is a problem in that the sensitivity range of the solid-state image sensing device for photoelectric conversion is narrow, namely the latitude is narrow.

Further, the charge obtained by photoelectric conversion is temporarily stored in each pixel, and when a quantity of incoming light exceeds a certain value, the charge to be stored in each pixel exceeds the pixel's capacitance. Consequently, a phenomena where the overflowed charge which could not be stored in the pixel flows to neighboring pixels occurs, which greatly deteriorates image quality.

Because of the aforesaid problem of the solid-state image sensing device, when it is used in a camera, an iris diaphragm, a neutral density (ND) filter, or the like, for controlling a quantity of incoming light to the solid-state image sensing device is necessarily provided, or each pixel of the solid-state image sensing device is equipped with an overflow drain, or the like, for preventing the overflowed charge from being diffused.

However, in a camera using the afore-described solid-state image sensing device, an iris diaphragm or an ND filter which can merely control a total quantity of light which incidents on the whole solid-state image sensing device is provided as a solution for the problem of narrow latitude of the solid-state image sensing device and the problem in that the overflowed charge from each pixel flows to neighboring pixels. Therefore, when a scene including objects whose luminances are very different from each other is to be sensed, quality of the obtained image is often not satisfactory. Following is the detailed explanation of the problem.

FIG. 55 is an example of a scene including parts whose luminance's are very different. Further, FIGS. 56A and 56B are examples of phenomena when the scene shown in FIG. 55 is sensed by using a conventional solid-state image sensing device.

In FIG. 55, reference numeral 10 denotes the sun having high luminance; 11, a tree; and 12, a man standing in the shade of the tree 11.

In this case, since the quantity of light from the sun 10 is very high, the quantity of incoming light is limited by an iris diaphragm. As a result, enough quantity of light from the man 12 cannot be obtained as shown in FIG. 56A. On the contrary, if the quantity of light is controlled so that the man is properly sensed, then the area having high illuminance, i.e., the sun in this case, is saturated, which causes deterioration of image quality, such as blooming and smear.

Besides the aforesaid problems, there is a problem in that sensitivities of pixels differ from each other due to manufacturing error of a silicon wafer upon manufacturing a solid-state image sensing device, difference in thickness and material of silicon oxide film and the like, and stains and scratches on the surface of cover glass of the solid-state image sensing device.

SUMMARY OF THE INVENTION

The present invention has been made in consideration of above situation, and has as its object to provide an image sensing apparatus capable of obtaining a high quality image by using optical modulation means which has controllable wavelength transmission selectivity characteristics and/or controllable light transmission characteristics in a simple configuration without causing increase in size and weight.

Another object of the present invention is to provide an image sensing apparatus using an optical modulation element which has controllable wavelength transmission selectivity characteristics so as to shorten the sampling interval and widen the latitude of the solid-state image sensing device in order to overcome a problem caused by the false signal due to the sampling interval, the problem due to a narrow dynamic range of the solid-state image sensing device, and the problem caused by unevenness in sensitivity features of pixels due to manufacturing processes.

According to the present invention, the foregoing object is attained by providing an image sensing apparatus comprising: a solid-state image sensing element consisting of a plurality of pixels; optical modulation means, consists of at least a single layer of an optical modulation material, whose spectral transmission characteristics can be controlled in order to control incoming light toward the solid-state image sensing element; and control means for controlling the optical modulation means.

Further, another object of the present invention is to provide an image sensing apparatus using an optical modulation element which has controllable light transmission characteristics so as to widen the latitude of the solid-state image sensing device by each pixel or by each predetermined part in order to overcome a problem caused by a narrow dynamic range of the solid-state image sensing device, and the problem caused by unevenness in sensitivity features of pixels due to manufacturing processes.

According to the present invention, the foregoing object is attained by providing an image sensing apparatus comprising: a solid-state image sensing element consisting of a plurality of pixels; optical modulation means, consisting of at least a single layer of an optical modulation material, whose light transmittance can be controlled in order to control incoming light toward the solid-state image sensing element; and control means for controlling the optical modulation means.

Other features and advantages of the present invention will be apparent from the following description taken in conjunction with the accompanying drawings, in which like reference characters designate the same or similar parts throughout the figures thereof.

BRIEF DESCRIPTION OF THE DRAWINGS

The accompanying drawings, which are incorporated in and constitute a part of the specification, illustrate embodiments of the invention and, together with the description, serve to explain the principles of the invention.

FIG. 1 is a schematic view showing a configuration of a solid-state image sensing device and its controller units according to a first embodiment;

FIGS. 19A and 19B show examples of arrangements of areas each of which is controlled to have different spectral transmittance in the filter shown in FIG. 16;

FIGS. 27A to 27D are explanatory views showing an operation of optical modulation element layers used in the solid-state image sensing device shown in FIG. 26;

FIG. 28 is a cross-sectional view of a main configuration of a part of the solid-state image sensing device according to a first modification of the third embodiment;

FIGS. 32A to 32D show examples of patterns of area division according to the first modification of the third embodiment;

FIGS. 48A and 48B show examples of arrangements of color parts of the conventional filters;

FIGS. 53A and 53B are schematic view showing a configuration of an image sensing apparatus capable of increasing resolution of an image by shifting light path by using a plane parallel plate;

DETAILED DESCRIPTION OF THE PREFERRED EMBODIMENTS

Figure 2A:
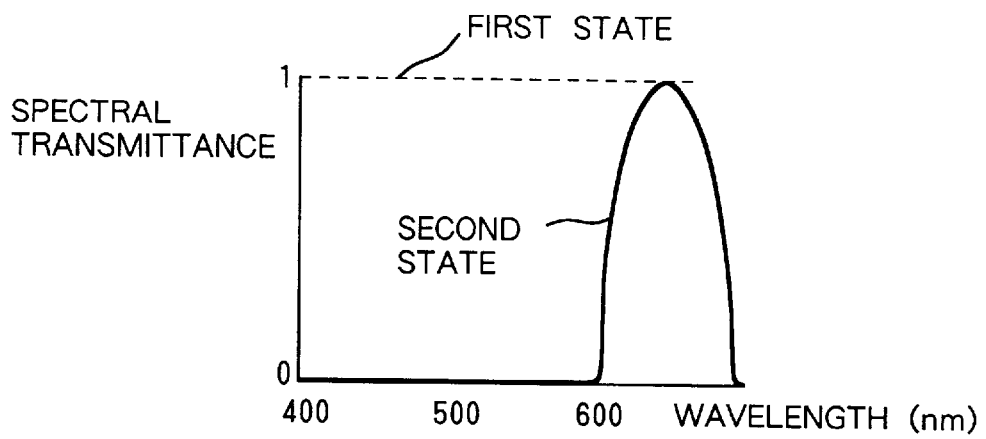
FIGS. 2A to 2C are graphs showing spectral transmission characteristics of optical modulation element layers of a filter shown in FIG. 1.

Preferred embodiments of the present invention will be described in detail in accordance with the accompanying drawings.

<First Embodiment>

A configuration of an image sensing apparatus according to a first embodiment of the present invention is described with reference to FIG. 1. FIG. 1 is a schematic view showing a configuration of a solid-state image sensing device and its controller units.

In FIG. 1, reference numeral 102 denotes an on-chip lens; 104, a light blocking unit; 106, a photoelectric converter; 115, a filter, provided on a solid-state image sensing device, such as CCD, consisting of at least one layer of an optical modulation element whose spectral transmission characteristics can be controlled; 116, an image sensor controller of the solid-state image sensing device; 117, a filter controller for controlling the filter 115; and 126, an image sensing apparatus controller. The filter 115 made of the optical modulation element and the filter controller 117, the filter controller 117 and the image sensor controller 116, and the image sensor controller 116 and the image sensing apparatus controller 126 are electrically connected.

As shown in FIG. 1, the filter 115 having controllable spectral transmission characteristics is composed of optical modulation element layers 115a, 115b and 115c, and each layer has different controllable spectral transmission characteristics. In the first embodiment, the spectral transmission characteristics of the entire filter 115 is controlled.

Figure 2B:
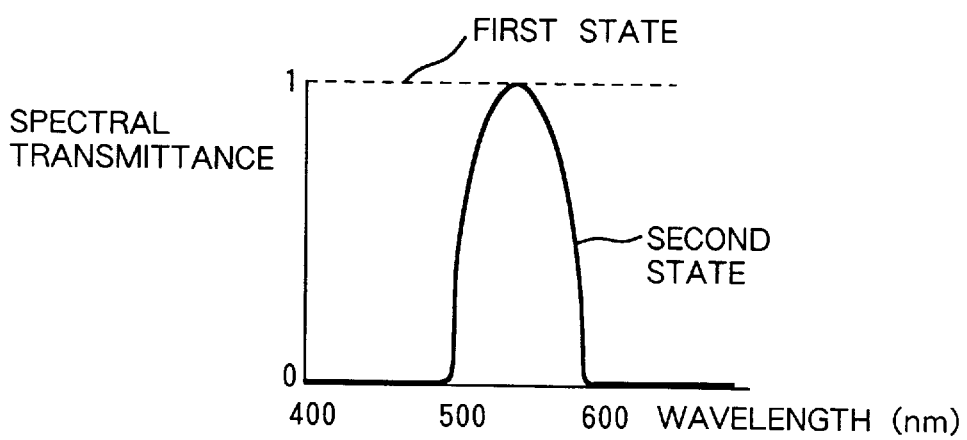
Figure 2C:
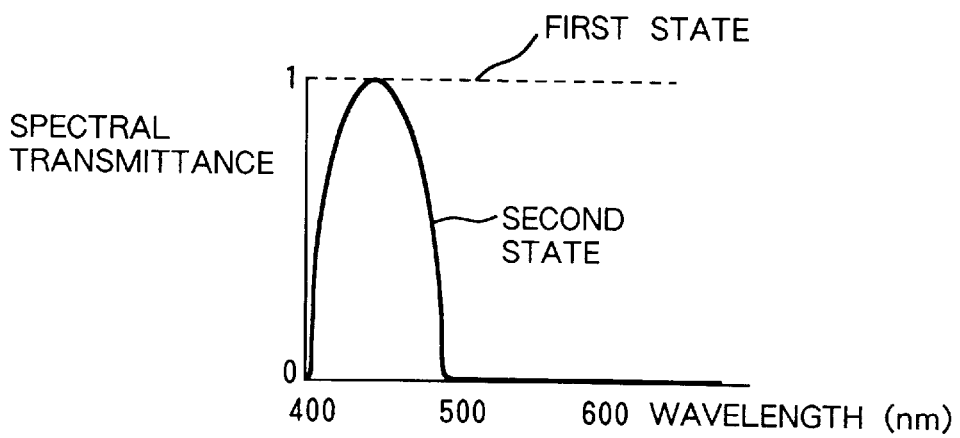
Figure 3A:
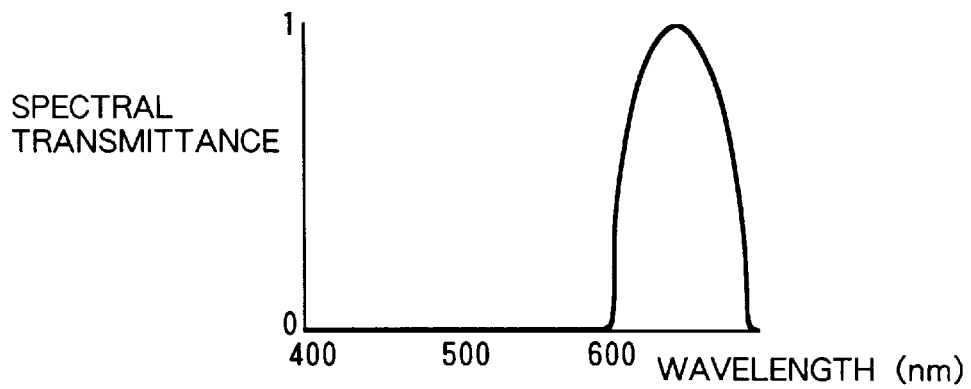
FIGS. 3A to 3C are graphs showing total spectral transmission characteristics of the filter shown in FIG. 1.
Figure 3B:
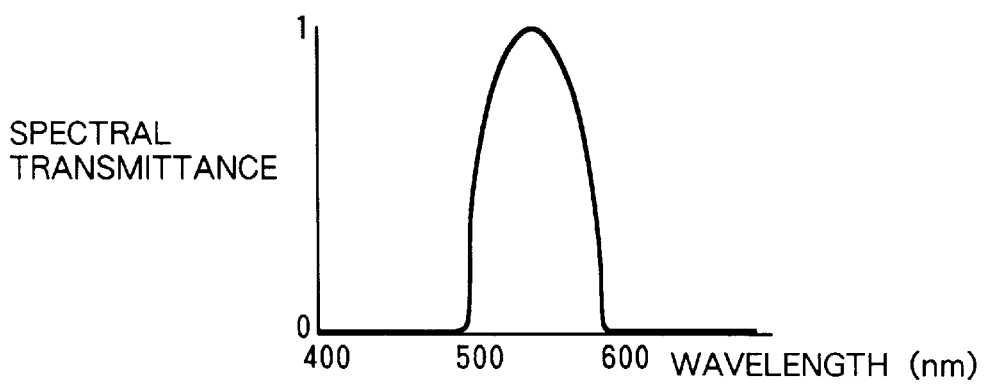
Figure 3C:
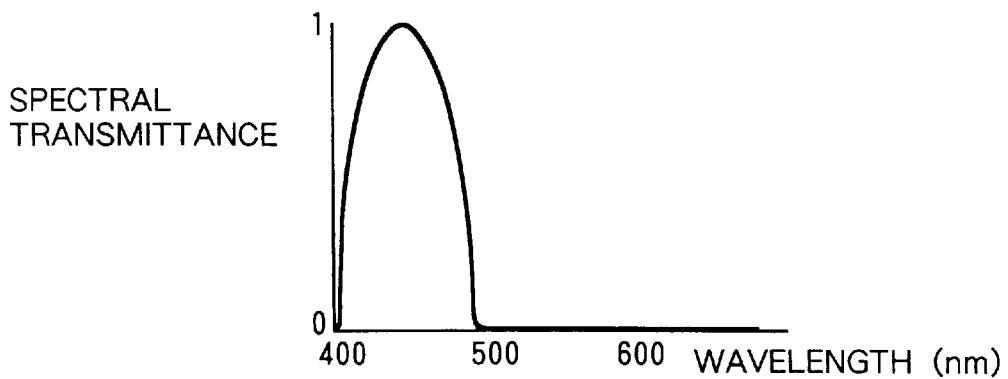

Next, a principle of controlling spectral transmission characteristics of the filter 115 is explained. FIGS. 2A to 2C are graphs showing spectral transmission characteristics of optical modulation element layers of the filter 115, and FIGS. 3A to 3C are graphs showing total spectral transmission characteristics of the filter consisting of the optical modulation element layers having the spectral transmission characteristics shown in FIGS. 2A to 2C.

The graphs shown in FIGS. 2A to 2C respectively show the spectral transmission characteristics of the optical modulation element layers 115a, 115b and 115c. The horizontal axes of the graphs are wavelength, and the vertical axes are spectral transmittance.

Reference to FIG. 2A, the graph shows the spectral transmission characteristics of the optical modulation element layer 115a in the first layer (referred as "first layer 115a", hereinafter), and a dashed line indicates a state in which the first layer 115a almost equally transmits visible light in all the wavelength range (first state), and a solid line shows another state in which the first layer 115a selectively transmits light of a specific wavelength range (second state). Here, visible light of a red (i.e., long) wavelength range is transmitted. The first layer 115a can be controlled to be in the first or second state in response to a signal from the filter controller 117.

Similarly to the first layer, the optical modulation element layers 115a and 115b in the second and third layer (respectively referred as "second, third layer", hereinafter) almost equally transmits visual light in all the wavelength range as indicated by dashed lines in FIGS. 2B and 2C in the first state, and selectively transmits light in green and blue wave length ranges, respectively, as indicated by solid lines in the second state. The states of the second and third layers are also controlled by the filter controller 117.

Next, a method of controlling incoming light toward the solid-state image sensing device by controlling the spectral transmission characteristics of the filter 115 consisting of the first to third layers 115a to 115c each having spectral transmission characteristics as shown in FIGS. 2A to 2C.

The spectral transmittance of the filter 115 consisting of the first to third layers 115a to 115c with respect to a wavelength $\lambda$ is given by the product of spectral transmittances of the first to third layers 115a to 115c. Denoting $\mu_f$ as the total spectral transmittance of the filter with respect to a wavelength $\lambda$ and $\mu_i$ (i=1, 2, 3) as the transmittance of the i-th layer at the wavelength $\lambda$, then, since the filter consists of three layers, the total transmittance $\mu_f$ of the filter is given by the following equation.

$$\mu_f(\lambda)=\mu_1(\lambda)\mu_2(\lambda)\mu_3(\lambda)$$

For example, assuming that each of the layers 115a, 115b and 115c of the filter 115 are controllable as shown in FIGS. 2A to 2C, when the first layer 115a is in the second state in which it selectively transmits visible light in the long wavelength range and the second and third layers 115b and 115c are in the first state in which they equally transmit the visible light in all the wavelength range, total transmission characteristics of the filter 115 become as shown in FIG. 3A. The horizontal axes of the graphs in FIGS. 3A to 3C are wavelength, and the vertical axes are spectral transmittance.

Similarly, when the second layer 115b of the filter 115 is controlled to be in the second state in which green light is mainly transmitted out of visible light and the other two layers are set to be in the first state shown by the dashed lines, the total transmission characteristics of the filter 115 become as shown in FIG. 3B.

Further, if the third layer 115c of the filter 115 is controlled to be in the second state and the other two layers are controlled to be in the first state, then the total transmission characteristics of the filter 115 become as shown in FIG. 3C. As described above, by changing combination of the first and second states of the layers, it is possible to change the wavelength transmission selectivity of the entire filter.

Next, image sensing operation using the solid-state image sensing device equipped with the filter 115 which is made of aforesaid optical modulation elements having controllable wavelength transmission characteristics will be described. Similarly to a conventional solid-state image sensing device which is used in an image sensing optical system, the solid-state image sensing device of the present invention is used in combination with a focusing lens system and placed at the imaging plane of the focusing lens system.

As shown in FIG. 1, the filter 115 is set somewhere on the light path before incoming light reaches the photoelectric converter 106 of the solid-state image sensing device, and selectively transmit the incoming light of a selected wavelength range as described above.

First, the filter 115 consisting of the layers 115a, 115b and 115c is controlled so that the total spectral transmission characteristics of the filter 115 becomes as shown in FIG. 3A, then the solid-state image sensing device senses an image of an object. Next, the total spectral transmission characteristics of the filter 115 is controlled to become as shown in FIG. 3B, then an image of the object represented by light in the wavelength range shown in FIG. 3B is sensed under the set state.

Thereafter, the total spectral transmission characteristics of the filter 115 is controlled to become as shown in FIG. 3C, and an image of the object represented by light in the wavelength range shown in FIG. 3C is sensed. Finally, the obtained three images are combined by an image combining means (not shown) thereby obtaining a complete image.

By sensing an image as described above, an image of a color component in a selected wavelength range can be sensed by each pixel, therefore, a high resolution image can be obtained. Further, since a prism used for color separation or other mechanical functions become unnecessary, an image sensing apparatus can be down-sized.

The filter 115 in the first embodiment consists of three optical modulation element layers having spectral transmission characteristics of selectively transmitting light of primary colors, i.e., red, green and blue, however, the present invention is not limited to this. The filter 115 may consist of four optical modulation element layers having spectral transmission characteristics of selectively transmitting light of complementary colors, i.e., cyan, magenta, yellow and green, for example. Further, the filter 115 in the first embodiment has a three-layered configuration, however, it can consist of at least a single layer of optical modulation element which can be sequentially controlled to transmits light of a plurality of selected wavelength ranges to obtain the same result.

As the optical modulation element as described above, there is an electrochromic element, for example. The spectral transmittance of the electrochromic element can be electrically controlled, further, it has a feature of memory effect, that is, once the electrochromic element is supplied with electric current and controlled to have a certain spectral transmittance, it maintains the same spectral transmittance after the electrical current supply is terminated. Accordingly, it has an advantage of saving electricity. Further, if the electrochromic element is solid, then the filter can be formed in a semiconductor manufacturing process along with the photoelectric converter and on-chip lens on the solid-state image sensing device. Therefore, the electrochromic element is especially preferable as the optical modulation element in the first embodiment. However, the same operation can be achieved by constructing the filter with any optical modulation element having controllable spectral transmission characteristics.

Figure 4:
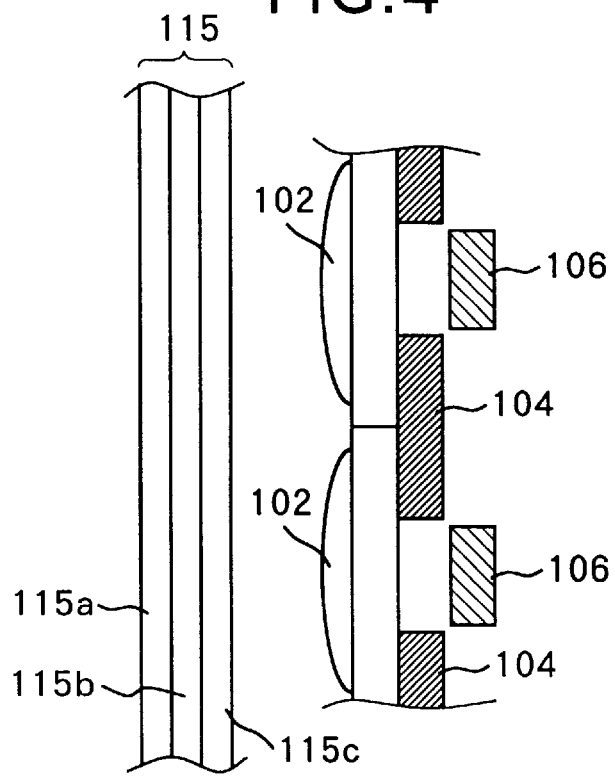
FIG. 4 is a cross-sectional view showing an example of a configuration of the filter according to the first embodiment.
Figure 5:
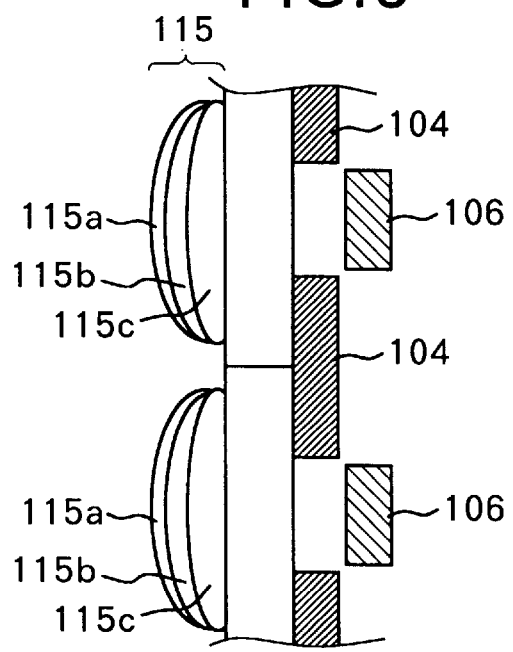
FIG. 5 is a cross-sectional view showing an example of a configuration of the filter according to the first embodiment.

Furthermore, the filter 115 is provided between the on-chip lens 102 and the photoelectric converter 106 in the first embodiment, however, the present invention is not limited to this, and the same advantage is attained by forming the filter 115 apart from the surface of the on-chip lens 102 as shown in FIG. 4, or making the on-chip lens 102 itself with the optical modulation elements as shown in FIG. 5.

<Modification of the First Embodiment>

Figure 6:
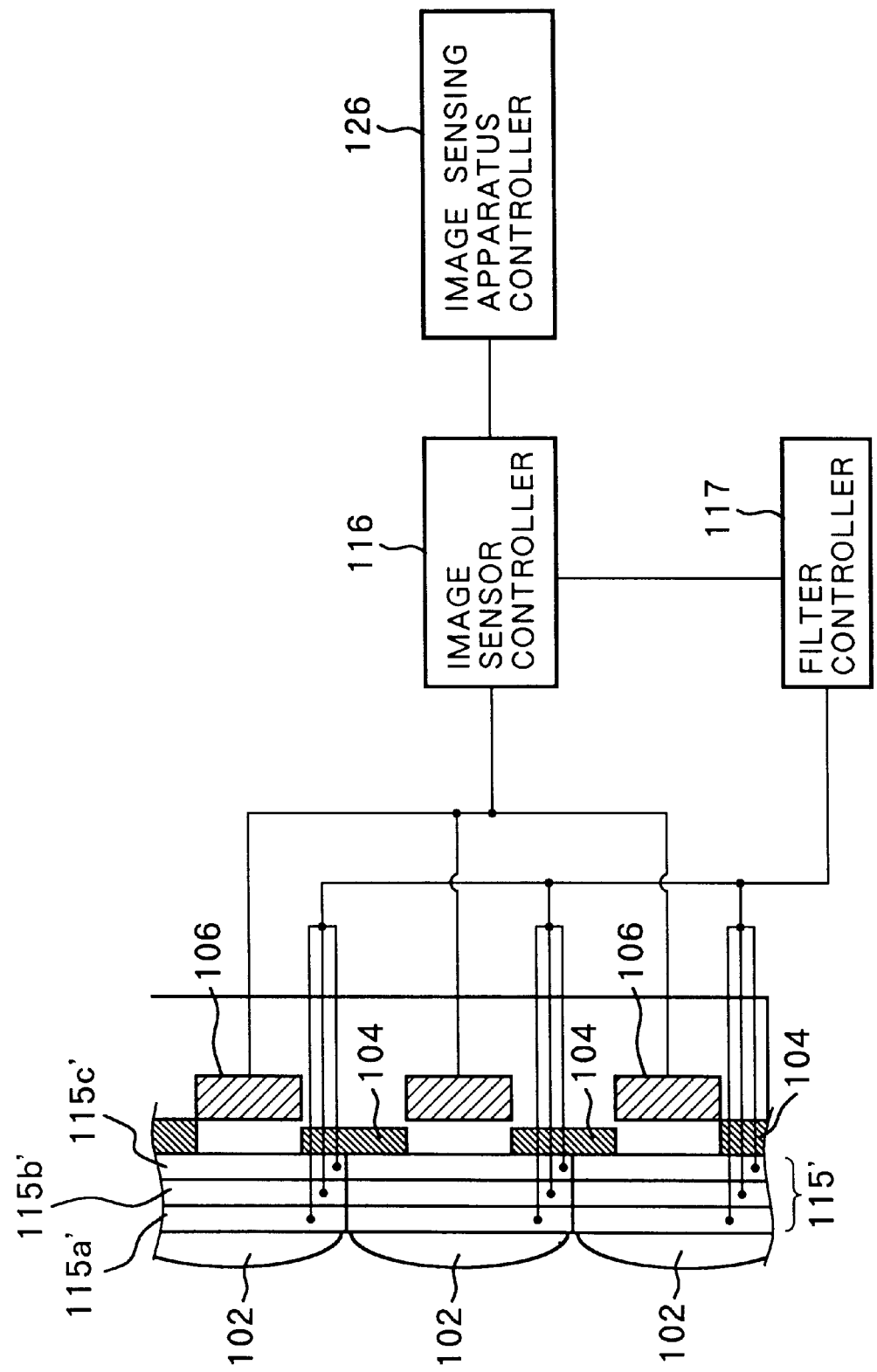
FIG. 6 is a schematic view showing a configuration of a solid-state image sensing device and its controller units according to a modification of the first embodiment.

A configuration of an image sensing apparatus according to a modification of the first embodiment will be explained with reference to FIG. 6. FIG. 6 is a schematic view showing a configuration of a solid-state image sensing device and its controller units according to this modification. In FIG. 6, the same units and elements as those in FIG. 1 are referred by the same reference numerals and explanation of those are omitted.

As shown in FIG. 6, the filter 115' made of optical modulation element layers in this modification is manufactured so that each layer can be controlled by area whose size corresponds to the size of a pixel of the solid-state image sensing device and the filter 115' is provided on the solid-state image sensing device to match positions of each area of the filter and each pixel of the solid-state image sensing device. Each area of the filter 115' is electrically connected to the filter controller 117, and the image sensor controller 116 is electrically connected to the image sensing apparatus controller 126 as shown in FIG. 6.

Figure 7A:
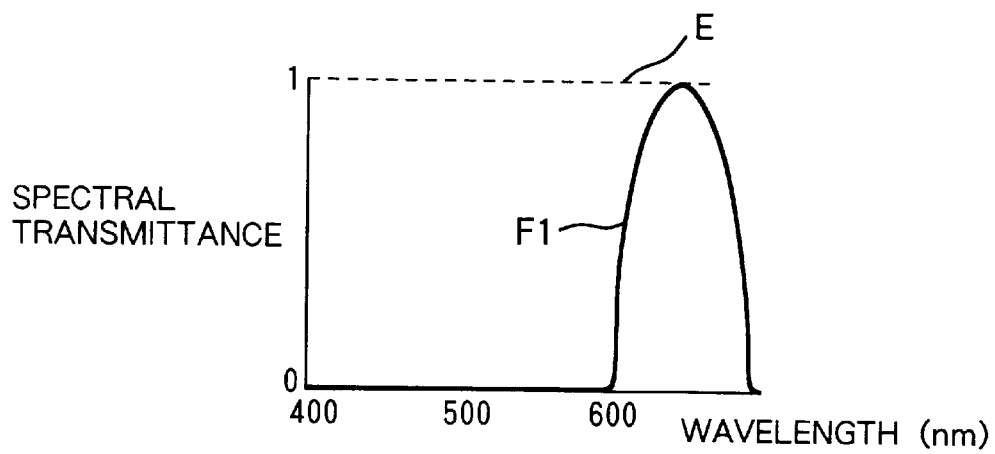
FIGS. 7A to 7C are graphs showing spectral transmission characteristics of optical modulation element layers of a filter shown in FIG. 6.
Figure 7B:
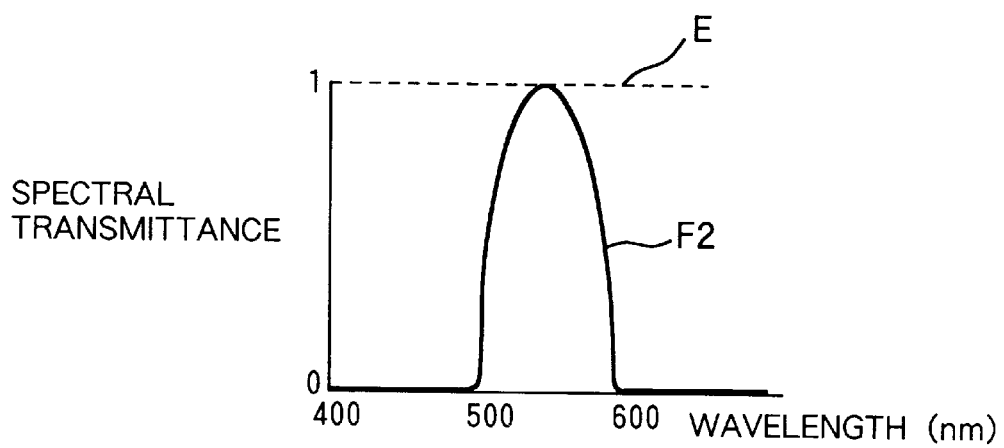
Figure 7C:
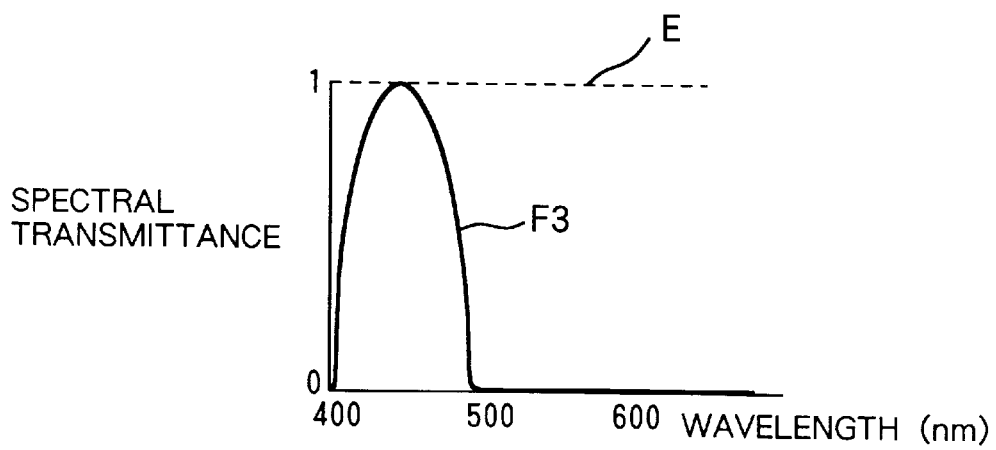

FIGS. 7A to 7C are graphs showing spectral transmission characteristics of the optical modulation element layers 115a', 115b' and 115c', respectively, of the filter 115' which can be controlled by pixel. Each of the layers 115a', 115b' and 115c' is controlled in the same manner as in the first embodiment, however, spectral transmission characteristics of the filter 115' can be independently controlled by pixel.

Figure 8A:
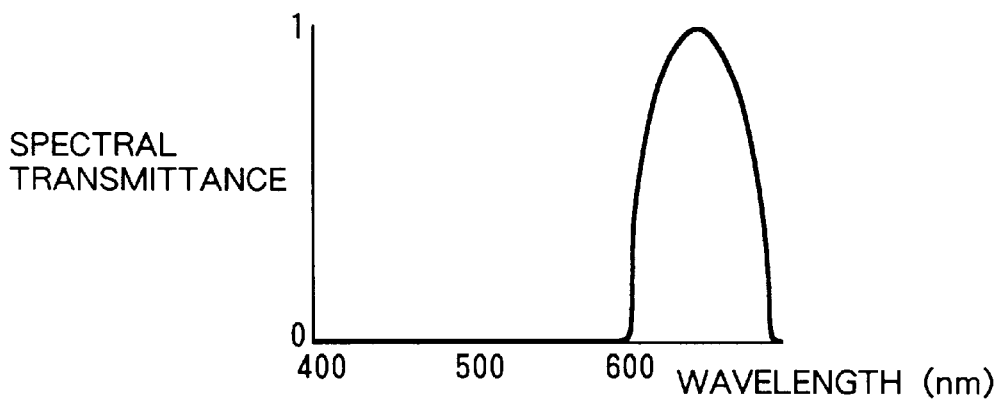
FIGS. 8A to 8C are graphs showing total spectral transmission characteristics of the filter shown in FIG. 6.
Figure 8B:
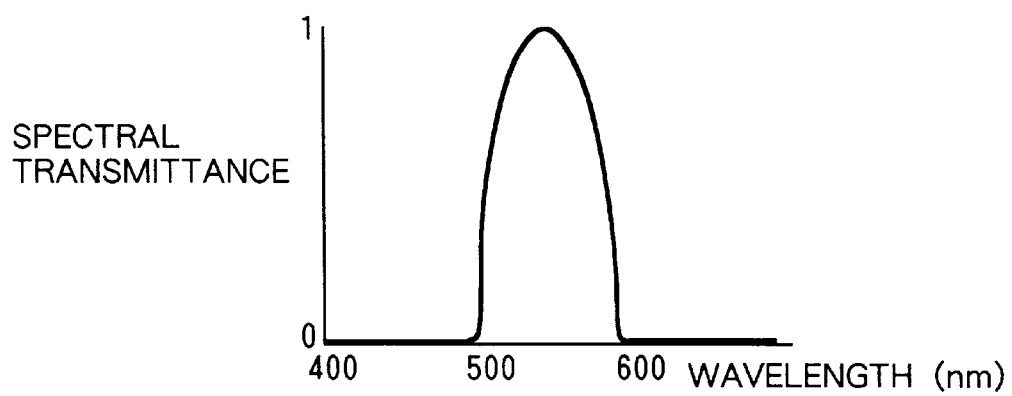
Figure 8C:
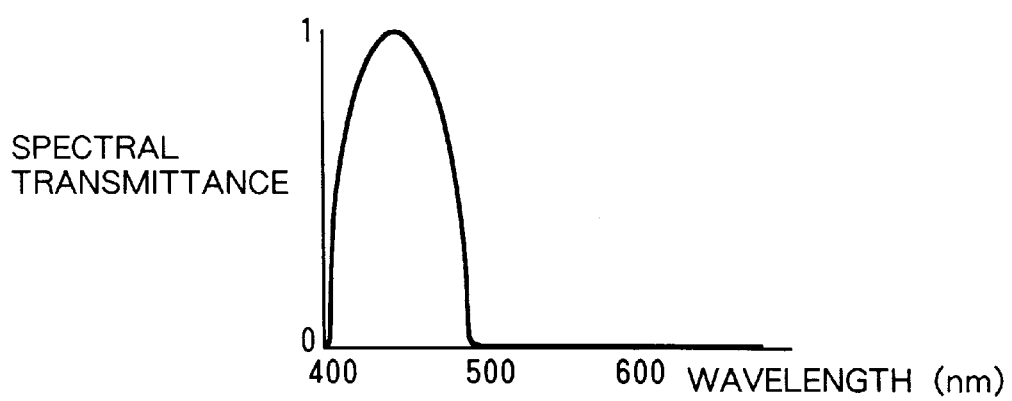

FIGS. 8A to 8C are graphs showing total spectral transmission characteristics of a pixel of the filter. Especially, FIG. 8A shows a graph of the total spectral transmission characteristics of the filter 115' when the first layer 115a' is controlled so as to have transmission characteristics indicated by a solid line F1 (second state), and the second and third layers 115b' and 115c' are controlled so as to be in the state indicated by dashed lines E (first state). Similarly to the first embodiment, therefore, by changing combination of the first and second states of the layers, it is also possible to change the wavelength transmission selectivity characteristics of the entire filter as shown in FIGS. 8B and 8C.

Figure 9A:
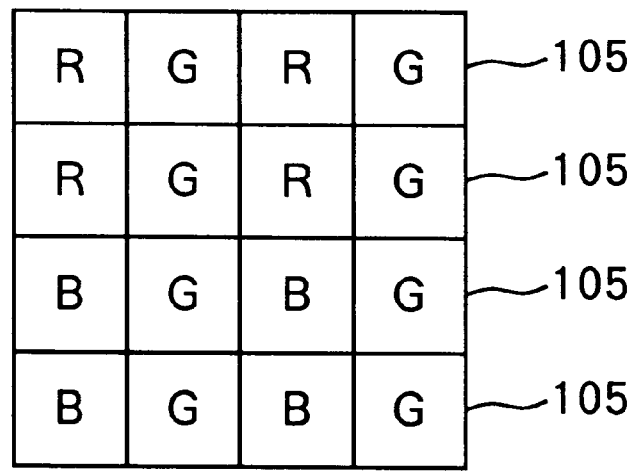
FIGS. 9A and 9B show examples of arrangements of areas each of which is controlled to have different spectral transmittance in the filter shown in FIG. 6.
Figure 9B:
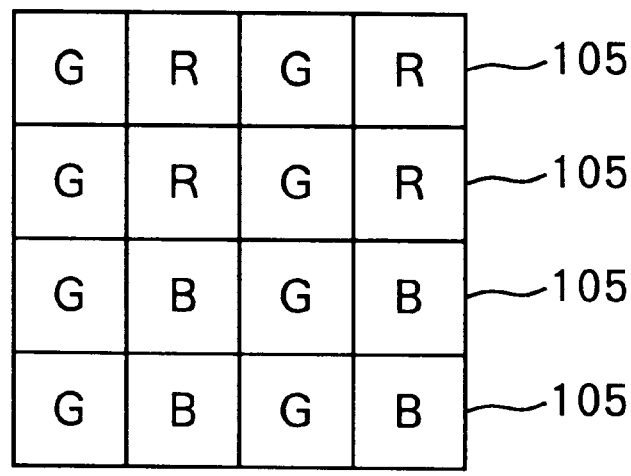

Next, an arrangement of colors of the filter and its operation when spectral transmission characteristics are controlled by pixel will be explained. FIGS. 9A and 9B show examples of arrangements of areas whose spectral transmission characteristics are independently controlled in the filter. Each square area in FIGS. 9A and 9B shows an area corresponding to a pixel 105, and R indicates areas controlled to transmit light in the red wavelength range in the filter 115', and similarly, G and B indicate areas controlled to transmit light in the green and blue wavelength ranges, respectively, in the filter 115'.

FIG. 9A shows an arrangement of the spectral transmission characteristics of the filter in the initial state. First, an image is sensed in the initial state. Next, another image is sensed after the arrangement of the spectral transmission characteristics of each area of the filter 115' is changed as shown in FIG. 9B. Thereafter, the obtained images are combined by an image combining means (not shown), thereby a high quality image sensed in a finer sampling interval can be obtained.

As the spectral transmission characteristics of the filter 115', primary colors, i.e., red, green and blue, are used in this modification, however, the same advantage can be attained by using spectral transmission characteristics corresponding to complementary colors, i.e., cyan, magenta, yellow and green.

Further, the arrangement of the spectral transmission characteristics of areas in the filter 115' is shown as FIGS. 9A and 9B, however, the present invention is not limited to this, and the same advantage can be attained as far as an arrangement of the spectral transmission characteristics of areas in the filter 115' is controlled so as to make a spatial sampling interval finer.

Further, similarly to the first embodiment, an electrochromic element is preferred as the optical modulation element in the modification, however, the same advantage can be achieved by using any optical modulation element having controllable spectral transmission characteristics in response to an electrical signal or the like.

<Second Embodiment>

Figure 10:
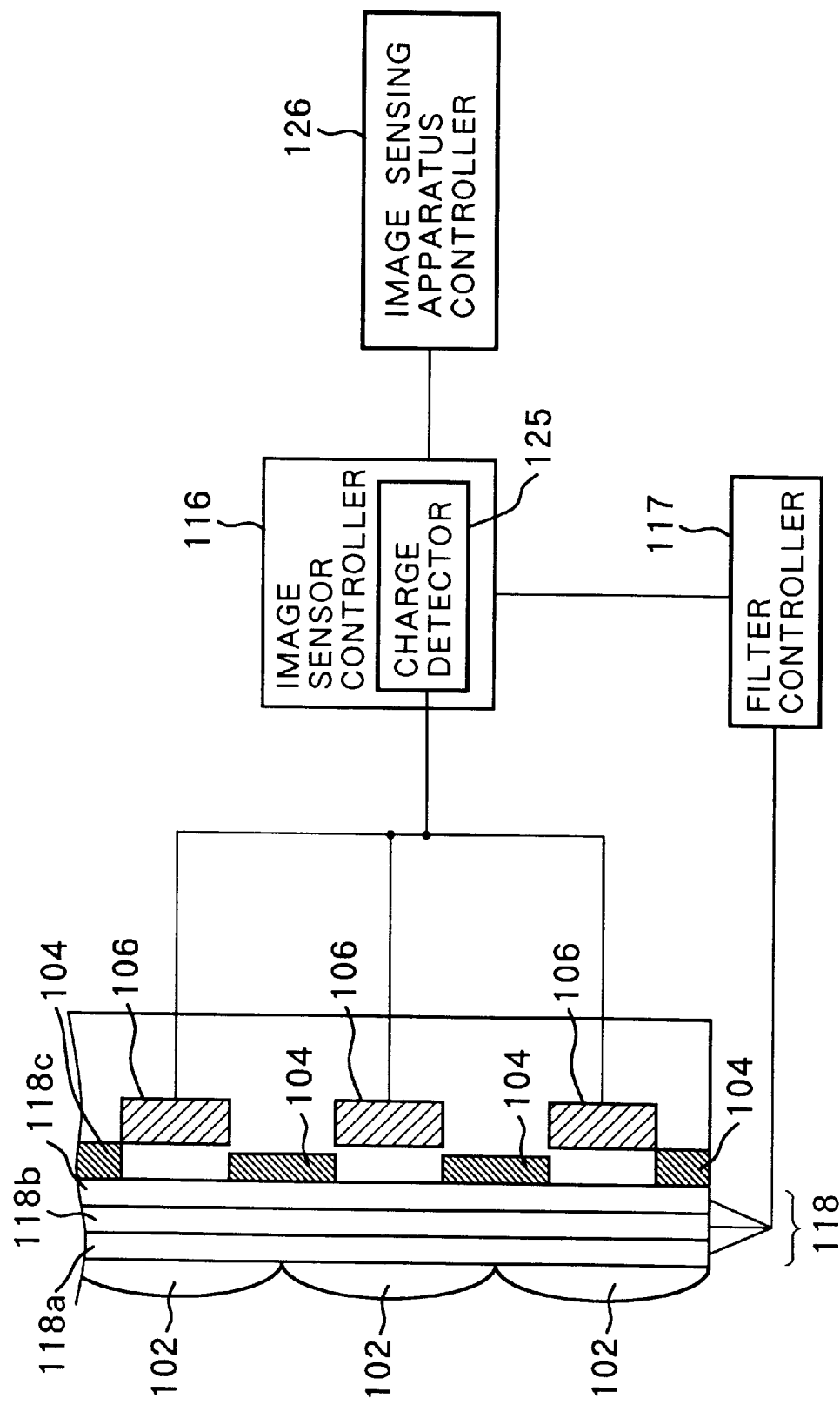
FIG. 10 is a schematic view showing a configuration of a solid-state image sensing device and its controller units according to a second embodiment.

Referring to FIG. 10, a configuration of an image sensing apparatus according to a second embodiment of the present invention will be described below. FIG. 10 is a schematic view showing a configuration of a solid-state image sensing device and its controller units according to the second embodiment. In FIG. 10, the same units and elements as those in FIG. 1 is referred by the same reference numerals and explanation of those are omitted.

In FIG. 10, reference numeral 118 denotes a filter having controllable phased spectral transmission characteristics, and reference numeral 125 denotes a charge detector for detecting charge stored in the solid-state image sensing device. The charge detector 125, image sensor controller 116, filter controller 117 and the image sensing apparatus controller 126 are electrically connected as shown in FIG. 10.

Figure 11A:
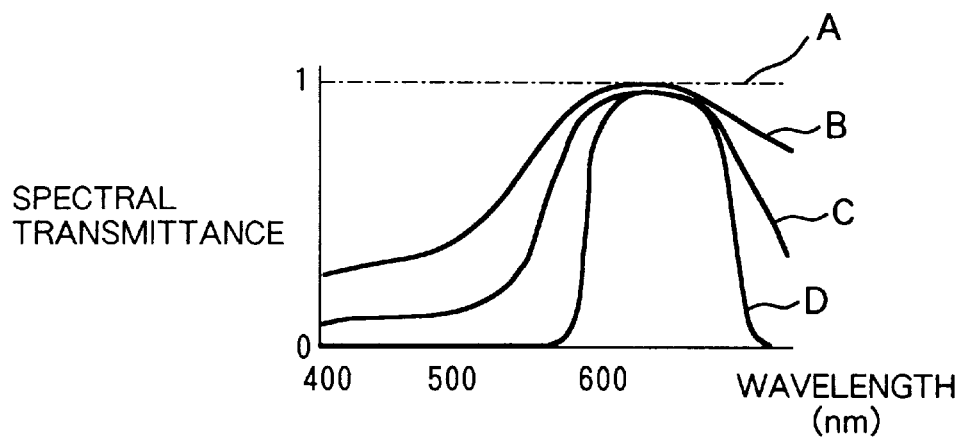
FIGS. 11A to 11C are graphs showing spectral transmission characteristics of optical modulation element layers of a filter shown in FIG. 10.
Figure 11B:
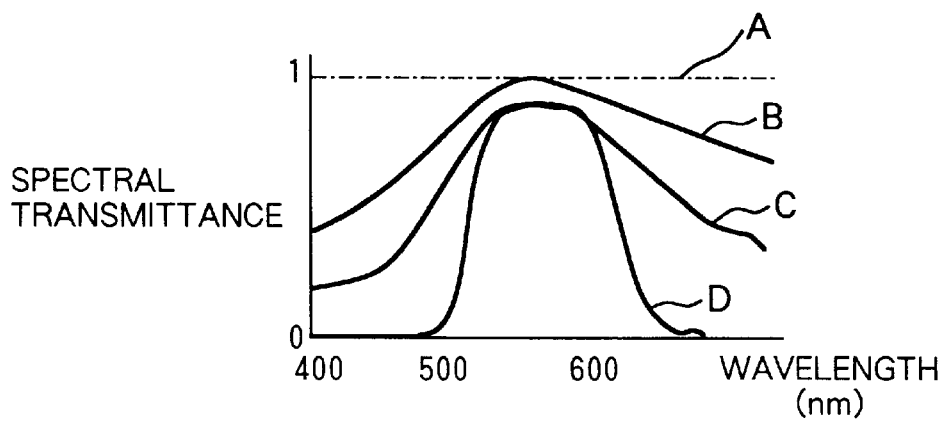
Figure 11C:
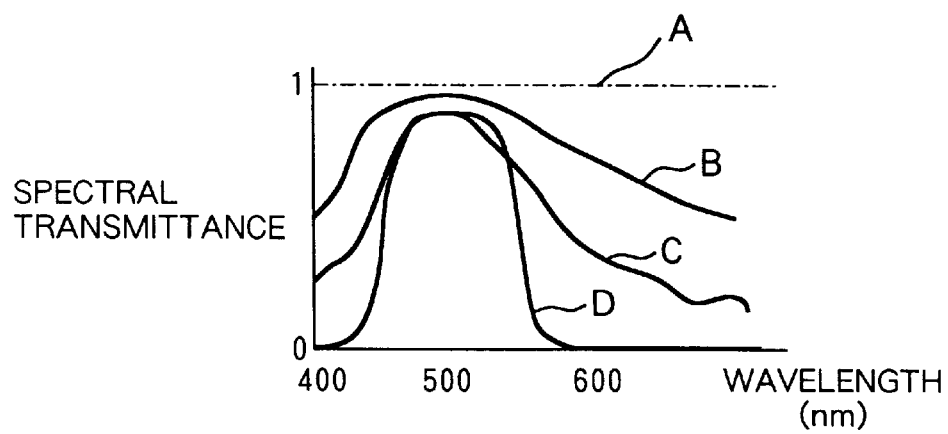

Next, the spectral transmittance characteristics of the filter 118 consisting of optical modulation elements according to the second embodiment will be described. FIGS. 11A to 11C are graphs showing spectral transmission characteristics of optical modulation element layers 118a, 118b and 118c of the filter 118, respectively. These layers 118a to 118c are referred as the first to third layers 118a to 118c, respectively.

Referring to FIG. 11A, a dashed line A shows a state in which the first layer 118a almost equally transmits visible light in all the wavelength range (first state), and solid lines B, C and D show other states in which the first layer 118a mainly transmits light in specific wavelength ranges in response to different control signals from the filter controller 117. Similarly, the layers 118b and 118c shown in FIG. 10 can also be controlled to be in the first state which is indicated by dashed lines A, and other states (indicated by solid lines B and C) in which spectral transmittances change with respect to wavelength.

The spectral transmittance of the filter 118 consisting of the first to third layers 118a to 118c with respect to a wavelength λ is given by the product of spectral transmittances of the first to third lays 118a to 118c. Similarly to the first embodiment, denoting $\mu_f$ as the total transmittance of the filter and $\mu_i$ as the transmittance of the i-th layer (i=1, 2, 3), then, since the filter consists of three layers in the second embodiment, the total transmittance $\mu_f$ of the filter is given by the following equation.

$$\mu_f(\lambda)=\mu_1(\lambda)\mu_2(\lambda)\mu_3(\lambda)$$

Figure 12A:
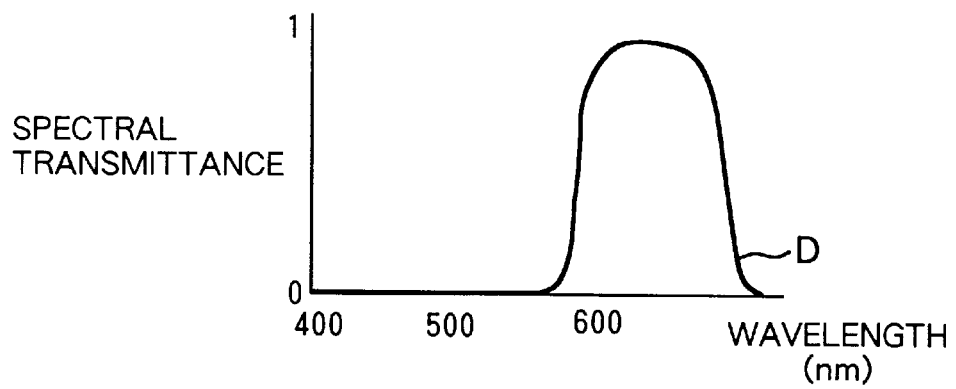
FIGS. 12A to 12C are graphs showing controlled spectral transmission characteristics of each optical modulation element layer shown in FIGS. 11A to 11C.
Figure 12B:
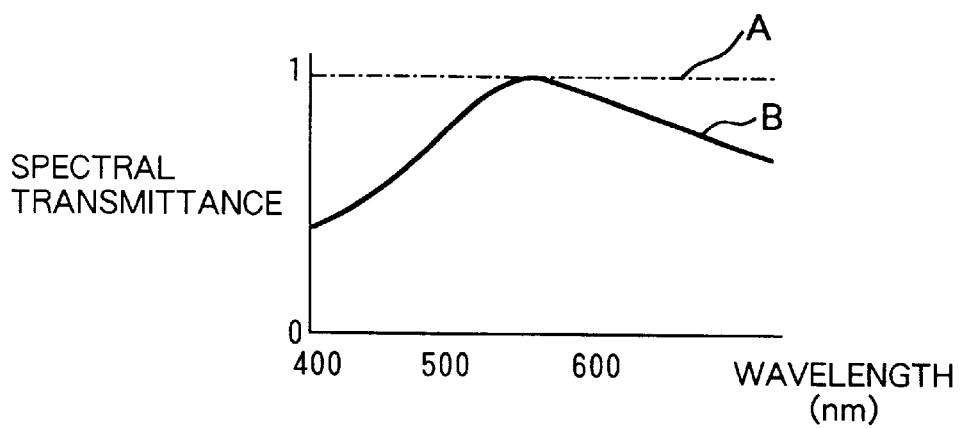
Figure 12C:
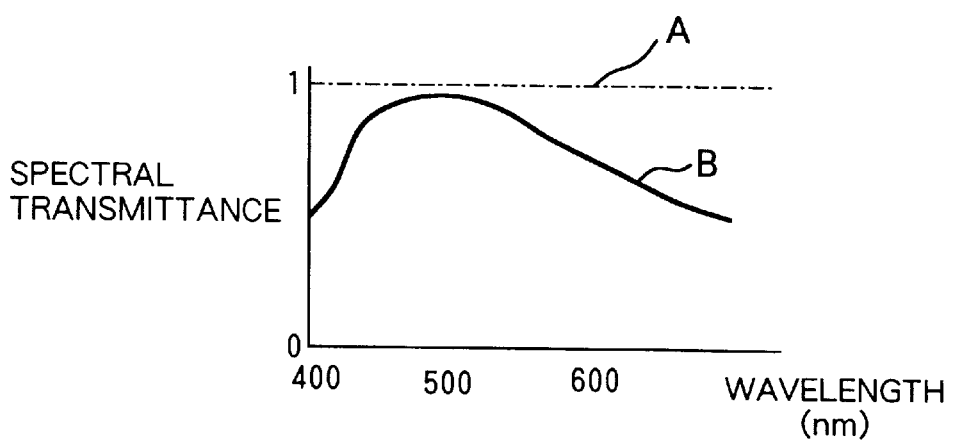
Figure 13A:
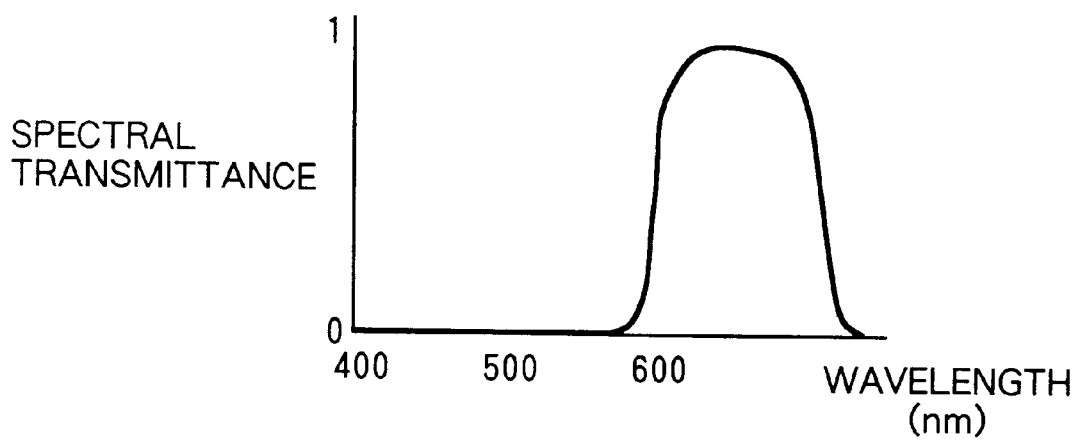
FIGS. 13A and 13B are graphs showing total spectral transmission characteristics of the filter when the layers are controlled as shown in FIGS. 12A to 12C.
Figure 13B:
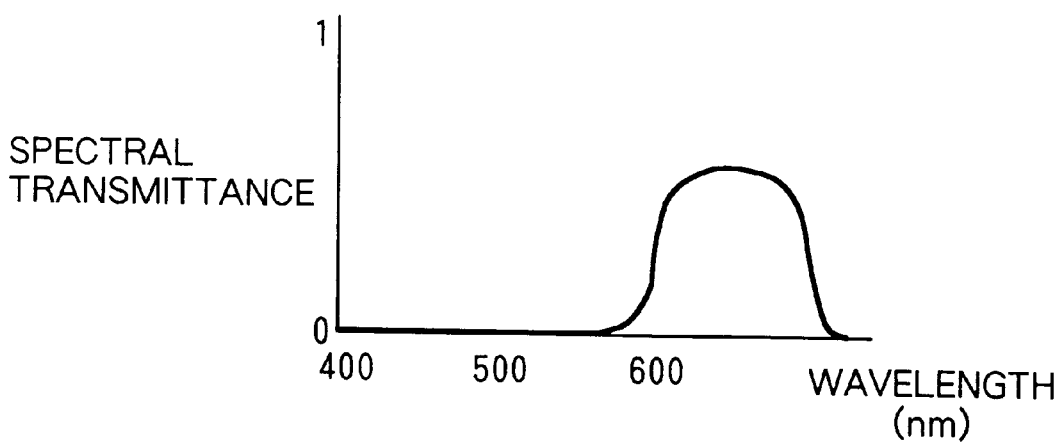

FIGS. 12A to 12C are graphs showing controlled spectral transmission characteristics of the optical modulation element layers 118a to 118c, respectively, and FIGS. 13A and 13B are graphs showing the total spectral transmission characteristics of the filter when the first to third layers 118a to 118c are controlled as shown in FIGS. 12A to 12C. The horizontal axes of the graphs are wavelength, and the vertical axes are spectral transmittance.

For example, by controlling the first layer 118a to be in the state D in which the first layer 118a mainly transmits red light as shown in FIG. 12A and controlling the second and third layers 118b and 118c to be in the first state A indicated by dashed lines in FIGS. 12B and 12C, the total spectral transmission characteristics of the filter 118 becomes as shown in FIG. 13A.

Further, by controlling the first layer 118a so as to be in the state D and controlling the second and third layers 118b and 118c to be in the state B, indicated by a solid line in FIGS. 12B and 12C, in which spectral transmittances of the second and third layers 118a and 118b slightly differ with respect to wavelength, the total spectral transmission characteristics of the filter 118 become as shown in FIG. 13B.

As apparent from FIG. 13A and FIG. 13B, the wavelength ranges are almost same in FIGS. 13A and 13B, however, the spectral transmittances differ from each other. This shows that it is possible to control a quantity of light passing through the filter 118.

Figure 14:
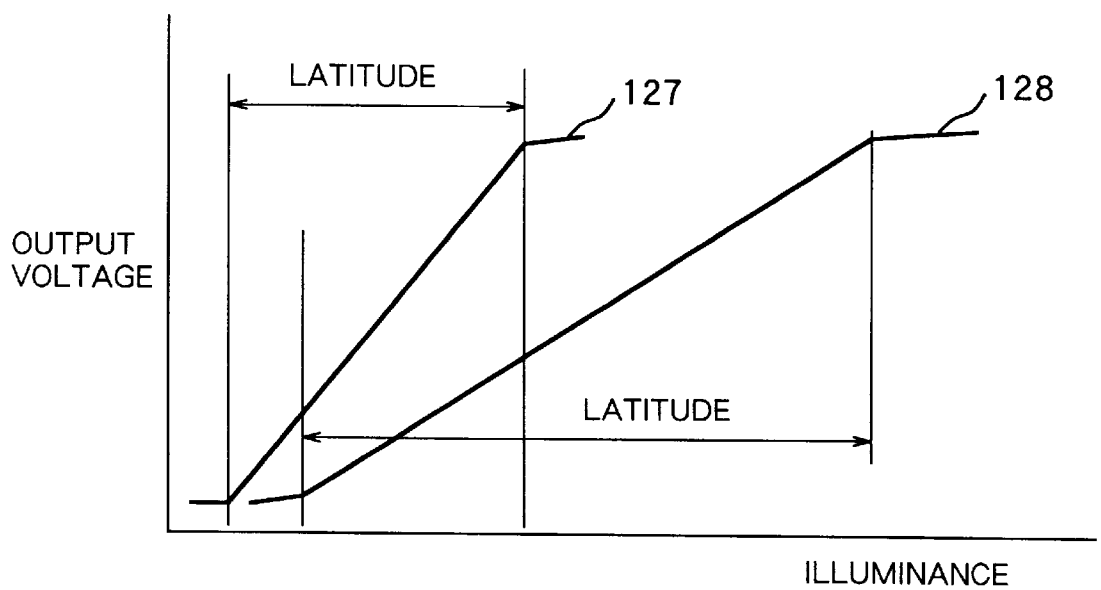
FIG. 14 is a graph showing output voltage from the solid-state image sensing device with respect to illuminance of incoming light.

Next, an effect of controlling the quantity of incoming light will be discussed. FIG. 14 is a graph showing output voltage from the solid-state image sensing device with respect to illuminance of incoming light. In FIG. 14, a horizontal axis shows illuminance of incoming light to each pixel of the solid-state image sensing device, and a vertical axis shows output voltage from the pixel.

The solid line 127 in FIG. 14 shows an output sensitivity characteristics of a common solid-state image sensing device. As shown by the solid line 127, since the latitude (dynamic range) with respect to illuminance is narrow, when strong light incidents on the solid-state image sensing device, charge obtained by photoelectric conversion exceeds the capacity of pixel for storing charge. As a result, the excess charge overflows and causes deterioration in image quality, such as blooming.

Further, the solid-line 128 in FIG. 14 shows sensitivity characteristics of the solid-state image sensing device when a quantity of incoming light is controlled by the filter 118 in a case where very strong light which causes saturation of the conventional solid-state image sensing device is coming in. The control of the quantity of incoming light can be realized by controlling the spectral transmission characteristics of the filter 118 in accordance with the charge, stored in the solid-state image sensing device, which is detected by the charge detector 125 provided in the image sensor controller 116.

As apparent from FIG. 14, when a light whose illuminance causes saturation of the solid-state image sensing device incidents in a case which is described by the solid line 127, it is possible to prevent the saturation, as represented by the solid line 128, by controlling the quantity of incoming light. Accordingly, the latitude of the solid-state image sensing apparatus with respect to the incoming light widens. In addition to the widening of the latitude, since a mechanical iris diaphragm function and the ND filter for controlling the quantity of incoming light become unnecessary, thereby the image sensing apparatus can be simplified as well as further down-sized.

According to the second embodiment, in addition to the method, expressed in the first embodiment, that combining a plurality of images sensed each time after changing spectral transmission characteristics of the filter 118, a quantity of incoming light can also be controlled in accordance with the output charge in the second embodiment, thereby obtaining a high resolution as well as high quality image of a widened dynamic range.

Figure 15:
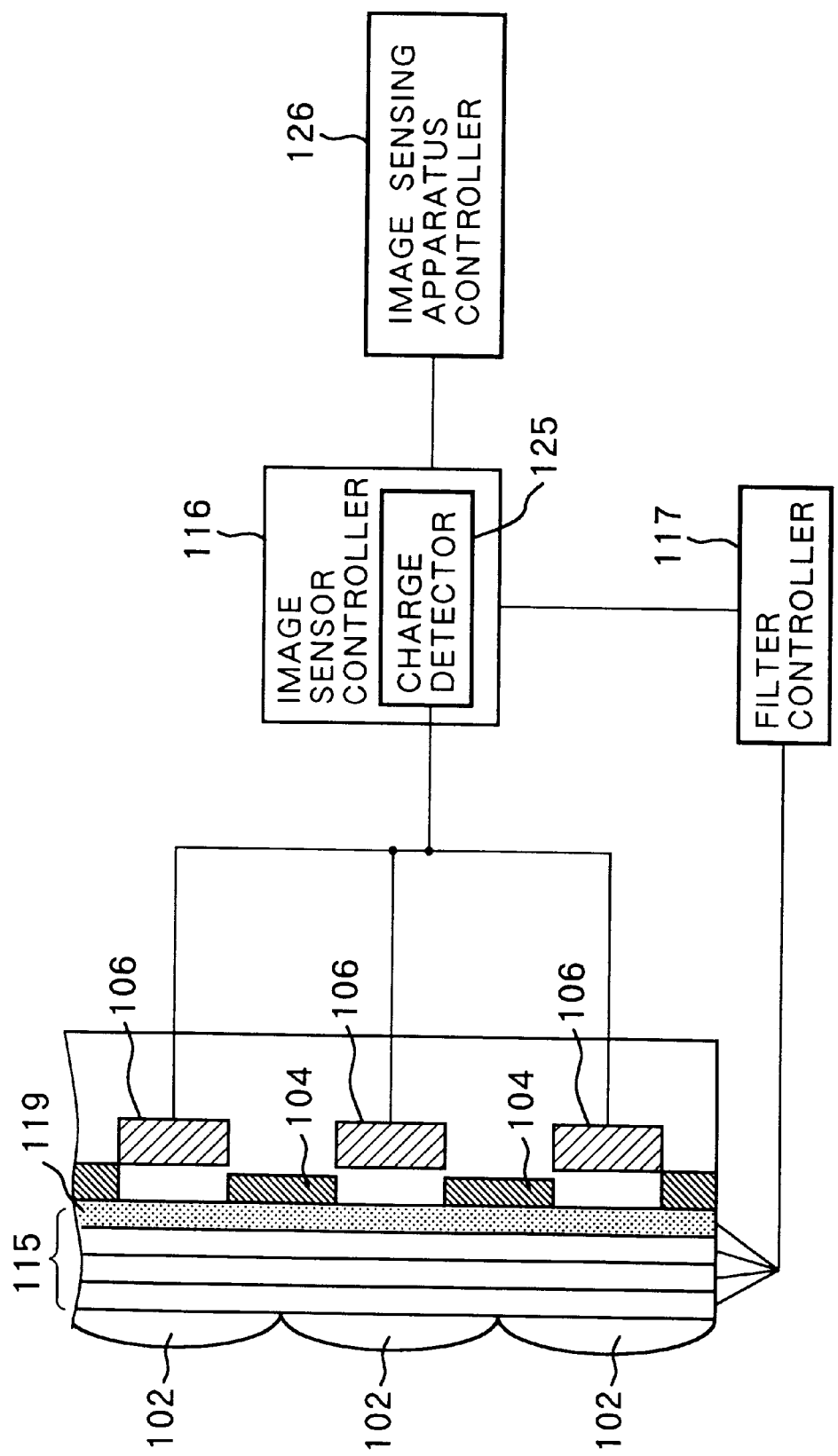
FIG. 15 is a schematic view showing another configuration of a solid-state image sensing device and its controller units according to the second embodiment.

Further, the quantity of light passing through the filter 118 is controlled by combining wavelength selectivity characteristics of each optical modulation element, however, the same advantage can be obtained by providing an optical modulation element 119 whose light transmittance is controllable in addition to the filter described in the first embodiment as shown in FIG. 15.

Furthermore, the filter 118 in the second embodiment consists of three optical modulation element layers having spectral transmission characteristics of selectively transmitting light of primary colors, i.e., red, green and blue, however, the present invention is not limited to this. The filter 118 may consist of four optical modulation element layers having spectral transmittance characteristic of selectively transmitting light of complementary colors, i.e., cyan, magenta, yellow and green, for example. Further, it can consist of at least a single layer of optical modulation element which can be sequentially controlled to transmits light of a plurality of selected wavelength ranges and another layer of an optical modulation element having controllable light transmission characteristics to obtain the same operation.

As the optical modulation element described above, an electrochromic element is preferable as in the case of the first embodiment. However, the same operation can be achieved by using any optical modulation element, such as liquid crystal, having controllable light transmission characteristics or spectral transmission characteristics in response to an electric signal.

<Modification of the Second Embodiment>

Figure 16:
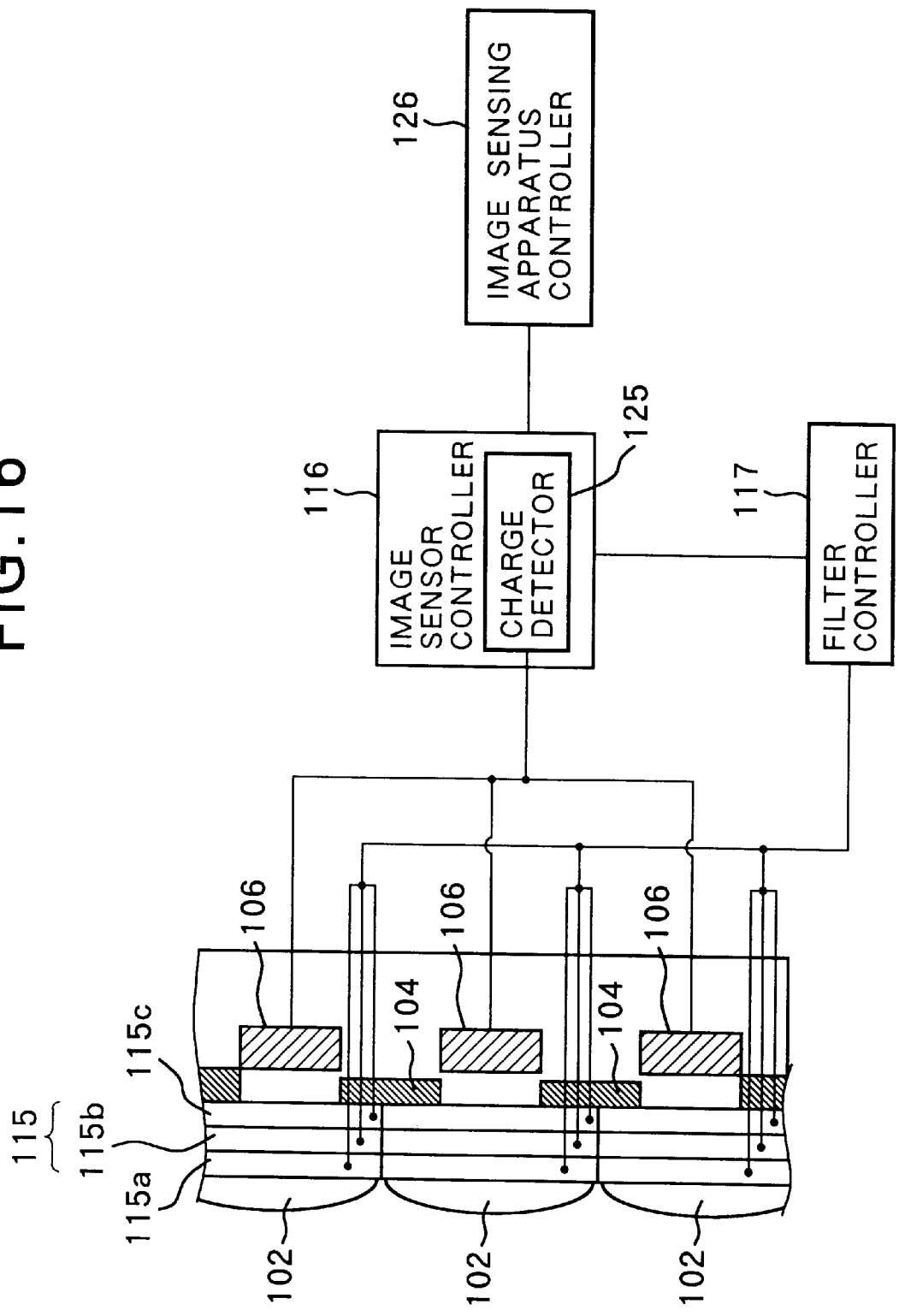
FIG. 16 is a schematic view showing a configuration of a solid-state image sensing device and its controller units according to a modification of the second embodiment.

Referring to FIG. 16, a configuration of an image sensing apparatus according to a modification of the second embodiment will be described. FIG. 16 is a schematic view showing a configuration of a solid-state image sensing device having a filter 118' and its controller units according to the modification of the second embodiment. In FIG. 16, the same units and element as those in FIGS. 1, 6, and 10 are referred by the same reference numerals and explanations of those are omitted.

The filter 118' made of optical modulation element layers in this modification is manufactured so that each layer can be independently controlled by area whose size corresponds to the size of a pixel of the solid-state image sensing device, and the image sensor controller 116 includes the charge detector 125 for detecting charge stored in each pixel. Further, as shown in FIG. 16, the optical modulation element layers 118a', 118b' and 118c', the filter controller 117, the image sensor controller 116, and the image sensing apparatus controller 126 are electrically connected. The optical modulation element layers 118a' to 118c' are respectively referred as the first to third layers 118a' to 118c', hereinafter.

Figure 17A:
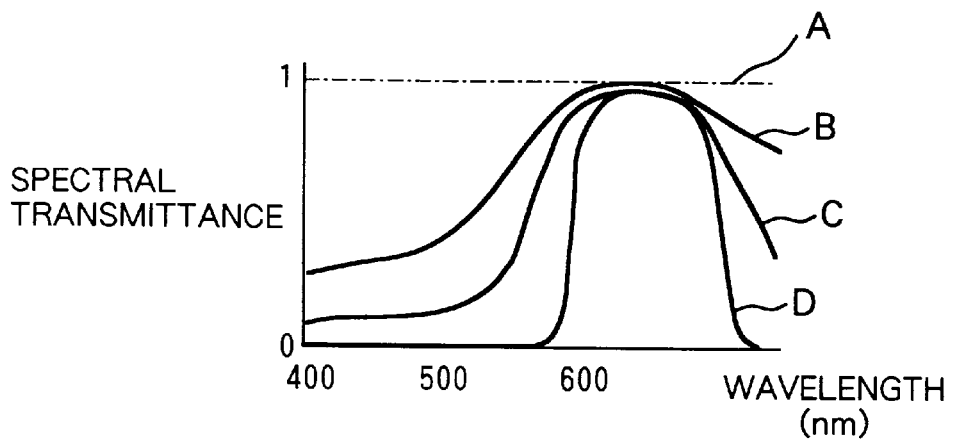
FIGS. 17A to 17C are graphs showing spectral transmission characteristics of optical modulation element layers of a filter shown in FIG. 16.
Figure 17B:
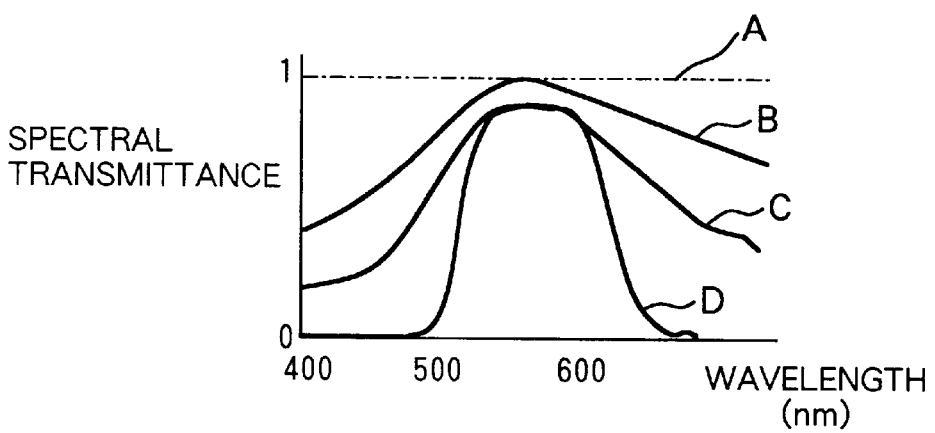
Figure 17C:
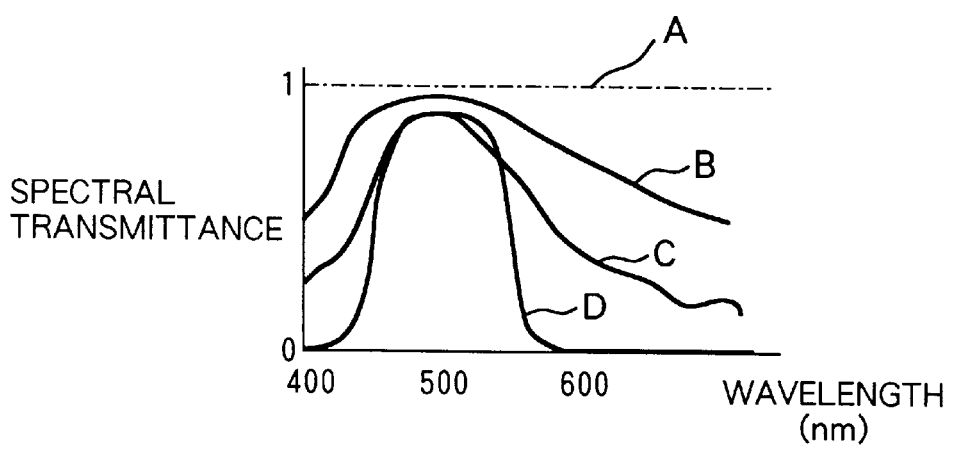
Figure 18A:
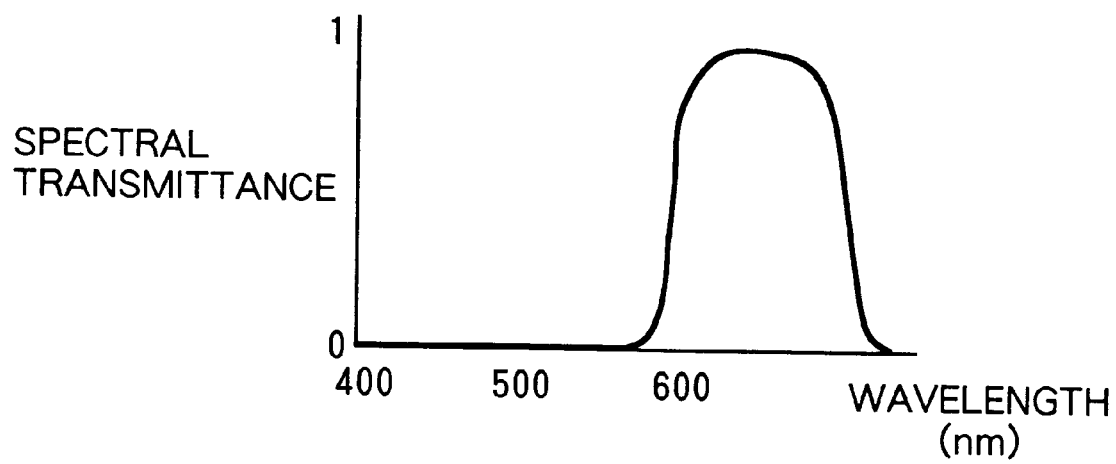
FIGS. 18A and 18B are graphs showing total spectral transmission characteristics of the filter shown in FIG. 16.
Figure 18B:
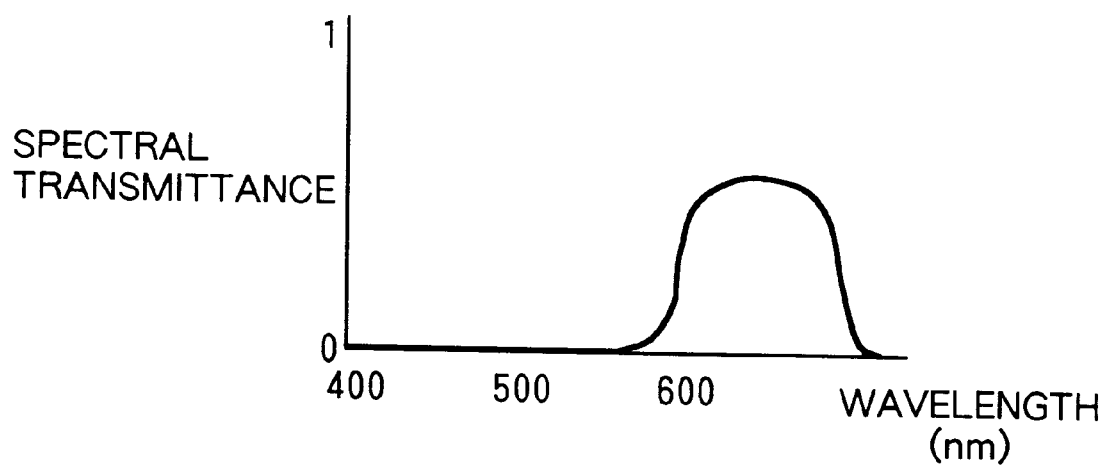

Next, a principle of controlling spectral transmission characteristics of each pixel of the filter 118' will be described. The control of the spectral transmission characteristics of the filter 118' by pixel is performed in the same manner as in the modification of the first embodiment. FIGS. 17A to 17C are graphs showing spectral transmission characteristics of each pixel of the first to third layers 118a' to 118c', respectively, and FIGS. 18A and 18B are graphs showing total spectral transmission characteristics of the filter 118'. In FIGS. 17A to 17C, 18A and 18B, the horizontal axes of the graphs are wavelength of light and vertical axes are spectral transmittance.

In FIGS. 17A to 17C, dashed lines A shows a first state in which each of the first to third layers 118a' to 118c' almost equally transmits visible light in all the wavelength range, and solid lines B, C, and D show state in which spectral transmission characteristics are controlled in response to different control signals from the filter controller 117.

For example, by controlling the first layer 118a' to be in the state illustrated by the solid line D in FIG. 17A, and controlling the second and third layers 118b' and 118c' to be in the state illustrated by the dashed lines A in FIGS. 17B and 17C, the total spectral transmission characteristics of the filter at this particular pixel becomes as shown in FIG. 18A. Further, by controlling the first layer 118a' to be in the state illustrated by the solid line D in FIG. 17A and controlling the second and third layers 118b' and 118c' to be in the state illustrated by the solid lines B in FIGS. 17B and 17C, then the total spectral transmission characteristics of the filter at this particular pixel becomes as shown in FIG. 18B.

By controlling the spectral transmission characteristics of the optical modulation element layers of the filter 118' as described above, a filter which transmits a controlled quantity of light of a selected wavelength range can be realized. The above advantage is the same as that in the second embodiment, however, since the control can be performed by pixel in this modification, the transmission quantity of light can be controlled flexibly.

Next, an arrangement of areas each of which can be independently controlled to have different spectral transmission characteristics in the filter 118' will be described. FIGS. 19A and 19B show examples of arrangements of the areas of the filter 118' made of optical modulation elements on the solid-state image sensing device.

In FIGS. 19A and 19B, R indicates areas controlled to mainly transmit red light, G indicates areas controlled to mainly transmit green light, and B indicates areas controlled to mainly transmit blue light. An operation of sensing an image is the same as that explained in the modification of the first embodiment. First, an image is sensed when the filter 118' is in the state shown in FIG. 19A, then another image is sensed when the filter 119' is in the state shown in FIG. 19B, then a plurality of obtained images are combined by using an image combining means (not shown) to obtain a complete image.

By performing as described above, since a spatial color sampling interval becomes narrow, generation of a false color signal is prevented, and consequently, a high quality image is obtained. Further, according to this embodiment, it is possible to control the filter 118' by pixel, thus flexible control is realized, thereby the image is expressed in the better quality. Furthermore, unevenness in sensitivity of each pixel of a solid-state image sensing device due to the manufacturing process can be corrected.

In the modification of the second embodiment, the filter 118' consists of three optical modulation element layers having spectral transmission characteristics of selectively transmitting light of primary colors, i.e., red, green and blue, however, the present invention is not limited to this. The filter 118' may consist of four optical modulation element layers having spectral transmittance characteristics of selectively transmitting light of complementary colors, i.e., cyan, magenta, yellow and green, for example. Further, it can consist of at least a single layer of optical modulation element which can be sequentially controlled to transmits light of a plurality of selected wavelength ranges and another layer of an optical modulation element having controllable light transmission characteristics to obtain the same operation.

As the optical modulation element as described above, an electrochromic element is preferable similarly to the aforesaid embodiments. However, the same advantage can be attained by using any optical modulation element having controllable light transmission characteristics or spectral transmission characteristics in response to an electric signal.

<Third Embodiment>

A third embodiments of the present invention will be described with reference to FIGS. 20 to 27D. In the third embodiment, dynamic range expansion, achieved by using a color filter made of optical modulation elements in the second embodiment, is performed by using an optical modulation filter having controllable light transmission characteristics, instead.

Figure 20:
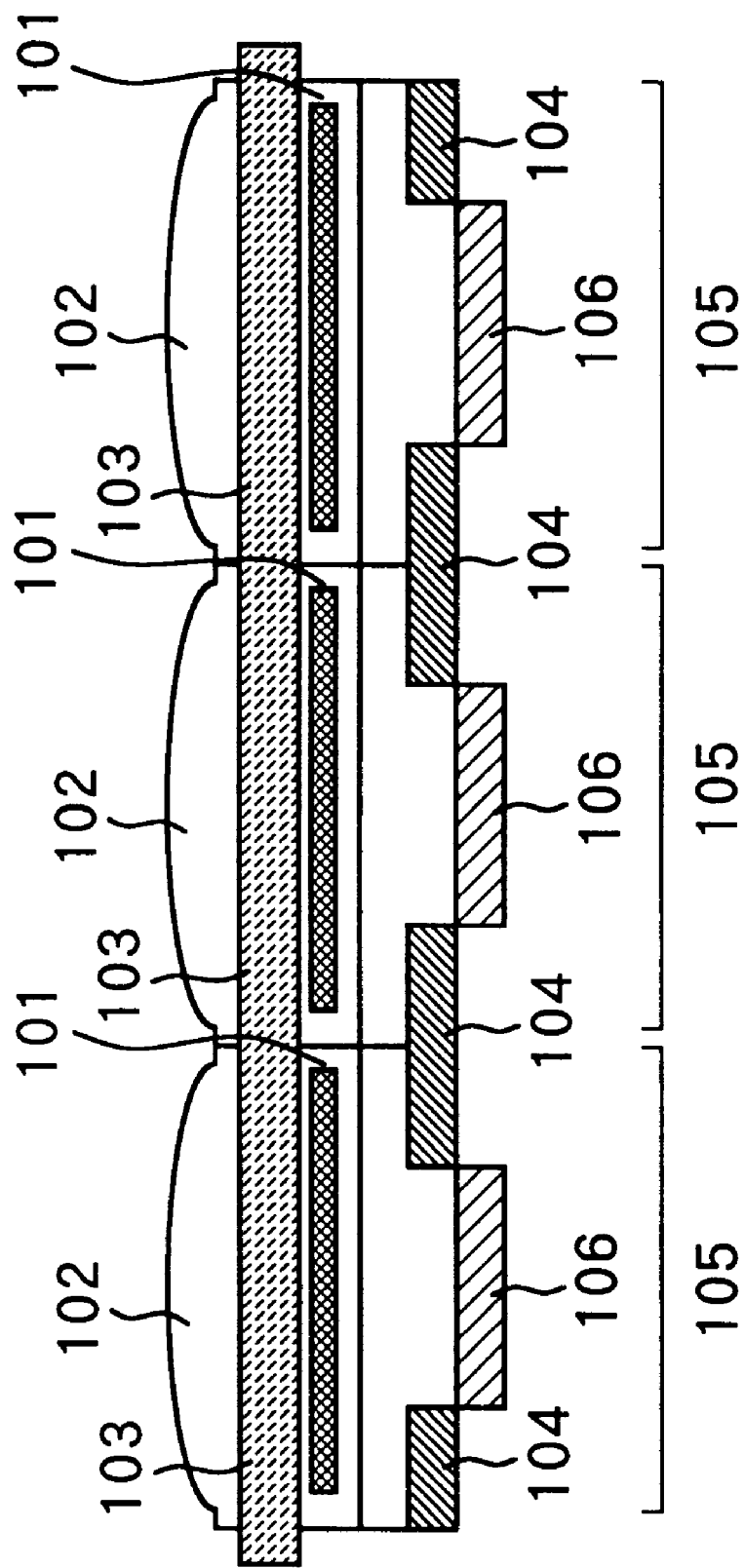
FIG. 20 is a cross-sectional view of a main configuration of a part of the solid-state image sensing device according to a third embodiment.

FIG. 20 is a cross-sectional view of a main configuration of a part of the solid-state image sensing device according to the third embodiment. In FIG. 20, reference numeral 101 denotes a color filter; 102, an on-chip lens; 103, a filter as an optical modulation means in the third embodiment; 104, a light blocking unit; 105, a pixel; and 106, an photoelectric converter. The filter 103 is made of a known optical modulation element, such as an electrochromic element and liquid crystal element, and its light transmittance is controllable. The filter 103 is set somewhere on the light path before incoming light reaches the photoelectric converter 106 of the solid-state image sensing device so that a quantity of incoming light to the photoelectric converter 106 can be controlled.

Figure 21:
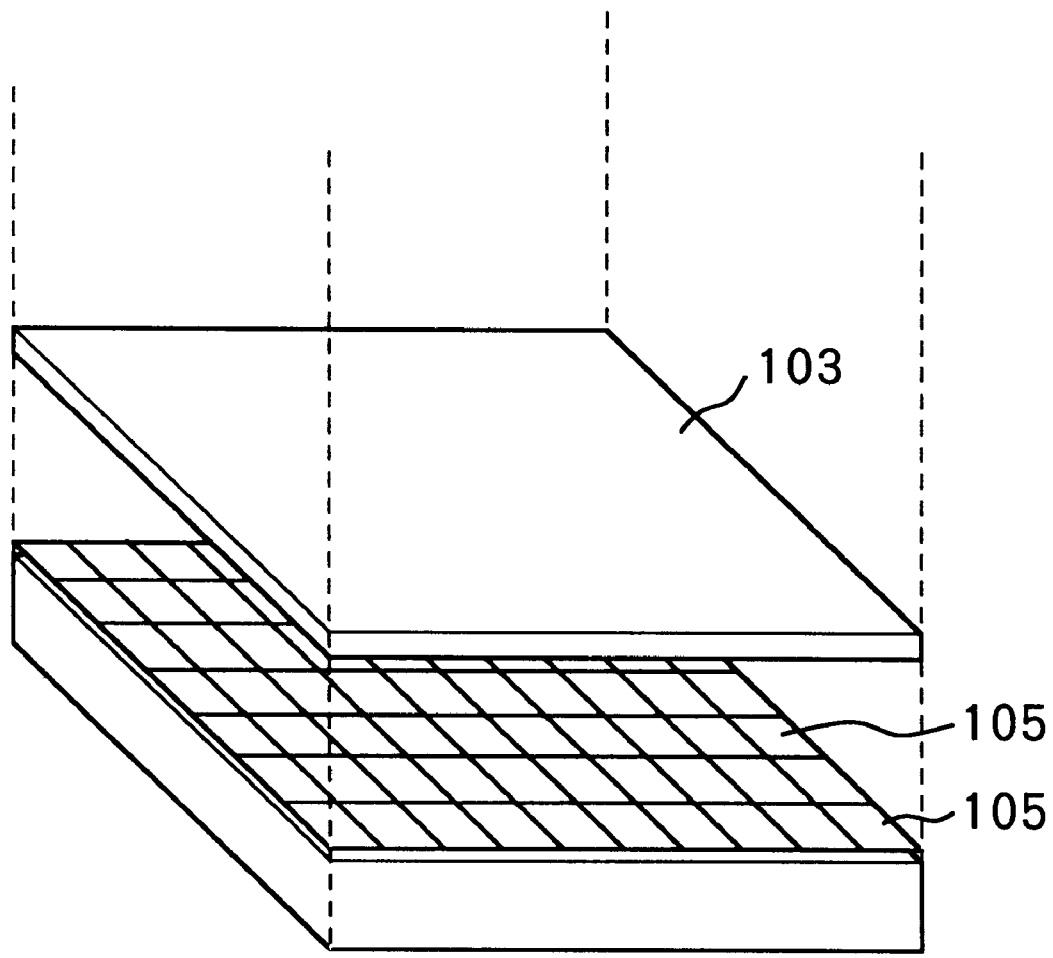
FIG. 21 is an explanatory view showing a correspondence between the solid-state image sensing element and an optical modulation element according to the third embodiment.

Further, FIGS. 21 denotes position relationship between pixels 105 of the solid-state image sensing device and an area by which light transmittance of the filter 103 can be controlled. In FIG. 21, the filter 103 is illustrated as if it is separated from the solid-state image sensing device, however, this figure is a conceptual illustration showing correspondence between pixels 105 and an area by which light transmittance can be independently controlled in the filter 103, and the filter 103 is actually formed on the solid-state image sensing device as shown in FIG. 20 in the third embodiment.

The area in the optical modulation device 103 by which the light transmittance can be independently controlled corresponds to the total area of all the pixels 105 of the solid-state image sensing device, thus the strength of the incoming light toward the solid-state image sensing device can be controlled uniformly over all the pixels 105 as shown in FIG. 21 according to the third embodiment. The area is electrically connected to a filter controller 122 shown in FIG. 22. The filter controller 122 will be described later.

Next, a method of controlling the quantity of incoming light using the filter 103 will be explained.

Figure 22:
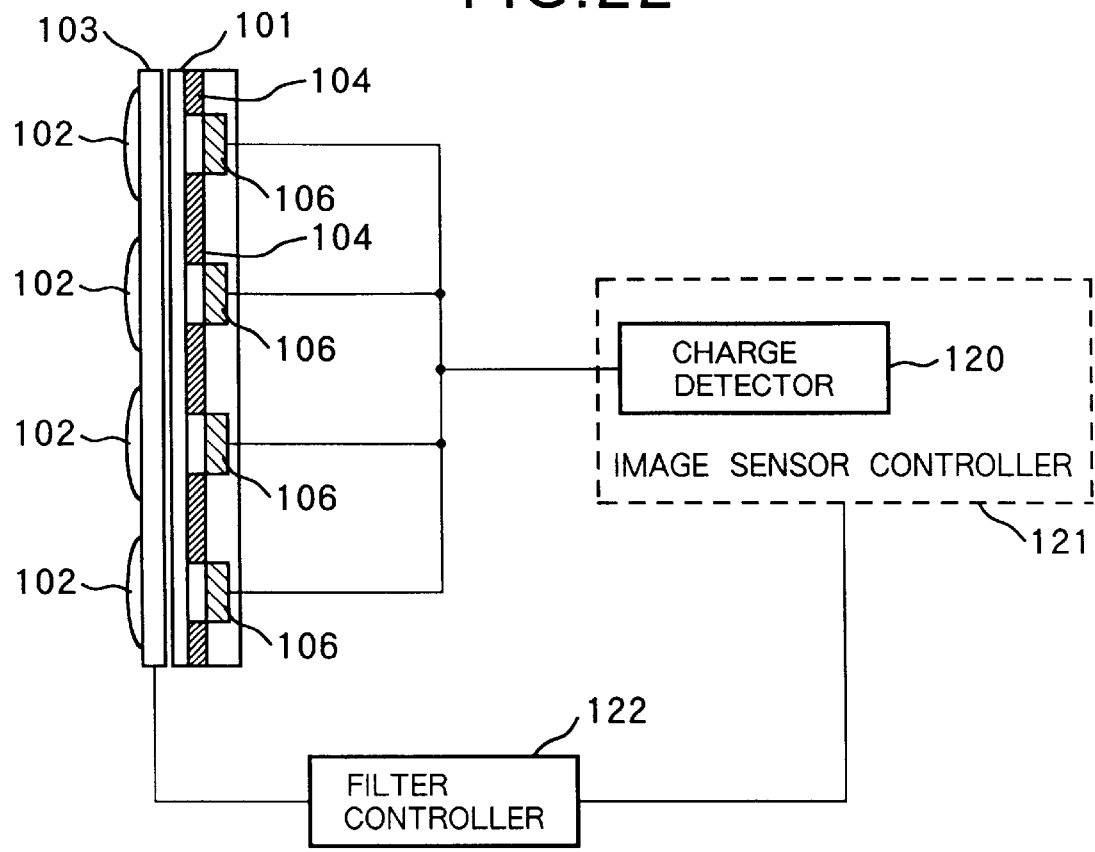
FIG. 22 is a schematic view showing a configuration of a solid-state image sensing device and its controller units according to the third embodiment.

FIG. 22 is a schematic view showing a configuration of a solid-state image sensing device and its controller units according to the third embodiment. In FIG. 22, the same unit and elements as those in FIG. 20 are referred by the same reference numerals.

Incoming light which incidents on photoelectric converter 106 of the solid-state image sensing device is photoelectric-converted by the photoelectric converter 106. The obtained charge from the photoelectric conversion is transmitted to an image sensor controller 121 via a transmission unit (not shown) so as to be amplified or applied with signal processes.

A charge detector 120 for detecting charge stored in each pixel 105 is provided in the image sensor controller 121, and a filter controller 122 controls the light transmittance of the filter 103 made of an optical modulation element in accordance with the charge stored in each pixel 105 so as to control a quantity of incoming light to the photoelectric converter 106 of the solid-state image sensing device.

Figure 23:
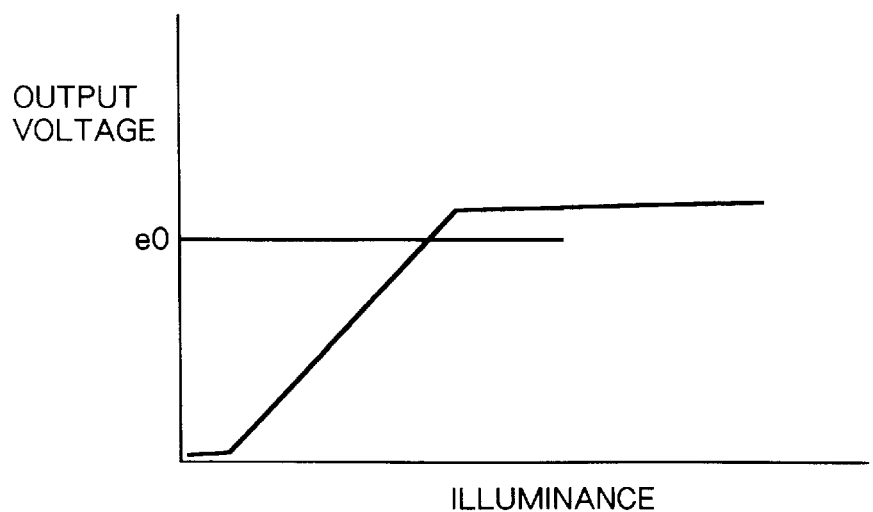
FIG. 23 is a graph showing a threshold value in an operation according to the third embodiment.
Figure 24:
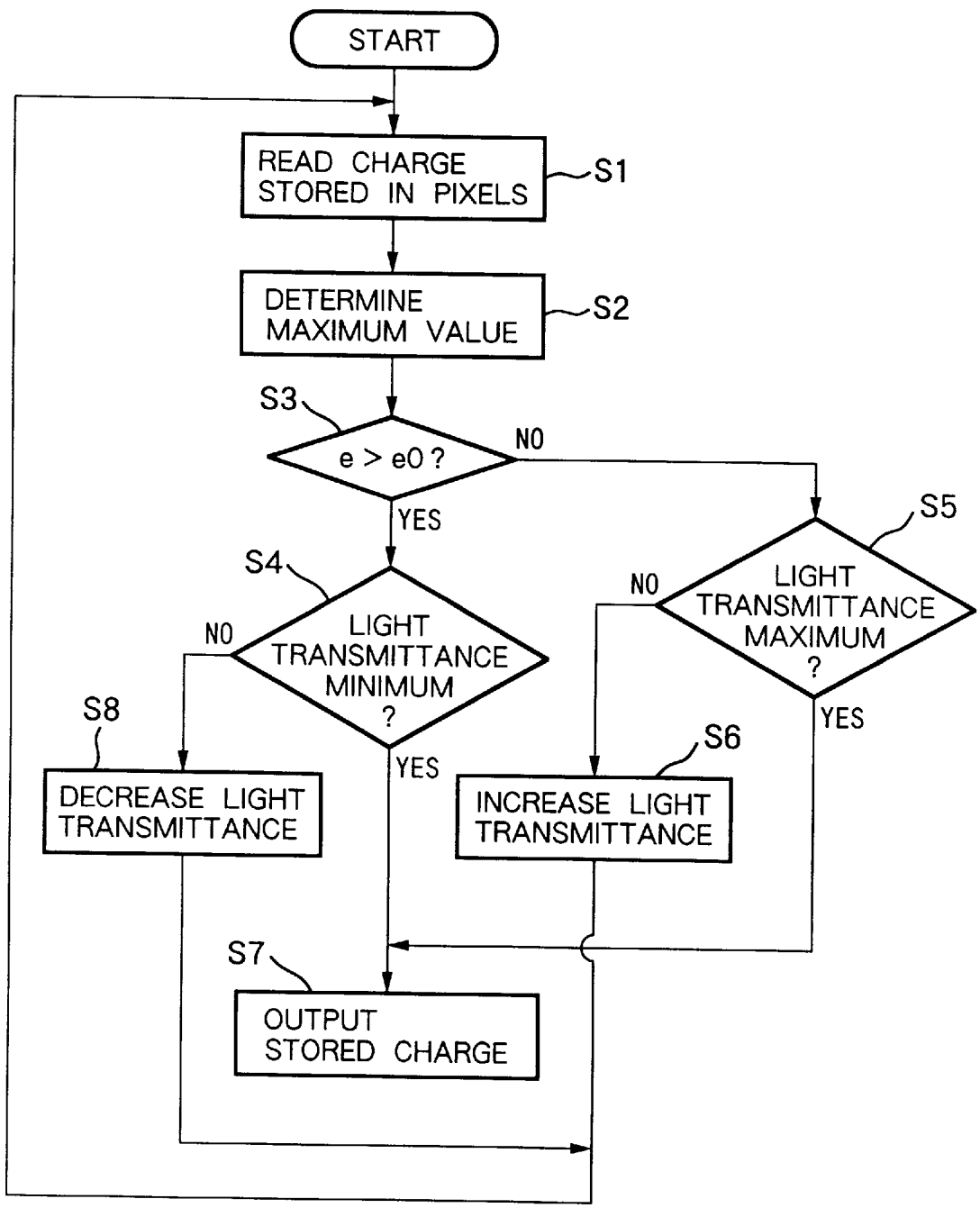
FIG. 24 is a flowchart of a control processing according to the third embodiment.

FIG. 24 is a flowchart of an operation of the image sensor controller 121 when the quantity of incoming light to the photoelectric converter 106 of the solid-state image sensing device is controlled. FIG. 23 is a graph showing an example of a threshold value in the operation. The threshold value (e0) in FIG. 23 is set on the basis of the saturation characteristics of each pixel 105 of the solid-state image sensing device, and the light transmittance of the filter 103 is controlled in accordance with the threshold (e0) of the pixels in the area and charge stored in each pixel 105.

Referring to FIGS. 22 and 24, an operation of the third embodiment will be explained.

The light incidented on the photoelectric converter 106 of the solid-state image sensing device is converted into charge by the photoelectric converter 106. After charge is accumulated in pixels 105 for a certain period of time, it is transmitted to the image sensor controller 121. Then, the charge stored in each pixel 105 is detected by the charge detector 120 at step S1, and representative values, such as the maximum value e, are determined at step S2. Then at step S3, the maximum value e is compared to the threshold (e0) representing the output voltage characteristics including saturated states of pixels.

If the maximum value of the charge stored in pixels 105 is equal or less than the threshold value (NO at step S3) and if the light transmittance of the filter 103 is maximum (YES at step S5), then charge stored in each pixel 105 is directly outputted. Further in a case where the maximum value of the charge stored in each pixel 105 is equal or less than the threshold value (NO at step S3) and the light transmittance of the filter 103 is not maximum (NO at step S5), then the light transmittance of the filter 103 is increased at step S6.

Further, when the maximum value of the charge stored in pixels 105 is larger than the threshold (e0) (YES at step S3) and the light transmittance of the filter 103 is minimum (YES at step S4), then the stored charge is outputted directly. Whereas, if the light transmittance is not minimum (No at step S4), then the light transmittance is further decreased (step S8). The control of the light transmittance of the optical modulation means is performed in this manner.

Figure 25:
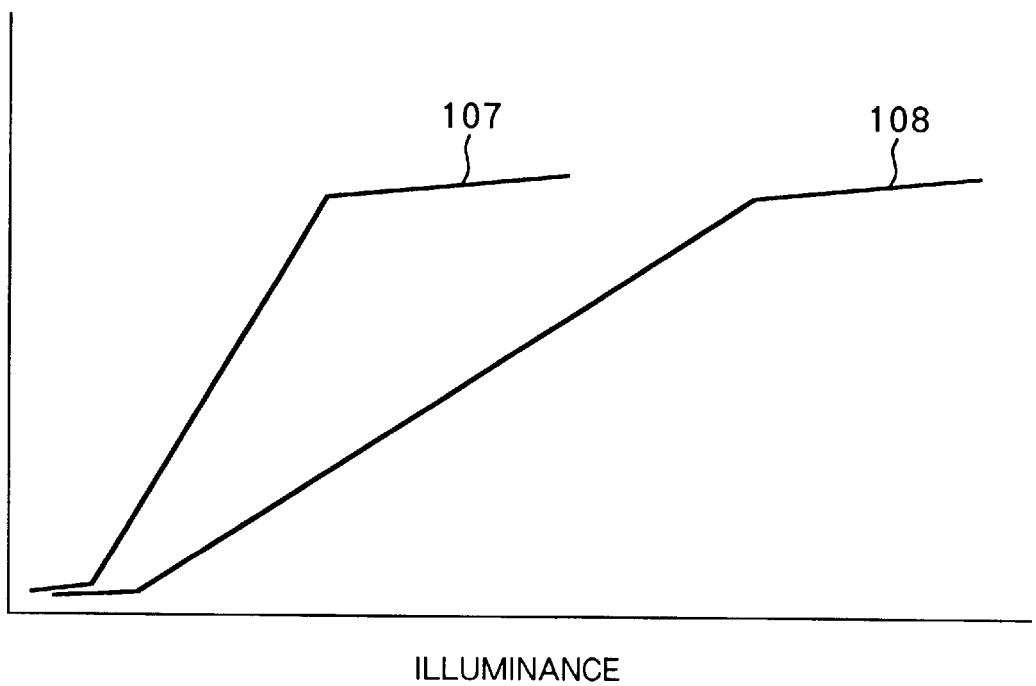
FIG. 25 is a graph illustrating an effect of the present invention according to the third embodiment.

FIG. 25 is a graph showing output voltage characteristics of the solid-state image sensing device according to the third embodiment. In FIG. 25, a line 107 shows output voltage with respect to illuminance of incoming light when the filter 103 is not used or the light transmittance of the filter 103 is maximum. Further, a line 108 shows output voltage with respect to illuminance of incoming light when the light transmittance of the filter 103 is controlled in accordance with the luminosity of the object to be sensed as described above. As seen from FIG. 25, the latitude (dynamic range) of the solid-state image sensing device is widened by the operation of the filter 103.

An optical modulation element whose light transmittance continuously can be controlled continuously is preferred in the third embodiment for correcting latitude of the solid-state image sensing device, however, an optical modulation element whose light transmittance can be controlled discretely at least in two phases can achieve latitude correction.

Figure 26:
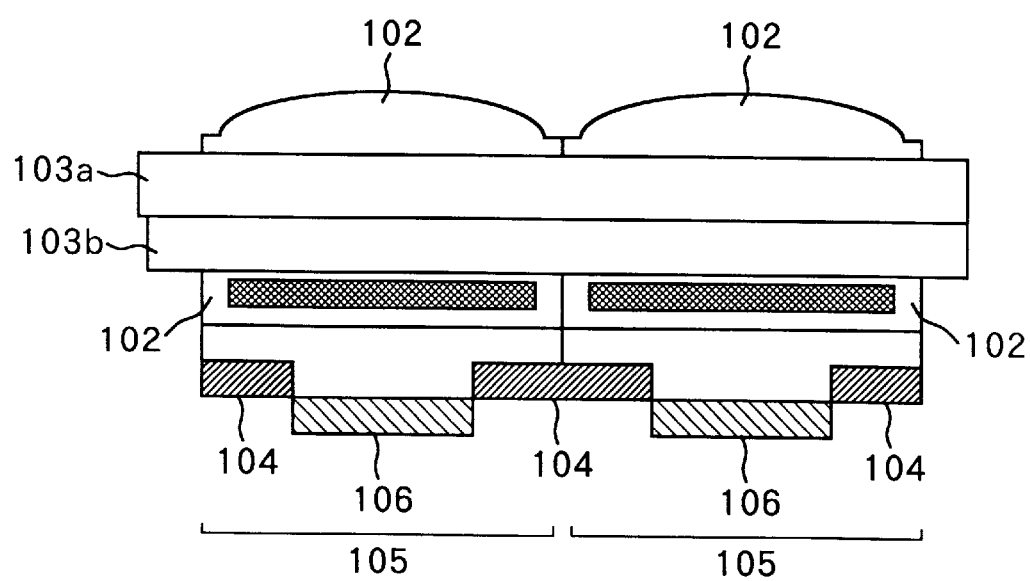
FIG. 26 is a cross-sectional view of a configuration of a part of the solid-state image sensing device according to the third embodiment.

Further, the filter 103 of the third embodiment consists of a single layer and its light transmittance is controlled continuously or at least in two discrete phases, however, the present invention is not limited to this, and an optical modulation element may consist of two layers (103a, 103b) as shown in FIG. 26.

FIGS. 27A to 27D are explanatory view showing an operation of a filter consisting of two optical modulation element layers. In FIGS. 27A to 27D, reference numerals 103f and 103g denote areas of the filter layers 103a and 103b whose light transmittances can be independently controlled to a discrete value of two phases, and it is assumed that the minimum light transmittance of the layer 103g is smaller than the minimum light transmittance of the layer 103f. FIG. 27A is a state when light transmittances of both of the layers 103f and 103g are controlled to be maximum, and FIG. 27B is a state when only the light transmittance of the layer 103g is decreased. Further, FIG. 27C is a state when only the light transmittance of the layer 103f is decreased and FIG. 27D is a state when the light transmittances of both of the layers 103f and 103g are decreased. As the states changes from the one shown in FIG. 27A to the one shown in FIG. 27D, the light transmittance becomes smaller, thus it impossible to control a quantity of light transmitted through the optical modulation elements.

In FIGS. 27A to 27D, a case where the total light transmittance of the filter is controlled by two layers each of which can be set to either of two phases of light transmittances, however, it is possible to make each of the layers have three or four phases of light transmittances instead of two phases. As the number of phases increases, the selection of the light transmittances is widened. The number of phases in each layer is not limited. Further, the transmittance of each layer may be continuously controlled, or one layer may be controlled discretely whereas the other layer may be controlled continuously.

Furthermore, FIGS. 27A to 27D show the filter consisting of two optical modulation element layers, however, the present invention does not limit the number of layers to construct the filter.

It should be noted that as a material of the optical modulation elements which compose the filter 103, liquid crystal or an electrochromic element which can be electrically controlled is preferred because it is easy to drive and control the element. Especially, since the electrochromic element has a feature called the memory effect, that is, once the electrochromic element is supplied with electric current and controlled to have a certain light transmittance, it maintains the same light transmittance after the electric current supply is terminated. Accordingly, it has an advantage of saving electricity. Further, the electrochromic element is small and light and have simple configuration, and it can be integrally manufactured in a semiconductor manufacturing process along with the photoelectric converter 106 and on-chip lens 102 of the solid-state image sensing device. Therefore, the electrochromic element is especially preferable as the optical modulation element in the third embodiment.

As described above, the electrochromic element is suitable as a material for forming the filter, however, other optical modulation elements, such as liquid crystal, whose light transmittances can be controlled by an electric signal can achieve the same advantage of correcting the latitude of the solid-state image sensing device.

Further, the control of the light transmittance of the optical modulation element is performed in accordance with a threshold determined based on the saturation of charge in each pixel, however, the present invention is not limited to this control method, and any control method can be used as far as the charge stored in each pixel is controlled.

<First Modification of the Third Embodiment>

A first modification of the third embodiment will be described with reference to FIGS. 28 to 31. In FIGS. 28 to 31, the same units and elements as those in FIG. 20 are referred by the same reference numerals.

Figure 29:
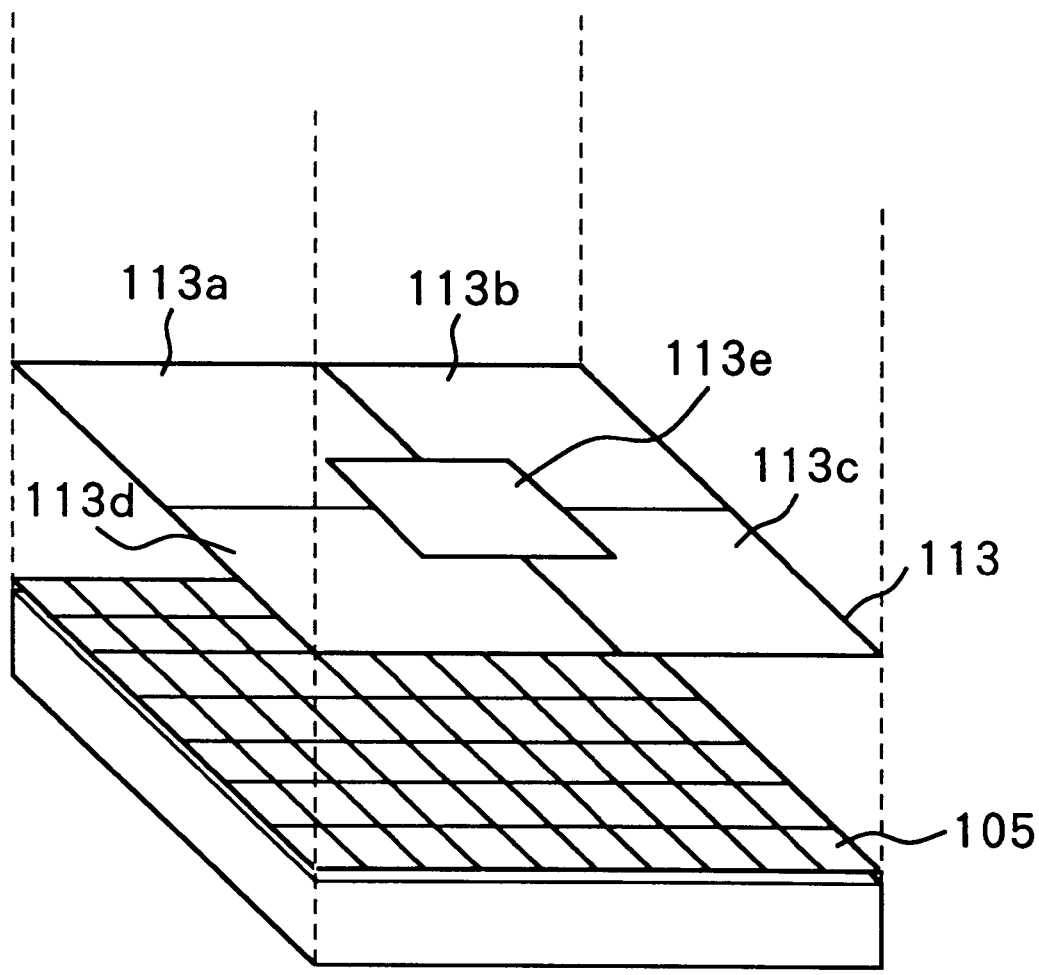
FIG. 29 is an explanatory view showing a correspondence between the solid-state image sensing element and areas whose light transmittances can be independently controlled in an optical modulation element according to the first modification of the third embodiment.

FIG. 28 is a cross-sectional view of a main configuration of a part of the solid-state image sensing device with a filter 113 according to a first modification of the third embodiment. FIG. 29 is an explanatory view showing a correspondence between pixels 105 of the solid-state image sensing element and areas whose light transmittances can be independently controlled in an optical modulation element. According to the first modification of the third embodiment, the area by which the light transmittance can be controlled is as 113a to 113e in FIG. 29.

In FIG. 28, the pixel areas 105 is described in one dimension, however, they exist in the two dimensional plane as shown in FIG. 29. Therefore, each of the areas 113a to 113e whose light transmittance can be independently controlled covers a plurality of pixels 105 as shown in FIG. 29.

Figure 30:
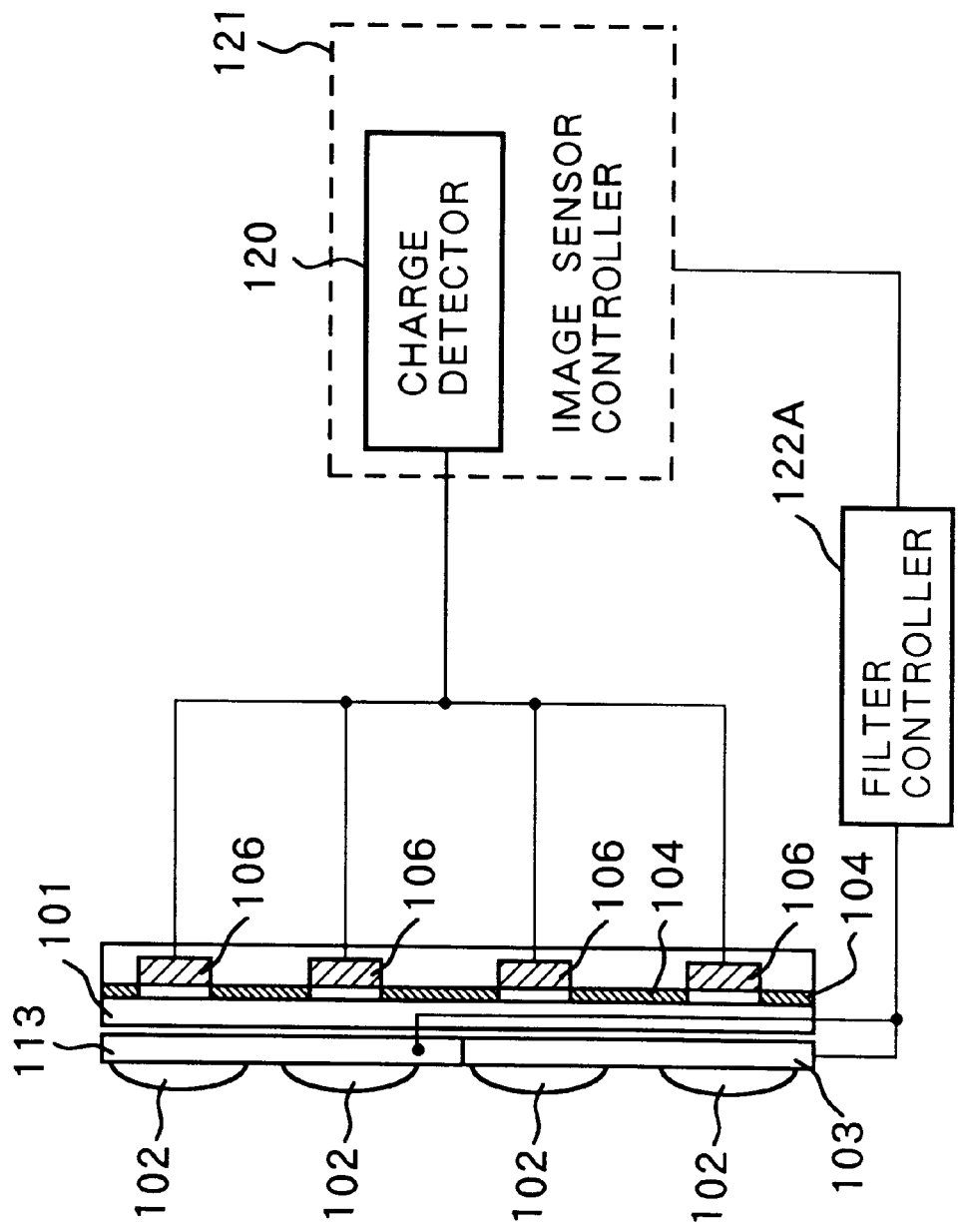
FIG. 30 is a schematic view showing a configuration of the solid-state image sensing device and its controller units according to the first modification of the third embodiment.

FIG. 30 is a schematic view showing a configuration of the solid-state image sensing device having the filter 113 and its controller units according to the first modification of the third embodiment. The areas 113a to 113e are electrically connected to the filter controller 122A.

The areas 113a to 113e of the filter 113 are controlled on the basis of charge stored in pixels 105 corresponding to each of the areas 113a to 113e and a threshold value set for each area. The areas 113a to 113e of the filter 113 are controlled basically in the same manner as described with reference to the flowchart in FIG. 24.

However, the value to be compared to the threshold may be any value which is calculated by operation, and can be the maximum value of charge stored in pixels 105 corresponding to each of the areas 113a to 113e or an average, for example.

Next, an operation of the filter 113 when it is applied to an image sensing apparatus having solid-state image sensing device according to the first modification of the third embodiment will be described.

Figure 31:
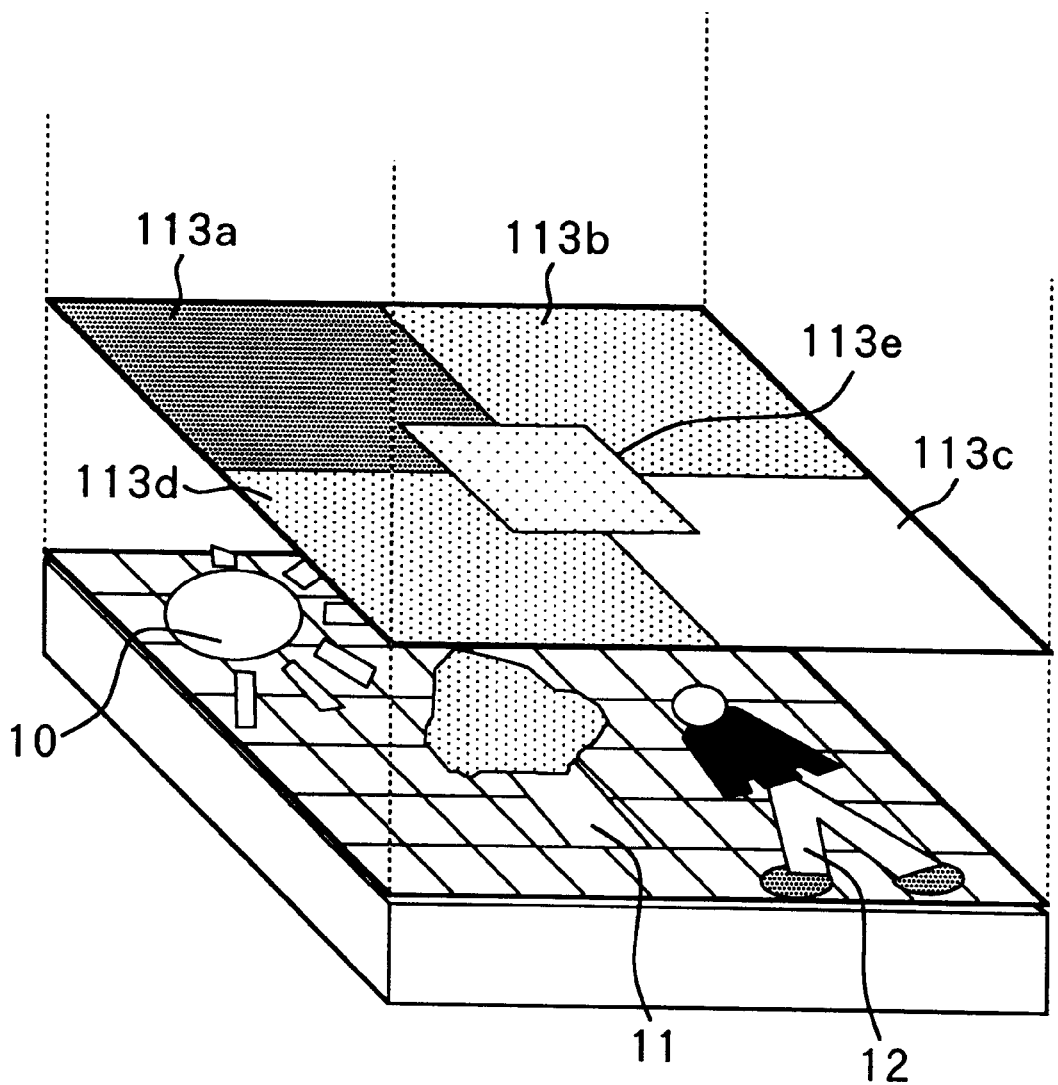
FIG. 31 is an explanatory view showing an operation of the optical modulation element according to the first modification of the third embodiment.
Figure 55:
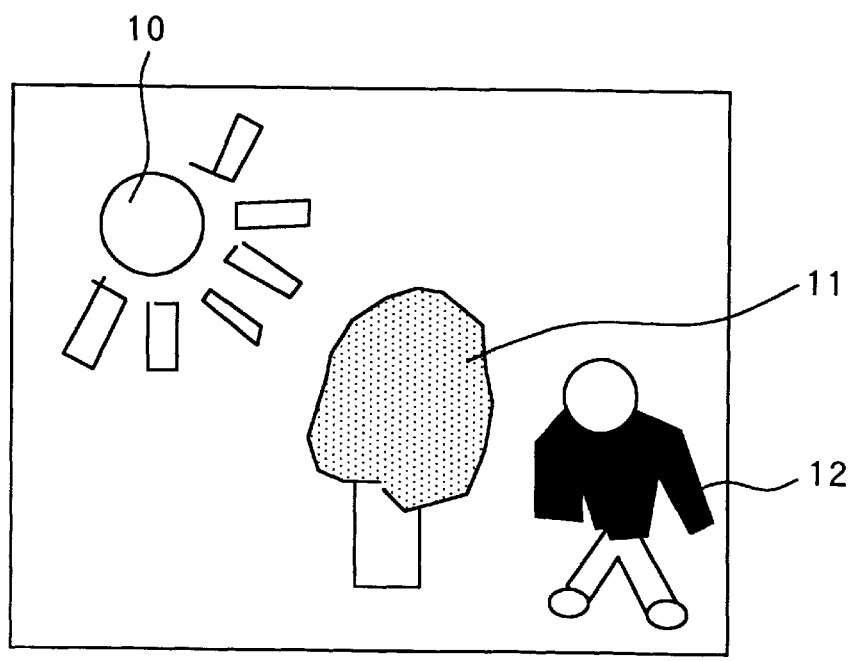
FIG. 55 is an example of a scene including parts whose luminances are very different from each other.
Figure 56A:
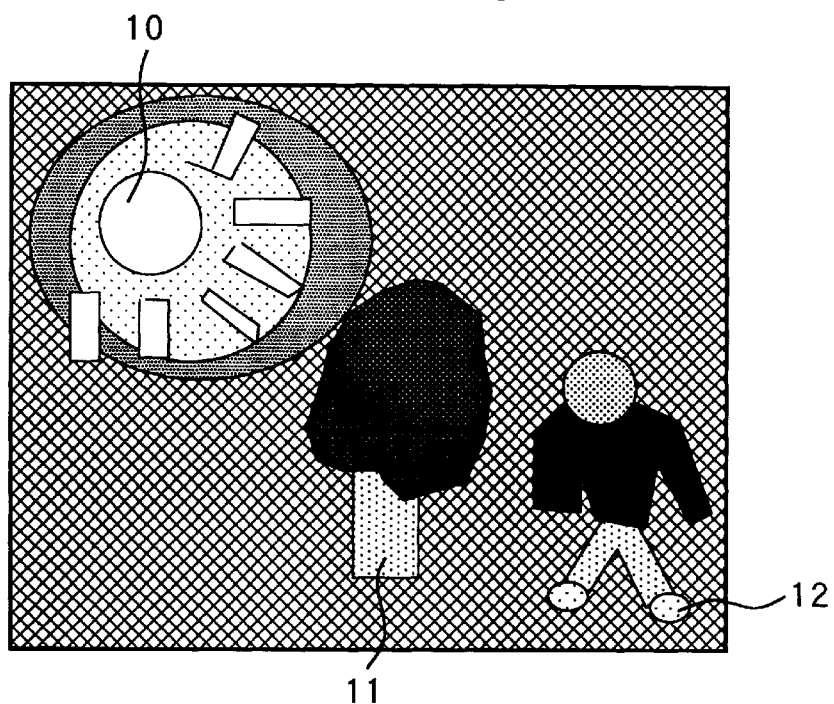
FIG. 56A is an example of an obtained image when a quantity of incoming light is controlled in accordance with the sun in the scene shown in FIG. 55.
Figure 56B:
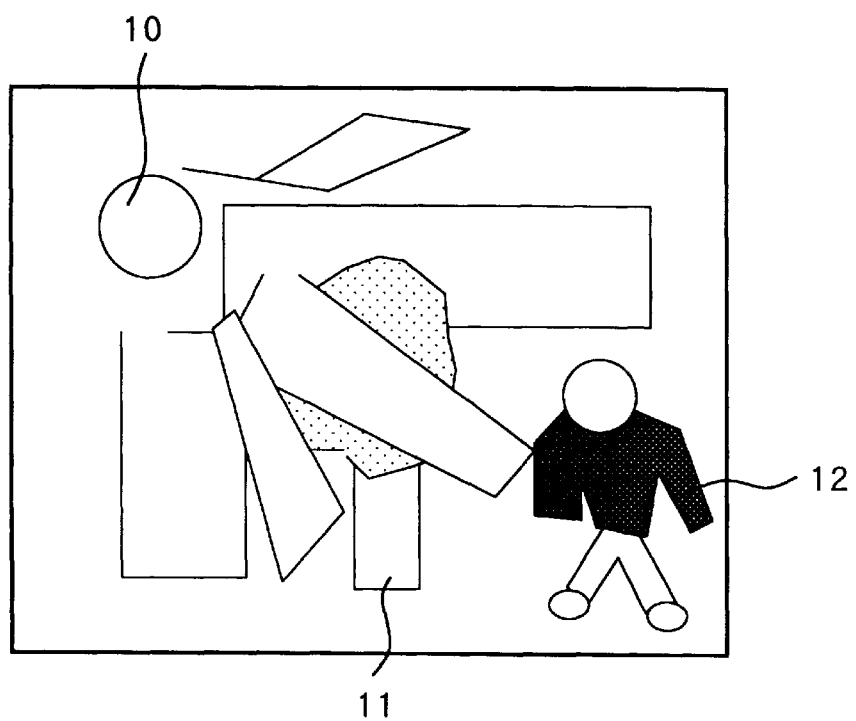
FIG. 56B is an example of an obtained image when a quantity of incoming light is controlled in accordance with a man in the scene shown in FIG. 55.

FIG. 31 is an explanatory view showing an operation of the filter 113 applied to the image sensing apparatus when a scene, shown in FIG. 55, including parts whose luminances are very different is to be sensed.

Referring to FIG. 31, since output voltages from pixels 105 in the area 113a which includes the sun 10 having very high luminosity exceed a threshold value set in relation to saturation of pixels of the solid-state image sensing device, the light transmittance of the area 113a of the filter 113 is decreased to a proper value. Further output voltages from pixels 105 in the area 113c including the man 12 standing in the tree shade having low luminosity are much lower than the threshold value, thus the light transmittance of the area of the filter 113 is increased. Similarly, other areas are independently controlled.

One example of arrangements of the areas 113a to 113e whose light transmission is independently controlled is as shown in FIG. 29, however, arrangements shown in FIGS. 32A to 32D are also possible.

Further, the number of areas whose light transmittance can be independently controlled in the filter is not limited. Note that as the number of independently controllable areas is larger, latitude correction of the solid-state image sensing device can be controlled more flexibly.

In the first modification of the third embodiment, an optical modulation element whose light transmittance can be controlled continuously is preferred for correcting latitude, however, it is possible to perform latitude correction with an optical modulation element whose light transmittance can be controlled discretely at least in two phases.

Further, the filter 113 of the first modification consists of a single optical modulation element layer and its light transmittance is controlled continuously or in at least two discrete phases. However, the present invention is not limited to this, and an optical modulation element may consist of two layers as shown in FIG. 26.

As described above in the third embodiment, the electrochromic element is preferred as a material of the optical modulation element, however, other materials, such as liquid crystal, whose light transmittance can be controlled in accordance with an electrical signal can achieve the same effect of correcting the latitude of the solid-state image sensing device.

Further, by forming each area of the optical modulation element whose light transmittances is independently controlled in the size so as to correspond to the size of the integer-multiple number of pixels and by matching borders of the formed area and those of pixels 105 of the solid-state image sensing device, it is possible to avoid deterioration caused by the border of areas in the optical modulation element projected on the solid-state image sensing element.

Further, the control by area described in the first modification of the third embodiment can be applied to the first and second embodiment.

<Second Modification of the Third Embodiment>

A second modification of the third embodiment will be described with reference to FIGS. 33 to 36. In FIGS. 33 to 36, the same units and elements as those in FIG. 20 are referred by the same reference numerals.

Figure 33:
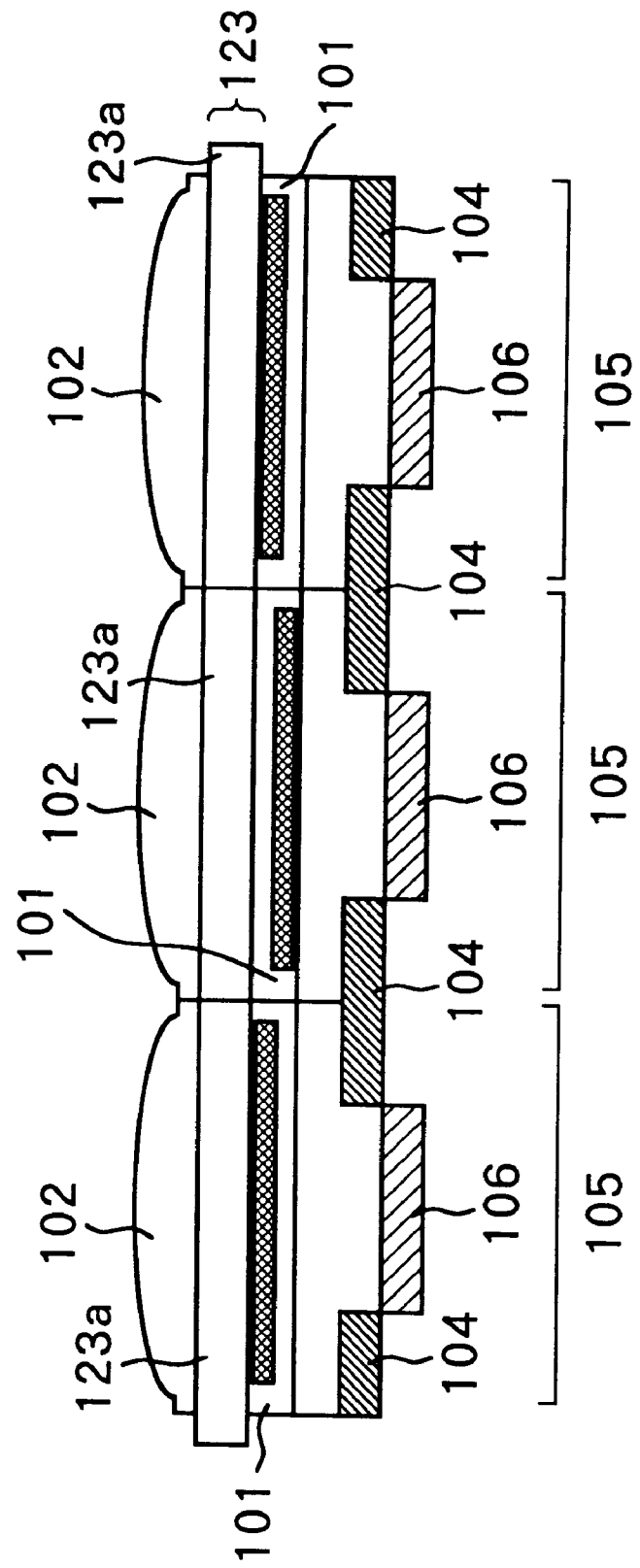
FIG. 33 is a cross-sectional view of a main configuration of a part of the solid-state image sensing device according to a second modification of the third embodiment.
Figure 34:
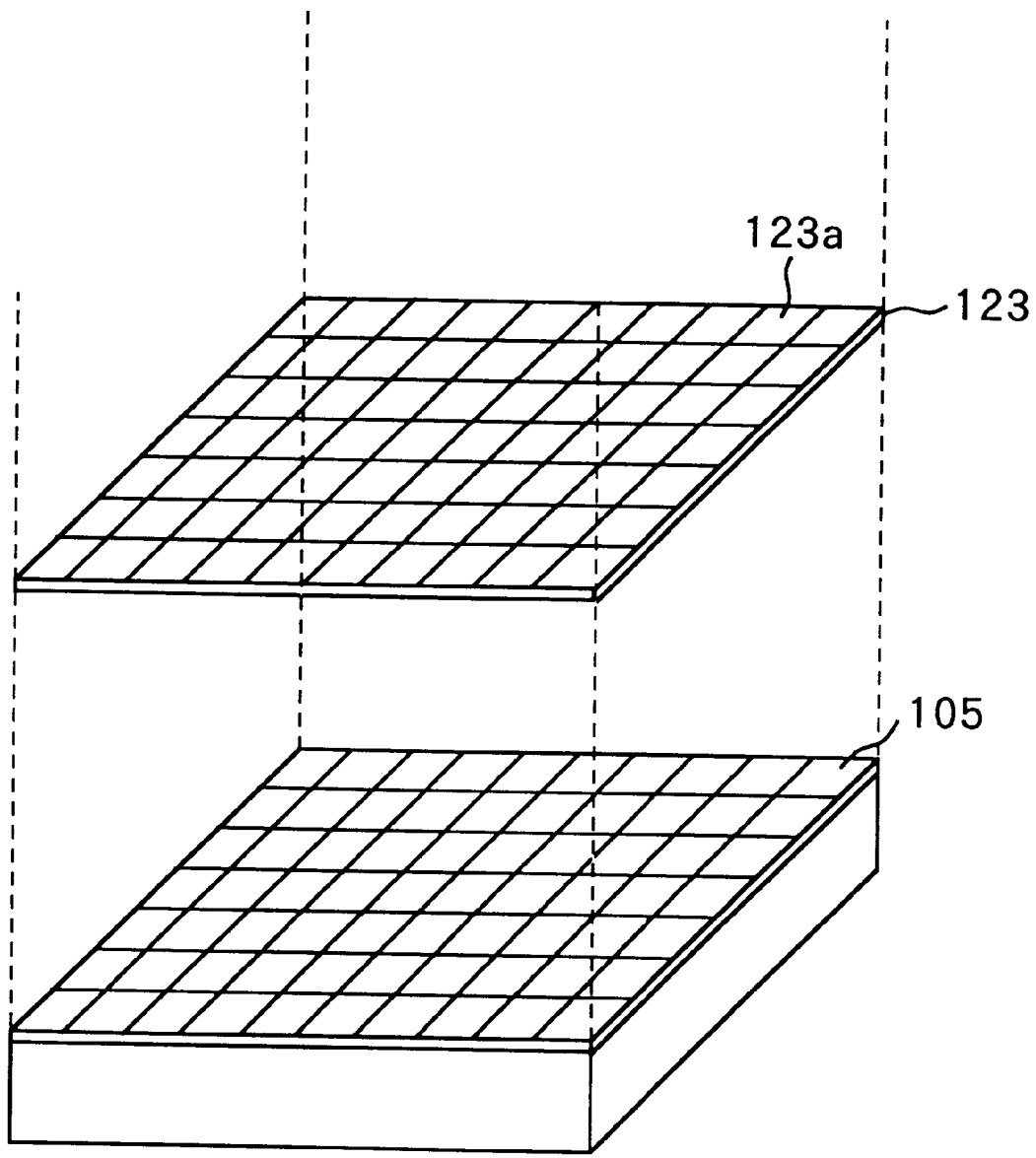
FIG. 34 is an explanatory view showing a correspondence between each pixel of the solid-state image sensing element and areas whose light transmittance can be independently controlled in an optical modulation element according to the second modification of the third embodiment.

FIG. 33 is a cross-sectional view of a main configuration of a part of the solid-state image sensing device according to the second modification of the third embodiment. In this modification, areas 123a of the filter 123 are independently controlled for light transmittance, where the size of the area 123a is of a pixel 105. Further, FIG. 34 is an explanatory view showing a correspondence between each pixel 105 of the solid-state image sensing element and each area 123a whose light transmission can be independently controlled in a filter 123.

Figure 35:
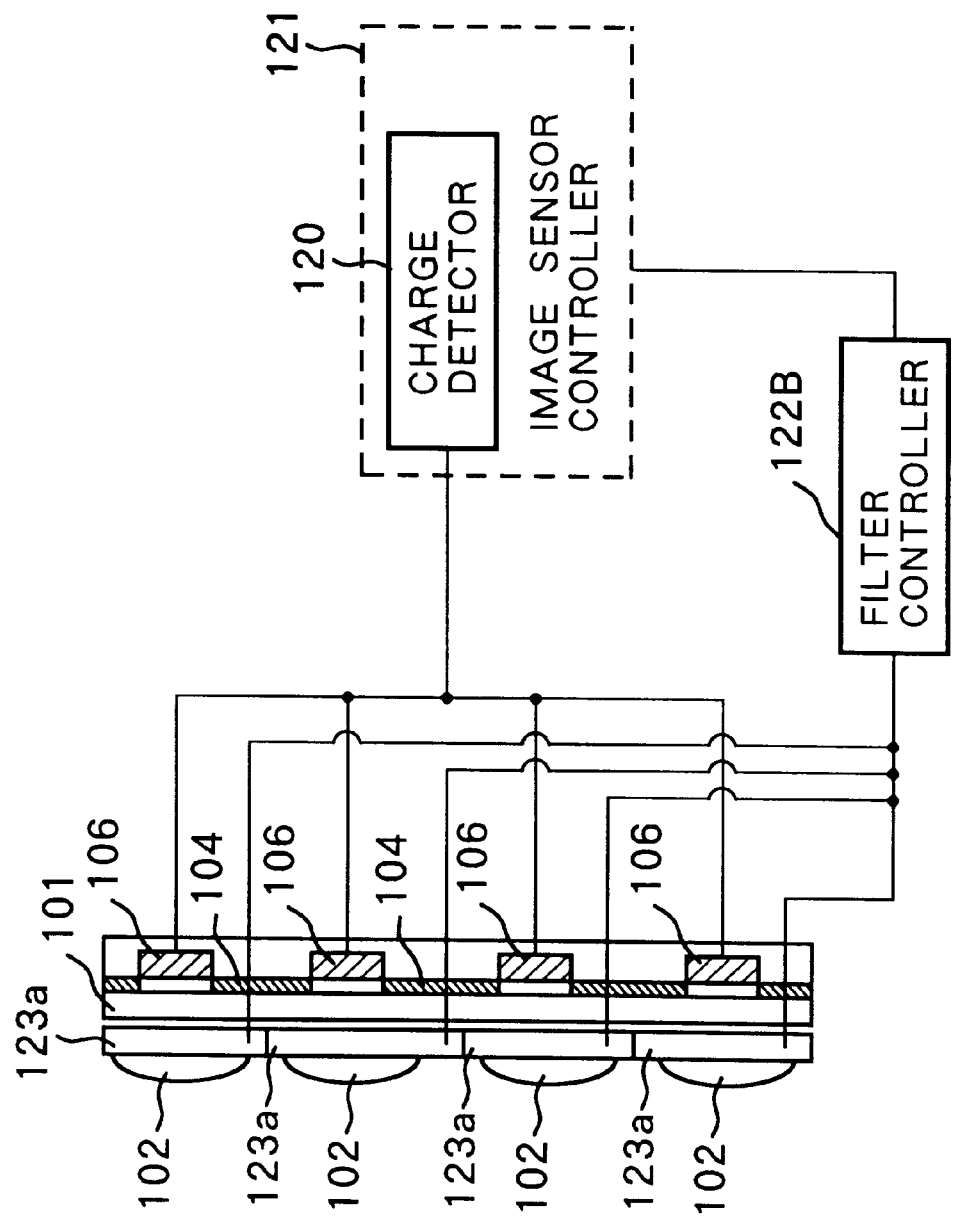
FIG. 35 is a schematic view showing a configuration of the solid-state image sensing device and its controller units according to the second modification of the third embodiment.

FIG. 35 is a schematic view showing a configuration of the solid-state image sensing device and its controller units according to the second modification of the third embodiment, and light transmittance of the area 123a of the filter 123 corresponding to each pixel 105 is controlled on the basis of the output charge from each pixel 105 of the solid-state image sensing device.

Figure 36:
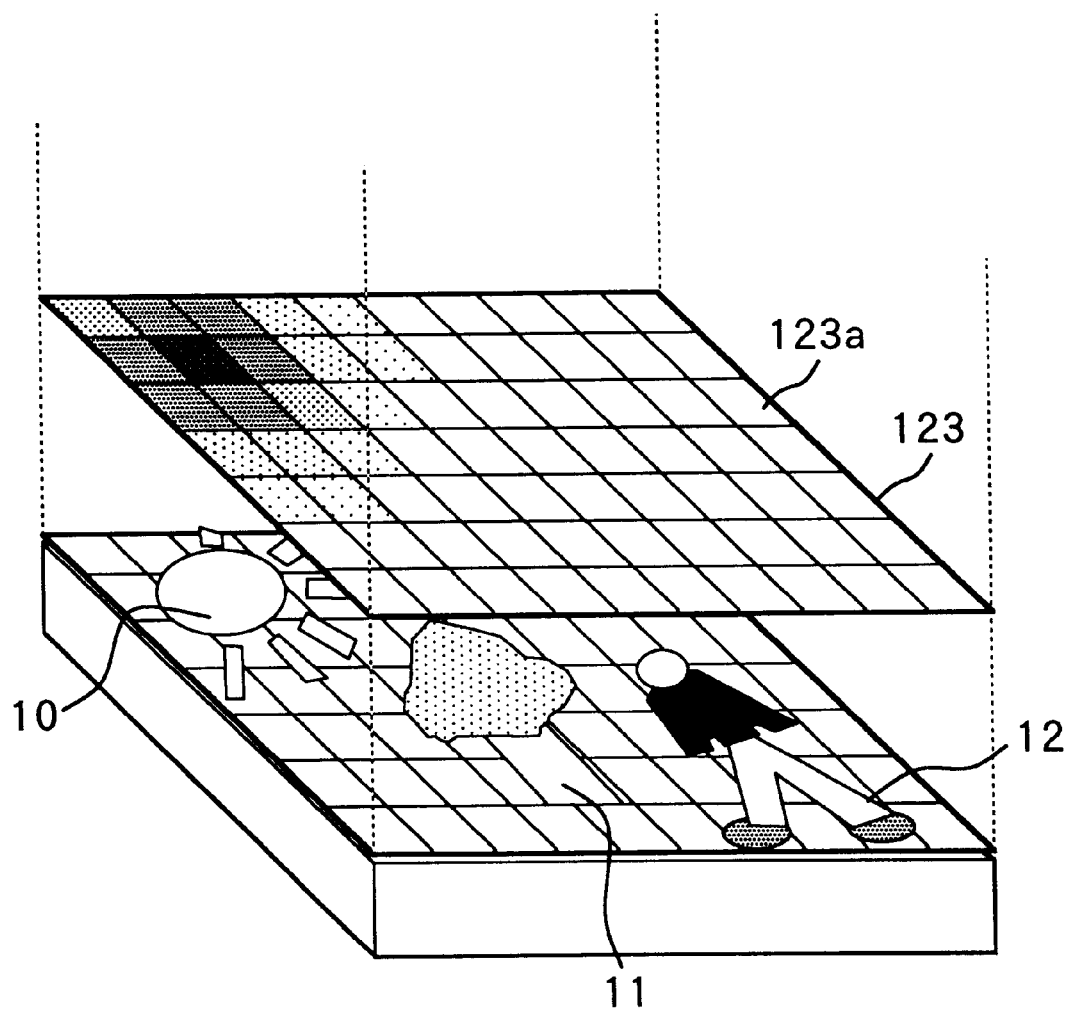
FIG. 36 is an explanatory view showing an operation of the optical modulation element according to the second modification of the third embodiment.

FIG. 36 is an explanatory view showing an operation of the filter 123 applied to an image sensing apparatus upon sensing the scene shown in FIG. 55 according to the second modification of the third embodiment. Light transmittances of the filter 123 can be controlled for each independent area 123a in accordance with the luminosity of each object in the scene as in the first modification. In this modification, since the filter 123 can be controlled for each pixel 105, latitude correction of the solid-state image sensing element can be performed by pixel differing from the first modification of the third embodiment; Furthermore, the control of the light transmittance by pixel makes it possible to perform more flexible control than in the first modification.

In addition to the aforesaid effect, there is an advantage to correct sensitivity unevenness of each pixel 105 of a solid-state image sensing device due to the manufacturing process, thereby image can be corrected more effectively.

In the second modification of the third embodiment, an optical modulation element whose light transmittance can be continuously controlled is preferred for correcting latitude of the solid-state image sensing device, however, an optical modulation element whose light transmittance can be controlled discretely at least in two phases can achieve latitude correction.

Further, the filter 123 of the first modification consists of a single optical modulation element layer and controlled its light transmittance continuously or at least in two discrete phases, however, the present invention is not limited to this, and an optical modulation element may consist of two layers as shown in FIG. 26.

Further, an electrochromic element is preferred as the optical modulation element as in the case of the first to third embodiments, however, the material of the optical modulation element of the present invention is not limited to the electrochromic element.

<Third Modification of the Third Embodiment>

A third modification of the third embodiment will be described with reference FIGS. 37 to 40D. In FIGS. 37 to 40D, the same units and elements as those in FIG. 20 are referred by the same reference numerals.

Figure 37:
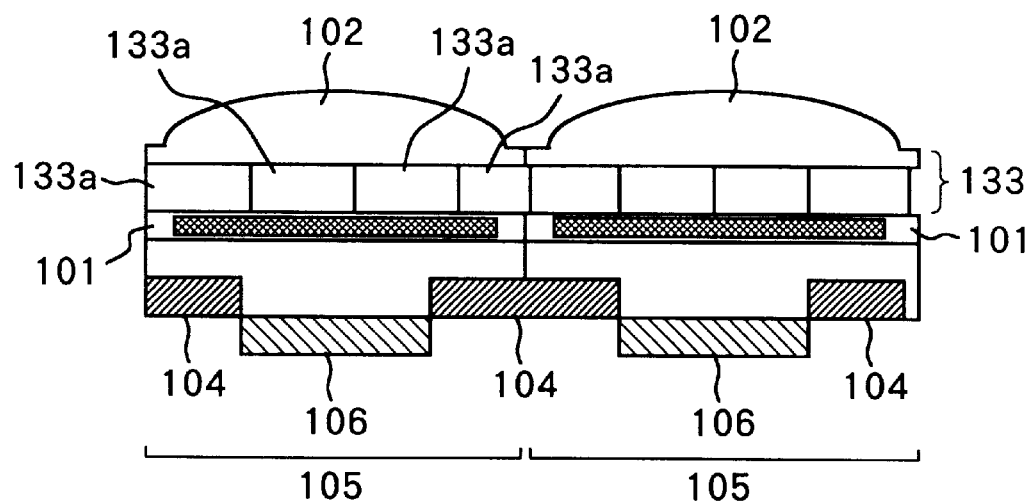
FIG. 37 is a cross-sectional view of a main configuration of a part of the solid-state image sensing device according to a third modification of the third embodiment.
Figure 39:
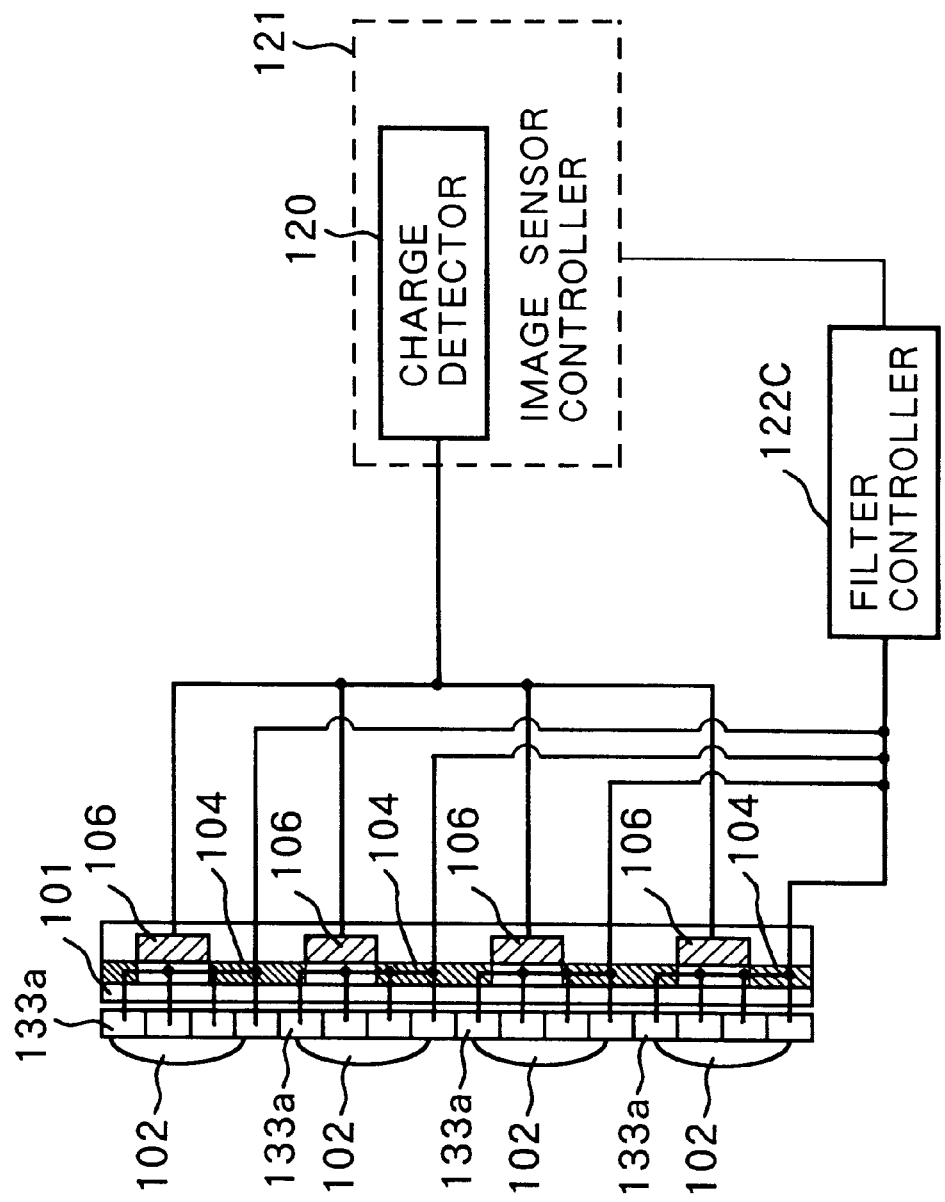
FIG. 39 a schematic view showing a configuration of the solid-state image sensing device and its controller units according to the third modification of the third embodiment.

FIG. 37 is a cross-sectional view of a main configuration of a part of the solid-state image sensing device according to a third modification of the third embodiment. FIG. 1 is an explanatory view showing a correspondence between each pixel 105 of the solid-state image sensing element and areas 133a whose light transmission can be independently controlled in an optical modulation element according to the third modification of the third embodiment, and FIG. 39 is a schematic view showing a configuration of a solid-state image sensing device and its controller units according to the third modification of the third embodiment. Each area 133a whose light transmittance is independently controlled is electrically connected to an optical modulation element driver 122C as shown in FIG. 39. In the third modification of the third embodiment, each area 133a of the filter 133 is smaller than the area of a pixel 105 of the solid-state image sensing device.

Figure 38:
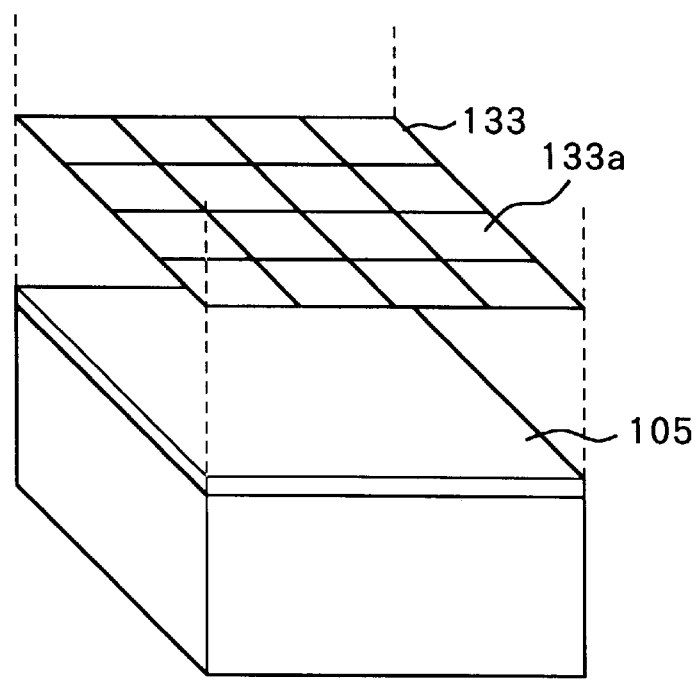
FIG. 38 is an explanatory view showing a correspondence between a pixel the solid-state image sensing element and areas whose light transmittance can be independently controlled in an optical modulation element according to the third modification of the third embodiment.

In FIG. 38, reference numeral 105 denotes a pixel of the solid-state image sensing device, and light transmittance of each area 133a is controlled by discrete values at least in two phases.

Further, FIGS. 40A to 40D show the filter 133 when light transmittance of areas 133a corresponding a pixel 105 is controlled. In this modification, 16 areas 133a correspond one pixel 105 of the solid-state image sensing device.

Further, hatching in areas 133a show that light transmittances of the areas 133a are decreased.

Next, a method of controlling an quantity of light to be transmitted will be described. In this modification, an area of the filter 133 corresponding to a single pixel is divided into a plurality of areas 133a, and the quantity of light to be transmitted is changed by controlling the ratio of areas whose light transmittances are decreased to areas whose light transmittances are not decreased. This method is called "area toning".

Figure 40A:
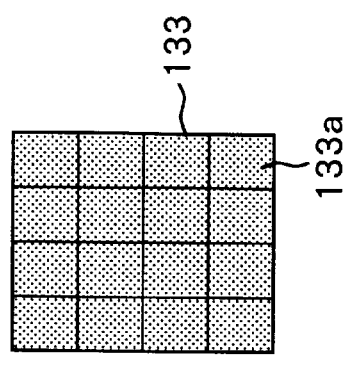
FIGS. 40A to 40D show area tone control in the optical modulation element according to the third modification of the third embodiment.
Figure 40B:
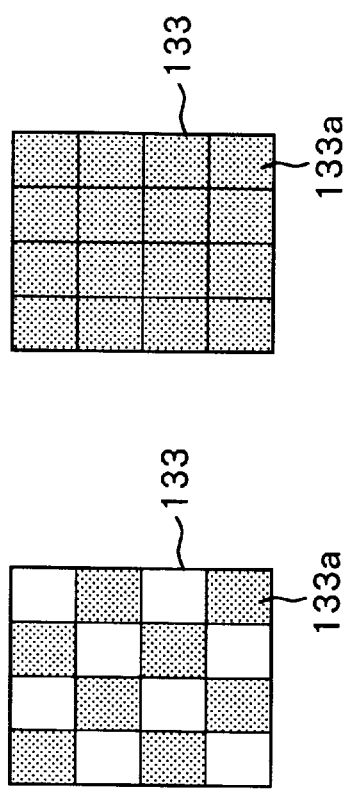
Figure 40C:
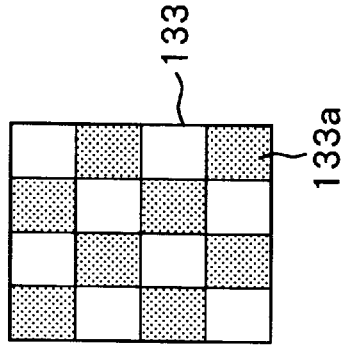
Figure 40D:
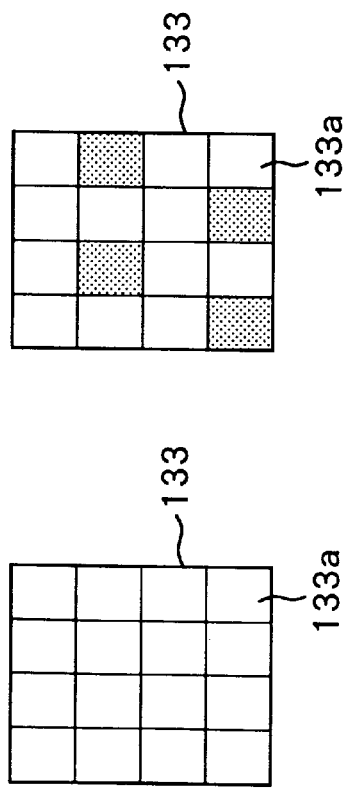

More specifically, FIG. 40A shows a state when the quantity of light to be transmitted is the maximum. And as shown in FIGS. 40B and 40C, depending upon the numbers of areas whose light transmittances are decreased and their light transmittances, the total quantity of light to be transmitted for each pixel can be controlled.

The area patterns for controlling the quantity of light to be transmitted for each pixel 105 of the solid-state image sensing device are not limited to those shown in FIGS. 40A to 40D, and any patterns or shapes are possible as far as they can control the total light transmittance for each pixel 105 by changing the number of the areas whose light transmittance are decreased and their light transmittance.

According to the third modification of the third embodiment, since it is possible to control the quantity of light to be transmitted by pixel, the latitude of the solid-state image sensing device can be flexibly corrected as well as sensitivity unevenness of each pixel due to manufacturing process can be corrected.

This modification is particularly advantageous in a case where an optical modulation element which is hard to control to change its light transmittance continuously or which can be changed its light transmittance discretely is used since the quantity of light to be transmitted for each pixel can be flexibly controlled.

Further, it is possible to apply the method of controlling the optical modulation element in this modification to the first and second embodiment.

Figure 41A:
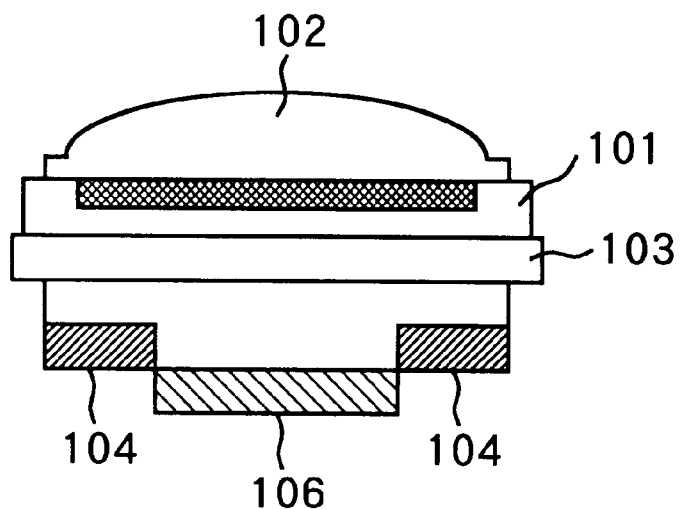
FIGS. 41A and 41B examples of a pixel of the solid-state image sensing device using the optical modulation element.
Figure 41B:
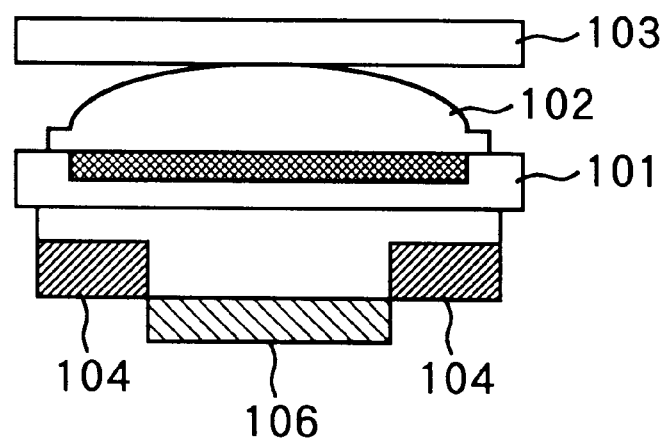
Figure 42:
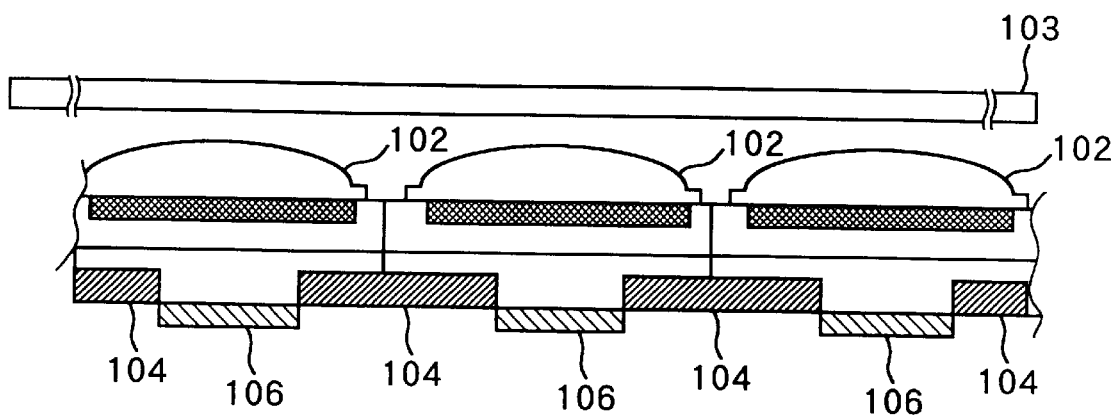
FIG. 42 is an example of a part of the solid-state image sensing device using the optical modulation element.

According to the third embodiment and its modifications, the filter is provided between the on-chip lens 102 and the photoelectric converter 106, however, the optical modulation element can be placed anywhere as far as it is provided somewhere on the light path before incoming light reaches the photoelectric converter 106 of the solid-state image sensing device, e.g., between the color filter 101 and the photoelectric converter 106 as shown in FIG. 41A and on the on-chip lens 102 as shown in FIG. 41B. In a case where the light transmittance is controlled by pixel as described in the second and third modifications of the third embodiment, it is preferred to provide the optical modulation element near the photoelectric converter 106 of the solid-state image sensing device, i.e., the configuration described in the first and second modifications, however, it is not limited to this, and the filter can be provided separately from the solid-state image sensing device as shown in FIG. 42.

Figure 43:
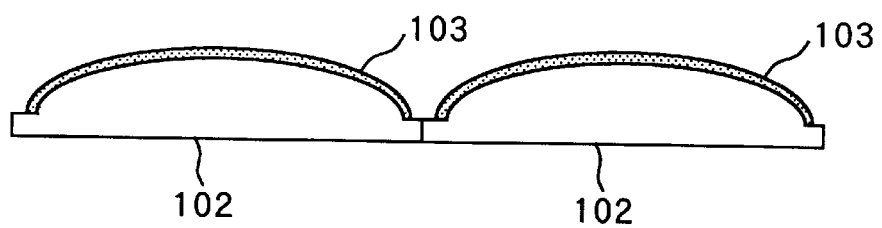
FIG. 43 is an example of a part of the solid-state image sensing device using the optical modulation element.
Figure 44:
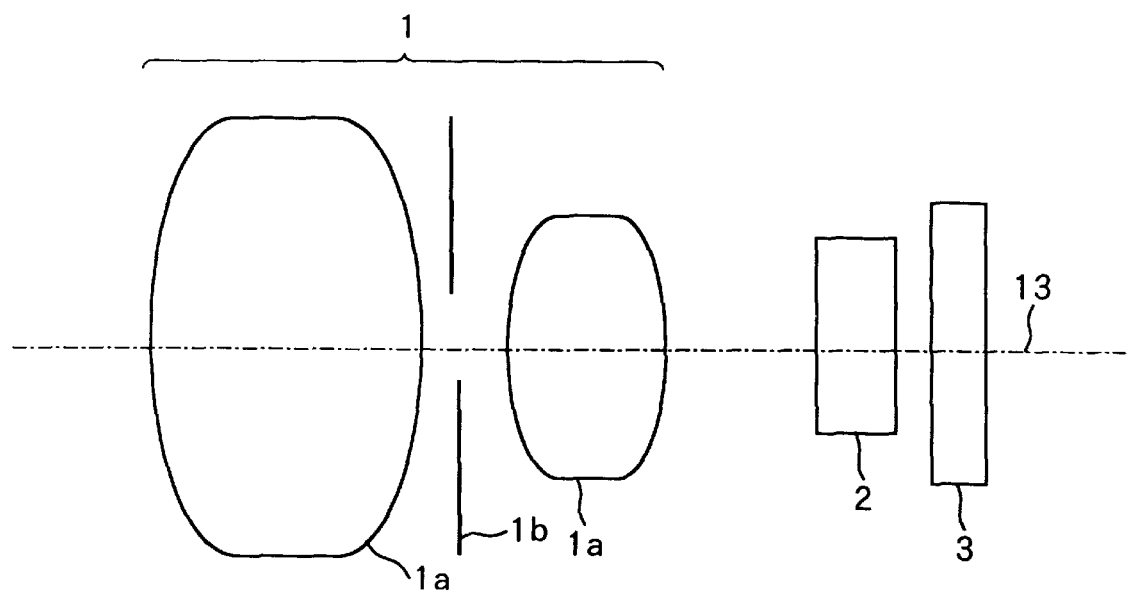
FIG. 44 is a cross-sectional view of an image sensing optical unit using a common solid-state image sensing device.
Figure 45:
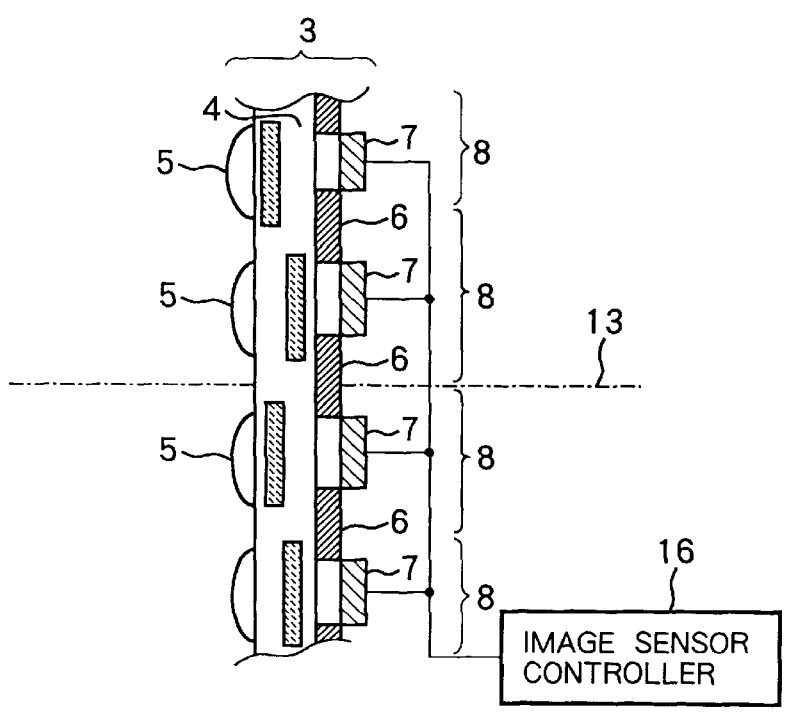
FIG. 45 is a schematic view showing a configuration of a conventional solid-state image sensing device and its controller units.
Figure 46A:
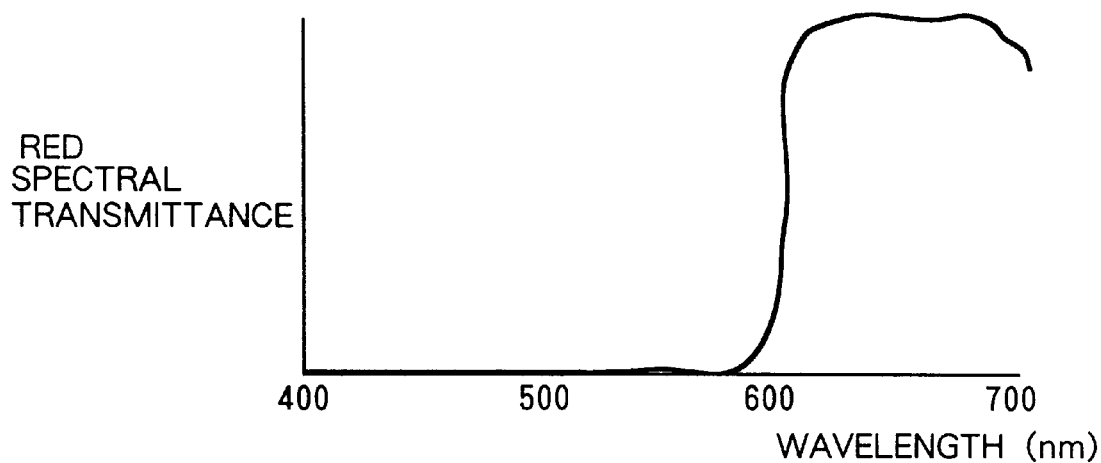
FIGS. 46A to 46C are graphs showing spectral transmission characteristics of a conventional color filter of primary colors.
Figure 46B:
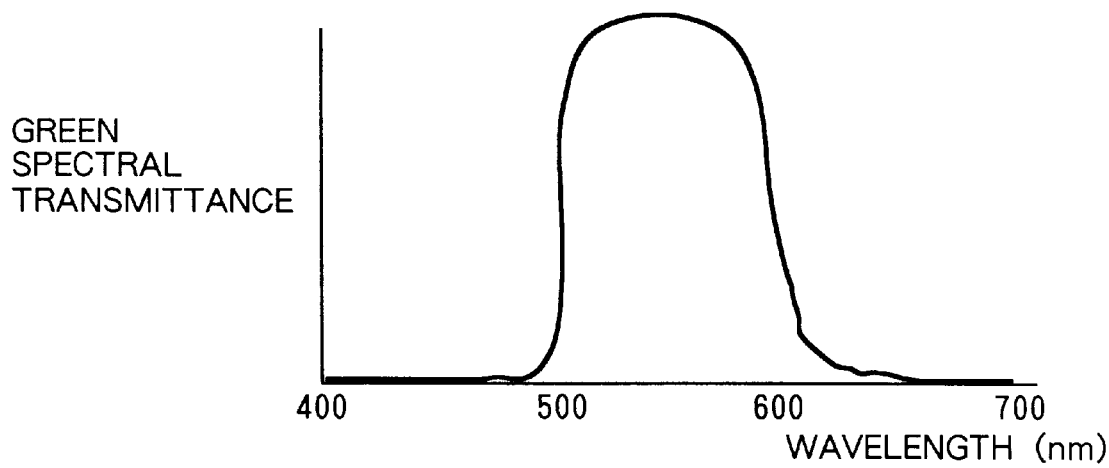
Figure 46C:
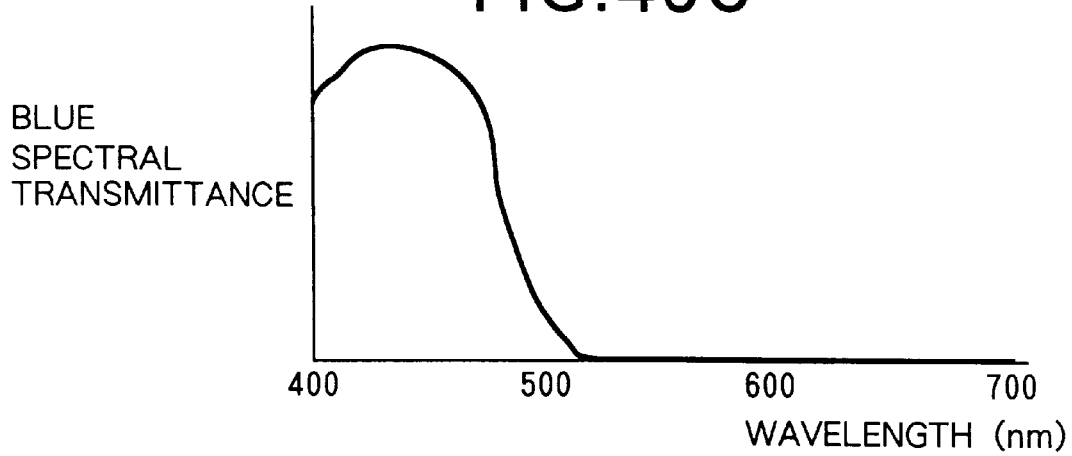
Figure 47A:
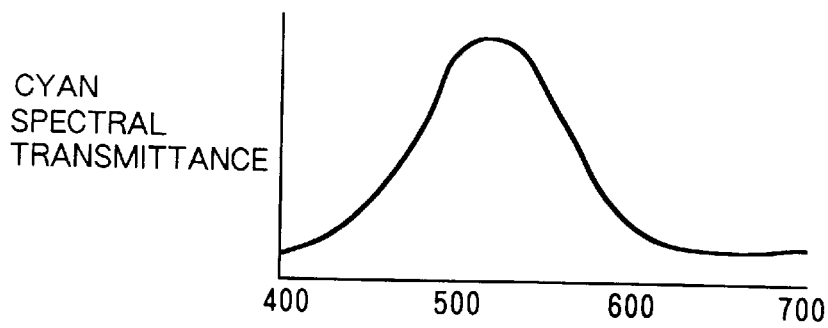
FIGS. 47A to 47C are graphs showing spectral transmission characteristics of a conventional color filter of complementary colors.
Figure 47B:
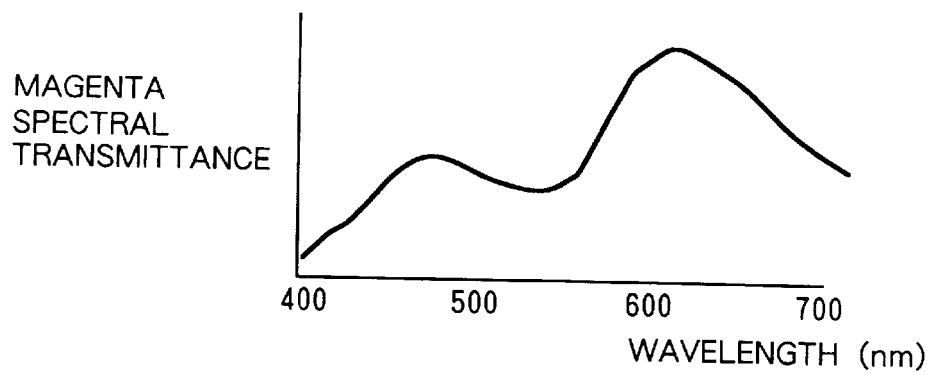
Figure 47C:
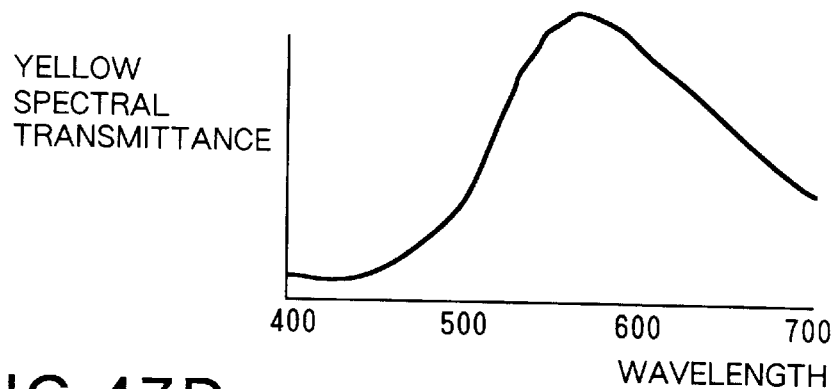
Figure 47D:
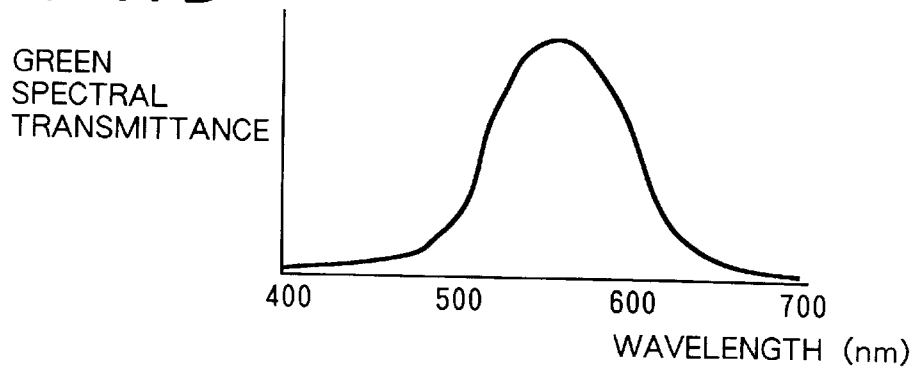
Figure 49:
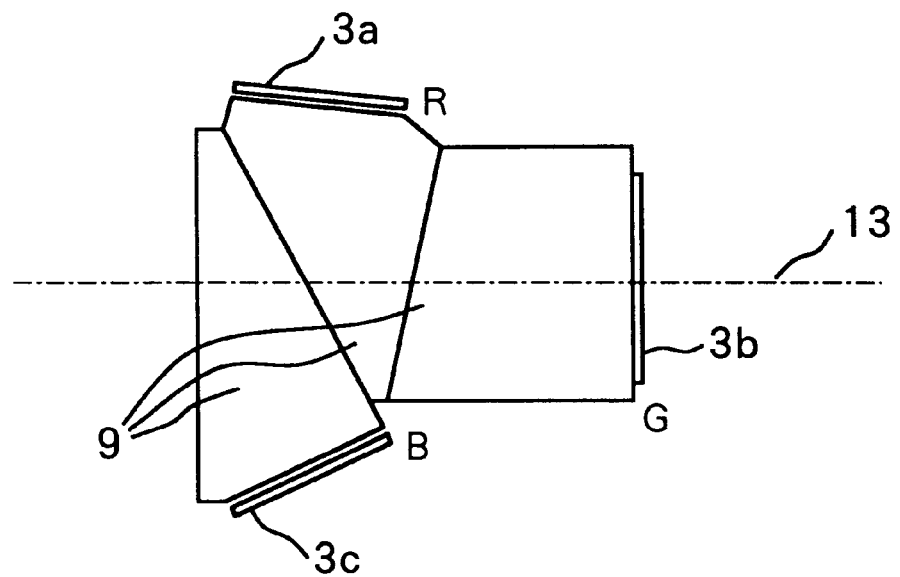
FIG. 49 is a schematic view of an image sensing optical system using a color separation prism.
Figure 50:
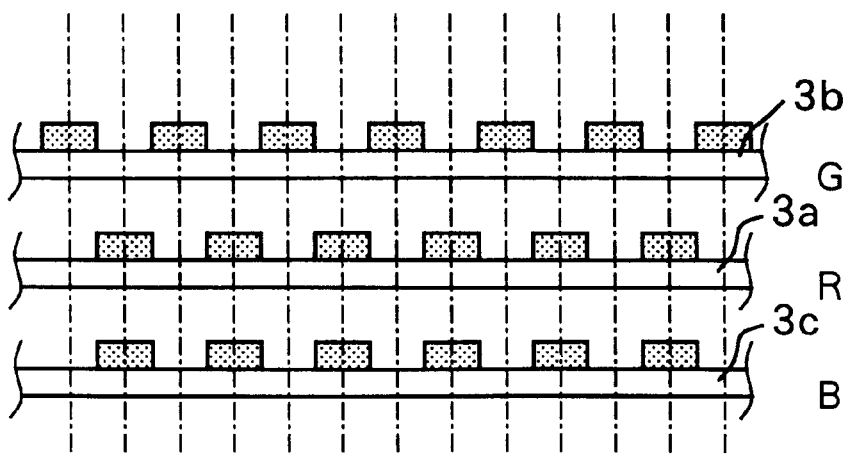
FIG. 50 is an explanatory view showing arrangement of pixels of the solid-state image sensing device.
Figure 51:
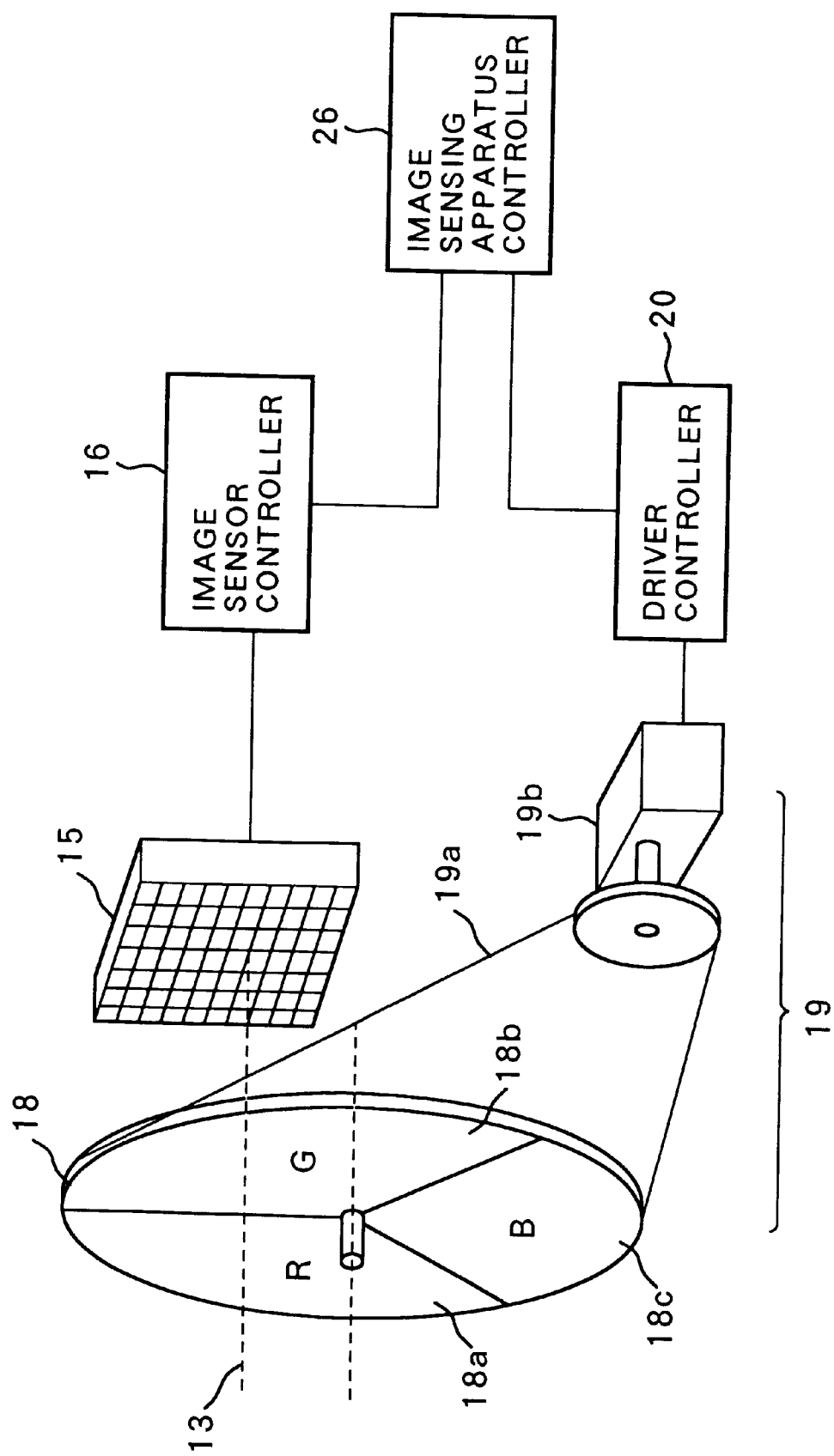
FIG. 51 is a schematic view showing a configuration of a part of image sensing apparatus adopting a sequential sensing method.
Figure 52A:
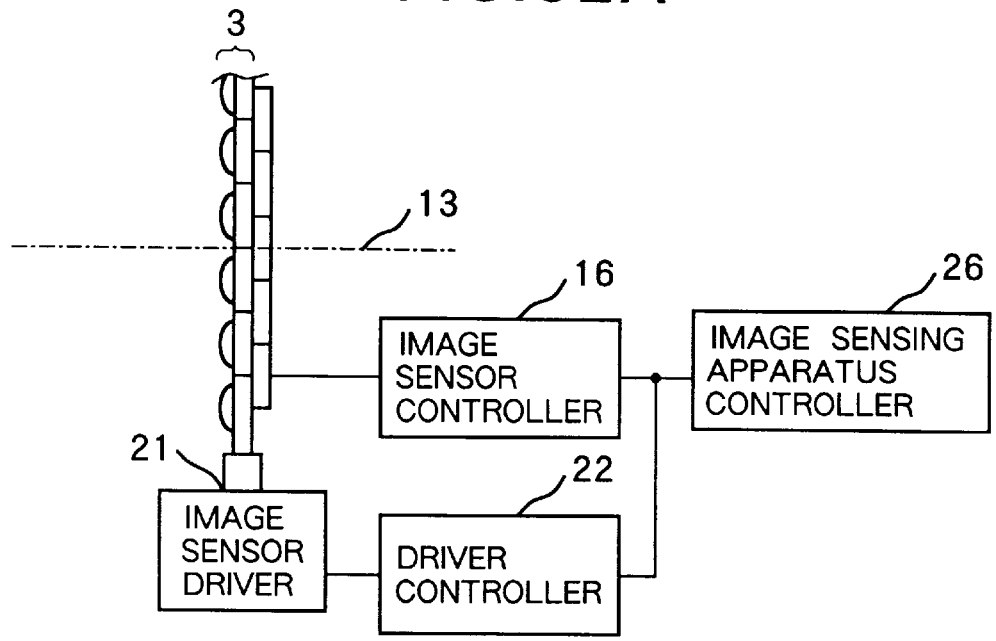
FIGS. 52A and 52B are schematic view showing a configuration of an image sensing apparatus capable of increasing resolution of an image by shifting the solid-state image sensing device.
Figure 52B:
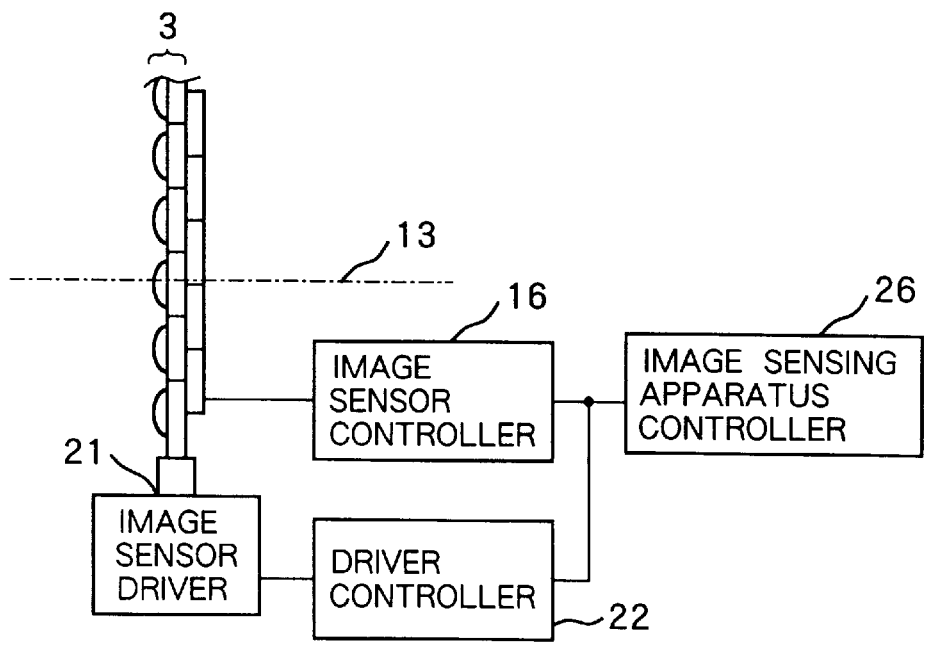
Figure 54:
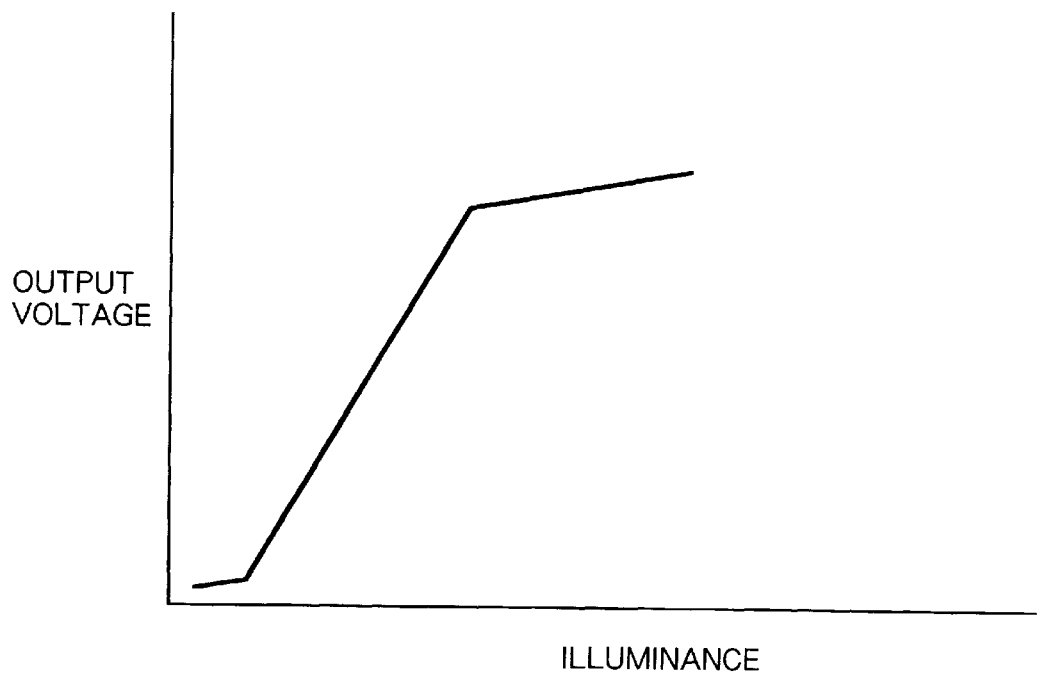
FIG. 54 is a graph showing output voltage from pixels of a solid-state image sensing device with respect to illuminance of incoming light.

Furthermore, the filter may be formed on the surface of the on-chip lens 102 as shown in FIG. 43. Further, it can be formed on the surface or inside of the color filter 101.

In the third embodiment and its modifications, a solid-state image sensing element having a color filter for color image sensing and an on-chip lens for increasing aperture rate is shown, however, a solid-state image sensing element for black-and-white or monochromatic image or the one without an on-chip lens may be used.

Further, in the third embodiment and its modifications, the control of light transmittance of each area of a filter is performed in accordance with the read charge stored in pixels and a predetermined threshold. In the aforesaid control, the charge stored in pixels corresponding to all the areas in a filter whose light transmittances are to be controlled may be used, however, a representative value, such as the maximum charge or the average of charge stored in pixels, may be used instead. Further, according to the third embodiment and its modifications, areas of a filter are controlled their light transmittances independently, however, they may be controlled in consideration of correlation between light transmittances of their neighboring areas as far as they are basically controlled in accordance with the charge stored in the solid-state image sensing device.

Further, according to the third embodiment and its modifications, the solid-state image sensing device is an area sensor, however, it can be a line sensor, and the type of a solid-state image sensing device is not limited.

Furthermore, since the electrochromic element has a feature that once the electrochromic element is supplied with electric current and controlled to have certain light transmittance characteristics, it maintains the same light transmittance characteristics after the electric current supply is terminated. Accordingly, it has an advantage of saving electricity. Further, the electrochromic element is small and light, thus the electrochromic element is especially preferable as the optical modulation element in the third modification.

Especially, a known electrochromic element such that disclosed in Japanese Patent Laid-Open No. 62-203133 or Japanese Patent Laid-Open No. 6-219772 may be used, however, material of the electrochromic element is not limited to these, and any material as far as its light transmittance can be physically changed, such as liquid crystal, may be used:

The present invention can be applied to a system constituted by a plurality of devices, or to an apparatus comprising a single device. Furthermore, the invention is applicable also to a case where the object of the invention is attained by supplying a program to a system or apparatus.

The present invention is not limited to the above embodiments and various changes and modifications can be made within the spirit and scope of the present invention. Therefore to appraise the public of the scope of the present invention, the following claims are made.

What is claimed is:

1. An image sensing apparatus comprising:
   a solid-state image sensing element having a plurality of pixels for performing an image sensing operation;
   a plurality of optical modulation means, each of which corresponds to each of said plurality of pixels, for modulating incoming light toward said plurality of pixels;

changing means for changing spectral transmission characteristics of said optical modulation means among a predetermined number of spectral transmission characteristics so that said plurality of optical modulation means collectively forms one of a plurality of spectral transmission patterns;

image pickup control means for controlling said solid-state image sensing element to perform said image sensing operation a plurality of times in response to the changing of the spectral transmission characteristics by said changing means; and synthesis means for synthesizing a plurality of images obtained from the plurality of image sensing operations performed under control of said image pickup control means, wherein a spectral transmission pattern which is used for at least one image sensing operation controlled by said image pickup control means is formed by controlling said plurality of optical modulation means to include different spectral transmission characteristics and the number of the plurality of spectral transmission patterns is smaller than the number of the spectral transmission characteristics.

2. The image sensing apparatus according to claim 1, wherein said changing means controls each of said optical modulation means to be in a first state in which each of said optical modulation means almost equally transmits visible light in all the wavelength range or to be in a second state in which each of said optical modulation means mainly transmits visible light of a predetermined wavelength range.

3. The image sensing apparatus according to claim 1 further comprising detecting means for detecting charge stored in each pixel of said solid-state image sensing element, wherein said changing means controls each of said plurality of optical modulation means to be in a first state in which said optical modulation means almost equally transmits visible light in all the wavelength range or to be in a second state in which said optical modulation means mainly transmits visible light of a predetermined wavelength range or to be in a third state in which peak transmittance of said optical modulation means appears at the same wavelength as that in the second state and said optical modulation means transmits visible light of a wider wavelength range than that in the second state, in accordance with the charge detected by said detecting means.

4. The image sensing apparatus according to claim 1, wherein each of said optical modulation means includes a plurality of layers of an optical modulation material, and said changing means independently controls spectral transmission characteristics of each of the plurality of layers of each of said optical modulation means.

5. The image sensing apparatus according to claim 4, wherein said changing means controls each of said optical modulation means to be in a first state in which each of said optical modulation means almost equally transmits visible light in all the wavelength range or to be in a second state in which each of said optical modulation means mainly transmits visible light of a predetermined wavelength range.

6. The image sensing apparatus according to claim 5, wherein each of said optical modulation means includes three layers of an optical modulation material, and the respective layers mainly transmit light of a red wavelength range, in a green wavelength range, and in a blue wavelength range when in the second state.

7. The image sensing apparatus according to claim 5, wherein each of said optical modulation means includes four layers of an optical modulation material, and the respective layers mainly transmit light of a cyan wavelength range, in a magenta wavelength range, in a yellow wavelength range and in a green wavelength range when in the second state.

8. The image sensing apparatus according to claim 4 further comprising detecting means for detecting charge stored in each pixel of said solid-state image sensing element, wherein said changing means controls each of said plurality of optical modulation means to be in a first state in which said optical modulation means almost equally transmits visible light in all the wavelength range or to be in a second state in which said optical modulation means mainly transmits visible light of a predetermined wavelength range or to be in a third state in which peak transmittance of said optical modulation means appears at the same wavelength as that in the second state and said optical modulation means transmits visible light of a wider wavelength range than that in the second state, in accordance with the charge detected by said detecting means.

9. The image sensing apparatus according to claim 8, wherein each of said optical modulation means includes three layers of an optical modulation material, and the respective layers mainly transmit light of a red wavelength range, in a green wavelength range, and in a blue wavelength range when in the second state.

10. The image sensing apparatus according to claim 8, wherein said optical modulation means includes four layers of an optical modulation material, and the respective layers mainly transmit light of a cyan wavelength range, in a magenta wavelength range, in a yellow wavelength range and in a green wavelength range when in the second state.

11. The image sensing apparatus according to claim 1 further comprising a second optical modulation means for controlling light transmittance.

12. The image sensing apparatus according to claim 1, wherein said optical modulation means is made of an electrochromic element.

13. The image sensing apparatus according to claim 1, wherein said optical modulation means is made of liquid crystal.

14. The image sensing apparatus according to claim 1, wherein said optical modulation means is integrally made on an on-chip lens.

15. An image sensing apparatus comprising:

a solid-state image sensing element including a plurality of pixels for converting incoming light into electric signals;

detection means for detecting charge stored in each pixel of said solid-state image sensing element;

a plurality of optical modulation means whose light transmittance can be independently controlled in order to control incoming light toward said solid-state image sensing element, wherein each of said optical modulation means corresponds to a divided area, having a predetermined number of plural pixels, of said solid-state image sensing element;

maximum charge detection means for detecting a maximum charged pixel among the predetermined number of plural pixels, whose charges are detected by said detection means, for each divided area of said solid-state image sensing element; and control means for independently controlling light transmittance of said plurality of optical modulation means so as to decrease the light transmittance of the optical modulation means that corresponds to the divided area including the maximum charged pixel, detected by said maximum charge detection means, whose charged amount is greater than a predetermined first value, and increase the light transmittance of the optical modulation means which-corresponds to the divided area including the maximum charged pixel whose charged amount is smaller than a predetermined second value.

16. The image sensing apparatus according to claim 15, wherein the area of said optical modulation means whose light transmittance is controlled independently is a size of an integer-multiple number of pixels of said solid-state image sensing element.

17. The image sensing apparatus according of claim 15, wherein said control means continuously controls light transmittance of each area of said optical modulation means in accordance with the charge detected by said detecting means.

18. The image sensing apparatus according to claim 15, wherein said control means discretely controls light transmittance of each area of said optical modulation means in accordance with the charge detected by said detecting means.

19. The image sensing apparatus according to claim 15, wherein said optical modulation means includes a plurality of layers of an optical modulation material, and said control means independently controls light transmittance of each of the plurality of layers of said optical modulation means.

20. The image sensing apparatus according to claim 15, wherein said optical modulation means includes a plurality of layers of an optical modulation material, and said control means independently controls light transmittance of said optical modulation means by each layer and by each area.

21. The image sensing apparatus according to claim 15, wherein said optical modulation means is made of an electrochromic element.

22. The image sensing apparatus according to claim 15, wherein said optical modulation means is made of liquid crystal.

23. The image sensing apparatus according to claim 15, wherein said optical modulation means is integrally made on an on-chip lens.

24. An optical modulation apparatus comprising:
a plurality of optical modulation means, each of which corresponds to each of a plurality of pixels, for modulating light; and
changing means for changing the spectral transmission characteristics of said optical modulation means among a predetermined number of spectral transmission characteristics so that said plurality of optical modulation means collectively form one of a plurality of transmission patterns,
wherein at least one of said spectral transmission patterns is formed by controlling said plurality of optical modulation means to include different spectral transmission characteristics and the number of the plurality of spectral transmission patterns is smaller than the number of the spectral transmission characteristics.

25. The optical modulation apparatus according to claim 24, wherein said transmission characteristics are spectral transmission characteristics, and said optical modulation means serves as a color filter with a control of spectral transmission characteristics by said control means.

26. The optical modulation apparatus according to claim 24, wherein said transmission characteristics are light transmittance, and said optical modulation means controls a quantity of light to be transmitted through it by changing its light transmittance controlled by said control means.

27. The image sensing apparatus according to claim 1, wherein said changing means respectively changes spectral transmission characteristics of said plurality of optical modulation means to predetermined spectral transmission characteristics to form a predetermined color arrangement pattern.

28. The image sensing apparatus according to claim 15, wherein said control means controls the light transmittance of said optical modulation means so that the maximum charge approaches the predetermined amount when the maximum charge exceeds the predetermined amount.

29. The image sensing apparatus according to claim 15, wherein said control means controls the transmittance of said optical modulation means by each area so that the maximum charge among the charges stored in the plurality of pixels in each area approaches the predetermined amount.

30. The image sensing apparatus according to claim 15, wherein said control means controls light transmittance of said optical modulation means by selecting one of at least three light transmittances.

31. The image sensing apparatus according to claim 1, wherein said plurality of optical modulation means control light transmittance.

32. An image sensing apparatus comprising:
an image sensing element including a plurality of pixels for converting incoming light into electric signals;
a plurality of optical modulation elements whose light transmittance can be independently controlled in order to control incoming light toward said image sensing element, wherein each of said optical modulation elements corresponds to a divided area, having a predetermined number of plural pixels, of said image sensing element;
a charge detector arranged to detect a characteristic charge amount based on charges stored in said predetermined number of plural pixels for each divided area; and
a control device arranged to independently control light transmittance of said plurality of optical modulation elements so as to decrease the light transmittance of the optical modulation element that corresponds to the divided area including a pixel whose detected characteristic charge amount is greater than a predetermined first value, and increase the light transmittance of the optical modulation element that corresponds to the divided area including a pixel whose detected characteristic charge amount is smaller than a predetermined second value.

* * * * *

UNITED STATES PATENT AND TRADEMARK OFFICE
CERTIFICATE OF CORRECTION

PATENT NO. : 6,388,709 B1
DATED : May 14, 2002
INVENTOR(S) : Kobayashi et al.

It is certified that error appears in the above-identified patent and that said Letters Patent is hereby corrected as shown below:

Column 1,
Line 47, after "ted," delete "In"

Column 2,
Line 64, insert a -- . -- (period) after "process"

Column 3,
Line 6, delete "4BA" and insert therefor -- 48A --
Line 60, delete "aid" and insert therefor -- and --

Column 16,
Line 15, delete "lays" and insert therefor -- layers --
Line 22, delete "$\mu_f(\lambda)=\mu_i(\lambda)\mu_2(\lambda)\mu_3(\lambda)$" and insert therefor -- $\mu_f(\lambda)=\mu_1(\lambda)\mu_2(\lambda)\mu_3(\lambda)$ --

Column 24,
Line 57, delete "FIG. 1" and insert therefor -- FIG. 38 --

Column 28,
Line 34, delete "claim 1" and insert therefor -- claim 1, --

Signed and Sealed this

Eleventh Day of February, 2003

JAMES E. ROGAN
*Director of the United States Patent and Trademark Office*